United States Patent [19]
Onakado et al.

[11] Patent Number: 5,978,264
[45] Date of Patent: Nov. 2, 1999

[54] NONVOLATILE SEMICONDUCTOR MEMORY DEVICE OPERABLE AT HIGH SPEED WITH LOW POWER SUPPLY VOLTAGE WHILE SUPPRESSING INCREASE OF CHIP AREA

[75] Inventors: Takahiro Onakado; Natsuo Ajika, both of Hyogo, Japan

[73] Assignee: Mitsubishi Denki Kabushiki Kaisha, Tokyo, Japan

[21] Appl. No.: 09/033,580

[22] Filed: Mar. 3, 1998

[30] Foreign Application Priority Data

Sep. 5, 1997 [JP] Japan ................................. 9-241485

[51] Int. Cl.⁶ .................................................. G11C 16/04
[52] U.S. Cl. .............................. 365/185.11; 365/185.26; 365/185.29
[58] Field of Search .................... 365/185.11, 185.13, 365/185.18, 185.24, 185.26, 185.28, 185.29

[56] References Cited

U.S. PATENT DOCUMENTS

| | | |
|---|---|---|
| 5,483,483 | 1/1996 | Choi et al. ............................. 365/177 |
| 5,590,072 | 12/1996 | Choi ...................................... 365/185.01 |
| 5,659,505 | 8/1997 | Kobayashi et al. ................ 365/185.29 |
| 5,818,761 | 10/1998 | Onakado et al. ................... 365/185.18 |

FOREIGN PATENT DOCUMENTS

| | | |
|---|---|---|
| 59-74666 | 4/1984 | Japan . |
| 3-142789 | 6/1991 | Japan . |
| 7-302499 | 11/1995 | Japan . |

OTHER PUBLICATIONS

"A Novel NAND Structure with a BJT Contact for the High Density Mask ROMs" Choi, et al., 1994 Symposium on VLSI, Technology Digest of Technical Papers, pp. 163–164.

*Primary Examiner*—David Nelms
*Assistant Examiner*—David Lam
*Attorney, Agent, or Firm*—McDermott, Will & Emery

[57] ABSTRACT

A memory cell transistor connects its drain with a corresponding subbit line. In a program operation, a selected subbit line is connected to a program main bit line. In a read operation, a selected subbit line is connected with the base of a bipolar transistor, so that a channel current of a selected memory cell transistor flows as a base current. The bipolar transistor amplifies this base current, and controls a current flowing through a read main bit line.

20 Claims, 52 Drawing Sheets

<WRITE>

<ERASE>

|  | DRAIN | CONTROL GATE | SOURCE | P-TYPE WELL |
|---|---|---|---|---|
| WRITE | NEGATIVE VOLTAGE (-3~-10V) | POSITIVE VOLTAGE (4~11V) | OPEN | GROUND |
| ERASE | OPEN | NEGATIVE VOLTAGE (-5~-12V) | POSITIVE VOLTAGE (5~12V) | POSITIVE VOLTAGE (5~12V) |
| READ | NEGATIVE VOLTAGE (-0.1~-2V) | NEGATIVE VOLTAGE (-1.5~-5V) | GROUND | GROUND |

|  | Vcg | Vsg | Vs | Vd | Vwell |
|---|---|---|---|---|---|
| STANDBY | 1.8V | 0V | 0V | 0V | 0V |
| READ | 1.8V | 1.8V | 0V | 1~1.8V | 0V |

NONVOLATILE SEMICONDUCTOR MEMORY DEVICE OPERABLE AT HIGH SPEED WITH LOW POWER SUPPLY VOLTAGE WHILE SUPPRESSING INCREASE OF CHIP AREA

BACKGROUND OF THE INVENTION

1. Field of the Invention

The present invention relates to a nonvolatile semiconductor memory device, and more specifically, it relates to a nonvolatile semiconductor memory device for writing and erasing data in and from memory cells and reading data from the memory cells with a low power supply voltage.

2. Description of the Background Art

A flash memory, which is a kind of nonvolatile semiconductor memory device, can be fabricated at a lower cost than a dynamic random access memory (DRAM), and is recently expected as a memory device for the future generation.

FIG. 59 is a circuit diagram showing the structure of a memory cell array 5000 of a conventional NOR flash memory. A plurality of word lines WL and a plurality of bit lines BL are arranged on the memory cell array 5000. FIG. 59 representatively shows word lines WL1, WL2, WL3, . . . and bit lines BL1, BL2 and BL3, . . . Memory cells QC are provided on the respective intersections between the word lines WL and the bit lines BL. The memory cells MC are formed by floating gate MOS transistors.

The structure of a memory cell transistor forming each memory cell QC is now described.

FIG. 60 is a model sectional view for illustrating the memory cell transistor of the conventional nonvolatile semiconductor memory device. As shown in FIG. 60, the memory cell transistor has an N-type source region 2 and an N-type drain region 3 formed on a major surface of a P-type semiconductor substrate 1, a floating gate electrode 5 formed above a channel region which is held between the source region 2 and the drain region 3 through a tunnel oxide film 4, and a control gate electrode 7 formed above the floating gate electrode 5 through an insulating film 6. The source region 2 and the drain region 3 of each memory cell transistor is formed by ion implantation through masks of side wall insulating films 9 formed on side walls of the floating gate electrode 5 and the control gate electrode 7.

Referring to FIGS. 59 and 60, a source line SL is connected to the source region 2 of each memory cell QC. A bit line BL is connected to the drain region 3. A word line WL is connected to the control gate electrode 7.

The source-to-drain conductivity (channel conductance) varies with a potential applied to the control gate electrode 7. The potential of the control electrode 7, which is so increased that a current starts to flow between the source and the drain, is called a threshold voltage Vth. The threshold voltage Vth is increased as electrons are stored in the floating gate electrode 5.

The memory cell transistor stores information by changing the charged state of the floating gate electrode 5. The floating gate electrode 5, which is electrically isolated from the exterior by the insulating films 9, is in a structure for storing information in a nonvolatile manner.

Read, write and erase operations of the NOR flash memory are now briefly described.

In the write operation, electrons are injected into the floating gate 5 by channel hot electron injection. Thus, the threshold voltage Vth of the memory cell transistor changes from a low level to a high level.

In the erase operation, the electrons are extracted from the floating gate electrode 5 by an F-N (Fowler-Nordheim's) tunnel phenomenon at a gate edge of the source or the drain. Thus, the threshold voltage Vth changes from a high level to a low level.

In the read operation, a voltage of about 1 V is applied to a selected bit line BL and an external power supply voltage VCC is supplied to a selected word line WL, for reading information depending on whether or not a current flows between the source and the drain of the memory cell transistor positioned on the intersection between the selected word line WL and the selected bit line BL.

FIGS. 61 and 62 illustrate threshold voltage distributions of the NOR flash memory. As shown in FIG. 61, such a state that the threshold voltage Vth is higher than the external power supply voltage VCC (5 V) is referred to as a write state, and such a state that the threshold voltage Vth is lower than the external power supply voltage VCC (5 V) is referred to as an erase state in the NOR flash memory.

The NOR flash memory writes information bitwise, and simultaneously erases information from all bits or bits included in every prescribed block. Therefore, the threshold voltage distribution in the erase state is wider than that in the write state.

As shown in FIG. 62, employment of the present external power supply voltage VCC of 3.3 V results in the so-called overerased cells having threshold voltages Vth of not more than 1.5 V.

FIG. 63 is a circuit diagram for illustrating the problem of overerased cells in the flash memory. It is assumed that data is read from a memory cell QC1 which is connected to a bit line BL and memory cells QC2, QC3, QC4, . . . connected to the same bit line BL are overerased. A voltage of about 1 V is applied to the bit line BL, in order to read the data from the memory cell QC1. Further, the external power supply voltage VCC is applied to a word line WL1 connected with the memory cell QC1.

In this case, leakage currents i0 flow in the bit line BL through the overerased memory cells QC2, QC3, QC4, . . . although the potentials of word lines WL2, WL3, WL4, . . . connected thereto are 0 V. As a result, the selected memory cell QC1, which is in a write state, is erroneously determined as being in an erase state although no current originally flows through this memory cell QC1. Thus, the presence of such overerased cells QC2, QC3, QC4, . . . is a critical defect in operation of the flash memory.

A DINOR (divided bit line NOR) flash memory dividing bit lines into sectors is now described.

U.S. Pat. No. 5,659,505 discloses the contents of such a DINOR flash memory. The contents are now briefly described.

FIG. 64 is a circuit diagram showing the structure of a memory cell array 6000 of a conventional DINOR flash memory.

As shown in FIG. 64, the memory cell array 6000 includes two memory cell array blocks BLK0 and BLK1. FIG. 64 representatively shows four memory cell transistors MC for each memory cell array block BLK0 or BLK1. The memory cell array block BLK0 includes memory cell transistors MC1*a* and MC1*b* having drains connected to a subbit line SBL1 respectively, memory cell transistors MC2*a* and MC2*b* having drains connected to a subbit line SBL2 respectively, a selector gate SG1 opening/closing connection between a main bit line BL1 and the subbit line SBL1, and a selector gate SG2 for opening/closing connection between a main bit line BL2 and the subbit line SBL2.

Control gate electrodes of the memory cell transistors MC1a and MC2a are connected to a word line WL1, and those of the memory cell transistors MC1b and MC2b are connected to a word line WL2.

The memory cell array block BLK1 also includes memory cell transistors MC3a and MC3b having drains connected to a subbit line SBL3 respectively, and memory cell transistors MC4a and MC4b having drains connected to a subbit line SBL4 respectively.

The memory cell array block BLK1 further includes a selector gate SG3 for opening/closing connection between the main bit line BL1 and the subbit line SBL3, and a selector gate SG4 for opening/closing connection between the main bit line BL2 and the subbit line SBL4.

Control gate electrodes of the memory cell transistors MC3a and MC4a are connected to a word line WL3, and those of the memory cell transistors MC3b and MC4b are connected to a word line WL4.

The DINOR flash memory performs write, erase and read operations for memory cells after selecting the corresponding memory cell array block BLK by opening/closing the corresponding selector gate SG. Each memory cell transistor MC is formed by a floating gate MOS transistor.

The erase and write operations of the DINOR flash memory are now described.

FIG. 65 illustrates threshold voltage distributions of memory cells of the DINOR flash memory with an external power supply voltage VCC of 3.3 V.

In the erase operation, electrons are collectively injected into the floating gate electrode 5 by an F-N tunnel phenomenon on the overall channel surface. Thus, the threshold voltage Vth changes from a low level to a high level.

In the write operation, on the other hand, the electrons are extracted by an F-N tunnel phenomenon at the gate edge of the drain. Namely, low and high threshold voltage distribution sides are referred to as write and erase states respectively in the DINOR flash memory.

Further, the DINOR flash memory extracts the electrons by applying a pulse voltage bitwise and further repeats an operation (verify operation) of verifying the threshold voltage Vth, thereby narrowing the low threshold voltage side distribution. Consequently, the lower limit of the low threshold voltage side distribution exceeds 1.5 V, to implement the operation with the external power supply voltage VCC of 3.3 V.

On the other hand, there is such a tendency that a lower voltage operation, a lower power consumption operation and a higher-speed read operation are required to a nonvolatile semiconductor memory device.

FIG. 66 illustrates threshold voltage distributions of the memory cells of the DINOR flash memory with an external power supply voltage VCC of 1.8 V.

When the external power supply voltage VC is lower than the present value of 3.3 V (e.g., 1.8 V), the lower limit of the low threshold voltage side is reduced below 1.5 V as shown in FIG. 66, to result in the so-called overwritten cells. Consequently, it is conceivably difficult to implement a read operation employing the external power supply voltage VCC as such despite the aforementioned technique of the DINOR flash memory.

In order to solve this problem, conceivable is means of stepping up the low external power supply voltage VCC to about the present voltage level (3.3 V) in read operation for applying the stepped-up voltage to word lines.

When this means is applied, however, the read operation is retarded due to the time required for the steppe operation. Further, power consumption is increased due to the steppe operation. In addition, the number of circuits operating at 3.3 V is so increased that the effect of power consumption reduction by the low voltage of 1.8 V is disadvantageously reduced.

In the DINOR memory cell structure, further, non-selected memory cells (e.g., 63 memory cells) connected to a single subbit line generate a read leakage current as a whole.

When the power supply voltage VCC is 3.3 V, the lower limit of the write threshold voltage (Vth) distribution is 1.5 V, as shown in FIG. 65. When the threshold voltage Vth is written in a value of not more than 1.5 V, the total leakage current of 63 non-selected memory cells on the same bit line to which a control gate voltage Vcg of 0 V is applied reaches a value similar to a read current Iread to disable a correct read operation, resulting in an overwrite failure.

When the threshold voltage Vth of the memory cells is 1.5 V, a current corresponding to the read current Iread flows following application of a control gate voltage Vcg of 1.5 V thereto. FIG. 67 shows current-voltage characteristics in this case.

Referring to FIG. 67, symbol Ileak denotes the value of the leakage current of the aforementioned non-selected memory cells with the control gate voltage Vcg of 0 V.

Consider a characteristic value G, expressed in the following equation, indicating inclination of the current-voltage characteristics:

$$G = \partial(\log I)/\partial Vcg$$

If memory cells increasing the characteristic value G are obtained, such memory cells have the current-voltage characteristics shown by dotted lines in FIG. 67, on the assumption that the leakage current Ileak remains unchanged under the control voltage Vcg of 0 V.

If such characteristics are obtained, no overwrite failure results even if the lower limit of the write threshold voltage distribution is 0.5 V. This is because the leakage current Ileak of non-selected memory cells remains unchanged regardless of the characteristics.

If the lower limit of the write threshold voltage distribution can be reduced, reduction of a read voltage is enabled, and reduction of the power supply voltage VCC is also enabled while maintaining a high-speed read operation with no step-up.

While the physical parameters of the memory cell transistors may be changed in order to increase the characteristic value G, no remarkable improvement can be expected even in this case.

FIG. 68 shows the relation between the control gate voltage Vcg and a source-to-drain current I flowing in a memory cell transistor.

As shown in FIG. 68, the characteristic value G under the read current Iread can be remarkably increased if the value of the read current Iread can be reduced.

In general, however, reduction of the read current Iread leads to reduction of a read speed.

SUMMARY OF THE INVENTION

An object of the present invention is to provide a nonvolatile semiconductor memory device capable of performing a high-speed read operation even with a low power supply voltage.

Another object of the present invention is to provide a nonvolatile semiconductor memory device which can avoid a malfunction resulting from overerasing or overwriting even in a low-voltage operation.

Still another object of the present invention is to provide a nonvolatile semiconductor memory device capable of performing a low-voltage operation, which can be fabricated at a low cost.

Briefly stated, the present invention provides a nonvolatile semiconductor memory device formed on a semiconductor substrate, which comprises a memory cell array, a plurality of first main bit lines, a plurality of second main bit lines, a group of subbit lines, a plurality of word lines, a plurality of memory cells, a plurality of bipolar transistors, a connection circuit, a memory cell selector circuit, a data read circuit, and a write circuit.

The memory cell array includes the plurality of memory cells arranged in rows and columns. The memory cell array is split into a plurality of blocks each including a first plurality of rows and a second plurality of columns. The plurality of first main bit lines are provided over the plurality of blocks in correspondence to the columns of the memory cells. The plurality of second main bit lines are provided over the plurality of blocks in correspondence to the columns of the memory cells.

The group of subbit lines are provided in each of the plurality of blocks in correspondence to the second plurality of columns respectively. The plurality of word lines are provided over the plurality of blocks in correspondence to the rows of the memory cells respectively.

The plurality of memory cells are provided in correspondence to intersections of the subbit lines and the word lines respectively. Each memory cell includes a memory cell transistor. The memory cell transistor has a second conductivity type source region and a second conductivity type drain region formed on a first conductivity type major surface of the semiconductor substrate, a channel region held between the source and drain regions, a charge storage electrode formed on the channel region through an oxide film, and a control electrode formed above the charge storage electrode through an insulating film. The drain region of the memory cell transistor is coupled with a corresponding subbit line, and the potential of the control electrode is controlled by a corresponding word line.

Each of the plurality of bipolar transistors is provided for each corresponding one of the blocks, and so arranged as to receive a current flowing between the source and drain regions of a selected memory cell transistor as a base current through a selected subbit line for amplifying the same as a base current and controlling a current flowing to a corresponding first main bit line in a read operation of the nonvolatile semiconductor memory device. The connection circuit selectively couples a subbit line with a corresponding second main bit line in a write operation of the nonvolatile semiconductor memory device, and selectively couples a subbit line with the base of a corresponding bipolar transistor in the read operation. The memory cell selector circuit selects a corresponding subbit line, a corresponding main bit line and a corresponding word line in the read operation, in response to an external address signal.

The data read circuit reads data from the selected memory cell in response to the value of a current flowing in a selected first main bit line. The write circuit injects or extracts electrons into or from the charge storage electrode of a selected memory cell transistor in the write operation.

According to another aspect, the present invention provides a nonvolatile semiconductor memory device formed on a semiconductor substrate, which comprises a memory cell array, a plurality of main bit lines, first and second subbit lines, a plurality of word lines, a plurality of memory cells, first and second bipolar transistors, a connection circuit, a memory cell selector circuit, a data read circuit and a write circuit.

The memory cell array includes the plurality of memory cells arranged in rows and columns. The memory cell array is split into a plurality of blocks each including a plurality of memory cells arranged in first and second columns and a first plurality of rows.

The plurality of first main bit lines are provided for the respective blocks. The first and second subbit lines are provided in correspondence to the columns included in the respective blocks. The plurality of word lines are provided over the plurality of blocks in correspondence to the rows of the memory cells respectively. The plurality of memory cells are provided in correspondence to intersections of the first and second subbit lines and the word lines respectively. Each memory cell includes a memory cell transistor.

The memory cell transistor has a second conductivity type source region and a second conductivity type drain region formed on a first conductivity type major surface of the semiconductor substrate, a channel region held between the source and drain regions, a charge storage electrode formed on the channel region through an oxide film, and a control electrode formed above the charge storage electrode through an insulating film. The drain region of the memory cell transistor is coupled with a corresponding subbit line, and the potential of the control electrode is controlled by a corresponding word line.

Each of the first and second bipolar transistors is provided for the corresponding one of the first and second subbit lines respectively, and so arranged as to receive a current flowing between the source and drain regions of a selected memory cell transistor through a selected first or second subbit line as a base current for amplifying the same. The connection circuit selectively couples the current amplified by the bipolar transistor to flow to a corresponding main bit line in a read operation of the nonvolatile semiconductor memory device, and shorts the emitter and the base of a bipolar transistor corresponding to a selected first or second subbit line for coupling the selected first or second subbit line to a selected main bit line in a write operation of the nonvolatile semiconductor memory device.

The memory cell selector circuit selects a corresponding first or subbit line, a corresponding main bit line and a corresponding word line in the read operation of the nonvolatile semiconductor memory device, in response to an external address signal. The data read circuit reads data from a selected memory cell in response to the value of a current flowing in a selected main bit line. The write circuit injects or extracts electrons into or from the charge storage electrode of a selected memory cell transistor in the write operation.

According to still another aspect, the present invention provides a nonvolatile semiconductor memory device formed on a semiconductor substrate, which comprises a memory cell array, a plurality of main bit lines, a plurality of subbit lines, a plurality of word lines, a plurality of memory cells, a plurality of bipolar transistors, a connection circuit, a memory cell selector circuit, a data read circuit and a write circuit.

The memory cell array includes the plurality of memory cells arranged in rows and columns. The memory cell array is split into a plurality of blocks each including a plurality of memory cells arranged in at least first and second columns and a first plurality of rows.

The plurality of main bit lines are provided over at least two blocks. The plurality of subbit lines are provided at least in a pair in correspondence to the columns included in each block. The plurality of word lines are provided over the plurality of blocks in correspondence to the rows of the memory cells respectively.

Each of the memory cells, which are provided in correspondence to intersections between the subbit lines and the word lines respectively, includes a memory cell transistor. The memory cell transistor has a second conductivity type source region and a second conductivity type drain region formed on a first conductivity type major surface of the semiconductor substrate, a channel region held between the source and drain regions, a charge storage electrode formed on the channel region through an oxide film, and a control electrode formed above the charge storage electrode through an insulating film. The drain region of the memory cell transistor is coupled with a corresponding subbit line, and the potential of the control electrode is controlled by a corresponding word line.

Each of the plurality of bipolar transistors is provided in correspondence to first and second ones of the plurality of blocks, for receiving a current flowing between the source and drain regions of a selected memory cell transistor through a selected subbit line as a base current and amplifying the same in a read operation. The connection circuit selectively couples the base of the bipolar transistor with the selected subbit line for feeding the current amplified by the bipolar transistor to a corresponding main bit line in the read operation of the nonvolatile semiconductor memory device, and shorts the emitter and the base of a bipolar transistor corresponding to a selected subbit line for coupling the selected subbit line with a selected main bit line in a write operation of the nonvolatile semiconductor memory device.

The memory cell selector circuit selects the corresponding subbit line, the corresponding main bit line and a corresponding word line in the read operation of the nonvolatile semiconductor memory device in response to an external address signal. The data read circuit reads data from a selected memory cell in response to the value of the current flowing in the selected main bit line. The write circuit injects or extracts electrons into or from the charge storage electrode of a selected memory cell transistor in the write operation.

Thus, a principal advantage of the present invention resides in that drain disturb can be suppressed in write and erase operations since the bit lines are in a hierarchical structure consisting of the main bit lines and the subbit lines.

Another advantage of the present invention resides in that a high-speed read operation can be implemented with a low power supply voltage, since the bipolar transistor amplifies the current flowing through the subbit line.

Still another advantage of the present invention resides in that the bipolar transistor amplifies the current flowing in the subbit line and transmits the same to the main bit line in the read operation while the emitter and the base of the bipolar transistor are shorted so that no high voltage is applied to the bipolar transistor in the write or erase operation.

A further advantage of the present invention resides in that each bipolar transistor is shared by each adjacent pair of blocks, whereby a structure suitable for high integration can be provided and the chip area can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[Embodiment 1]

Figure 1:
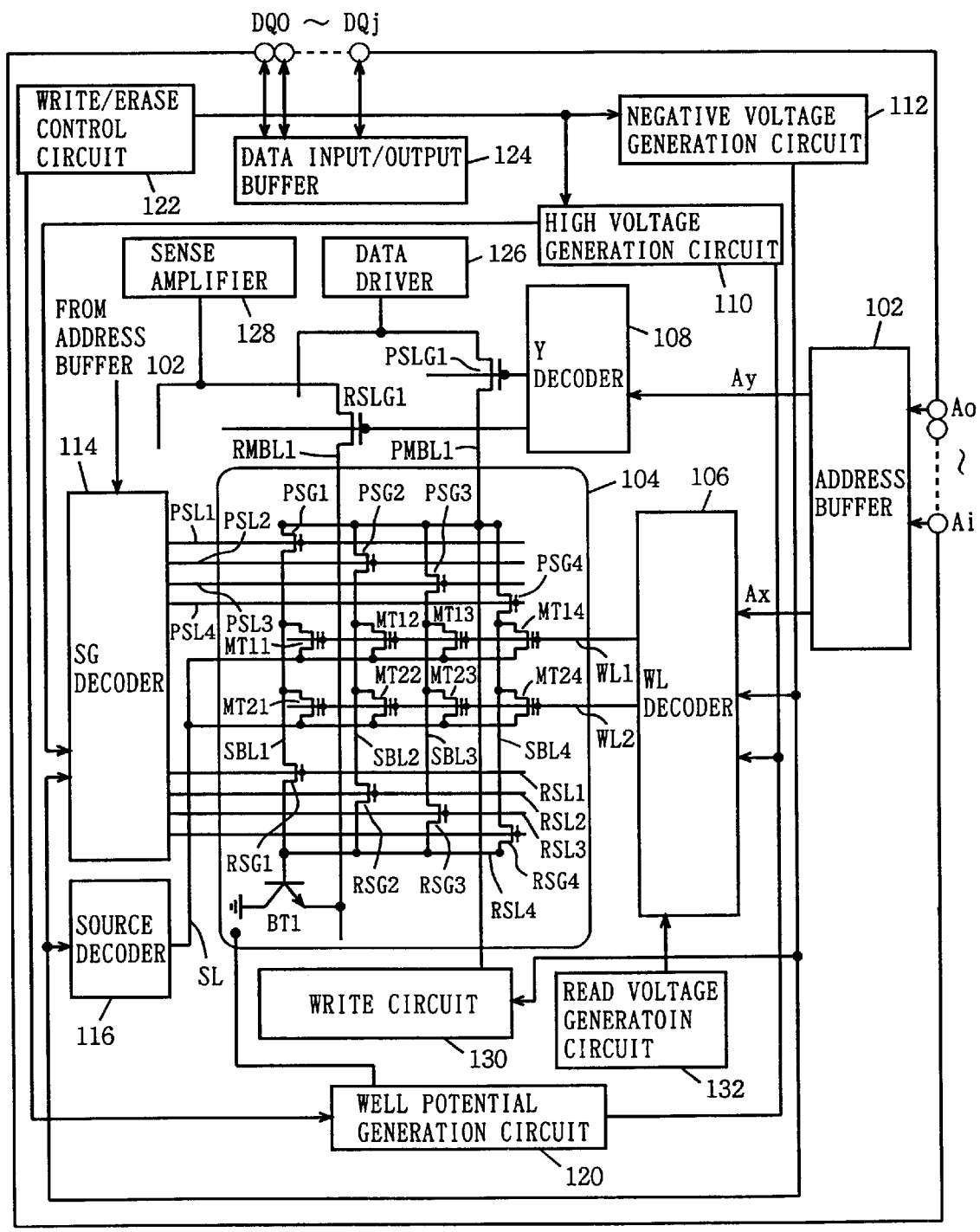
FIG. 1 is a schematic block diagram showing the structure of a nonvolatile semiconductor memory device 1000 according to an embodiment 1 of the present invention.

FIG. 1 is a schematic block diagram showing the structure of a nonvolatile semiconductor memory device 1000 according to an embodiment 1 of the present invention.

As shown in FIG. 1, the nonvolatile semiconductor memory device 1000 includes an address buffer 102, a memory cell array 104, a WL decoder 106, a Y decoder 108, an SG decoder 114, and a source decoder 116.

The address buffer 102 receives external address signals A0 to Ai, and outputs a corresponding internal row address signal Ax and a corresponding internal column address signal Ay. The WL decoder 106 receives the internal row address signal Ax from the address buffer 102, and selects a corresponding word line of the memory cell array 104. The Y decoder 108 receives the internal column address signal Ai from the address buffer 102, and selects a corresponding main bit line of the memory cell array 104.

The memory cell array 104, which is a NOR memory array, includes a plurality of memory cell transistors MT. The memory cell transistors MT are formed by floating gate transistors.

In the following description, it is assumed that the memory cell transistors MT and cell selector transistors are P-channel MOS transistors.

For simplifying the illustration, FIG. 1 typically shows a block including two rows by four columns of memory cell transistors MT11, MT12, MT13, MT14, MT21, MT22, MT23 and MT24.

In general, the block of the memory cell array 104 includes more memory cell transistors MT, and this block can be brought into a structure corresponding to an erase unit in an erase operation formed in the same well.

Respective control gate electrodes of the memory cell transistors MT11 to MT14 are connected to a word line WL1. Respective control gate electrodes of the memory cell transistors MT21 to MT24 are connected to a word line WL2.

Respective source regions of the memory cell transistors MT11 to MT14 and MT21 to MT24 are connected to a source line SL.

Drain regions of the memory cell transistors MT11 and MT21 are connected to a subbit line SBL1. Drain regions of the memory cell transistors MT12 and MT22 are connected to a subbit line SBL2. Drain regions of the memory cell transistors MT13 and MT23 are connected to a subbit line SBL3. Drain regions of the memory cell transistors MT14 and MT24 are connected to a subbit line SBL4.

An end of the subbit line SBL1 is connected with a program main bit line PMBL1 through a selector gate transistor PSG1. An end of the subbit line SBL2 is connected with the program main bit line PMBL1 through a selector gate transistor PSG2. An end of the subbit line SBL3 is connected with the program main bit line PMBL1 through a selector gate transistor PSG3. An end of the subbit line SBL4 is connected with the program main bit line PMBL1 through a selector gate transistor PSG4.

Respective gate electrodes of the selector gate transistors PSG1 to PSG4, which are MOS transistors, are connected to selector lines PSL1 to PSL4 respectively.

A bipolar transistor BT1 is provided in correspondence to the aforementioned block of the memory cell array 104.

The collector of the bipolar transistor BT1 receives a ground potential.

The other end of the subbit line SBL1 is connected to the base of the bipolar transistor BT1 through a selector gate transistor RSG1. The other end of the subbit line SBL2 is connected to the base of the bipolar transistor BT1 through a selector gate transistor RSG2. The other end of the subbit line SBL3 is connected to the base of the bipolar transistor BT1 through a selector gate transistor RSG3. The other end of the subbit line SBL4 is connected to the base of the bipolar transistor BT1 through a selector gate transistor RSG4.

Gate electrodes of the selector gate transistors RSG1 to RSG4, which are MOS transistors, are connected to selector lines RSL1 to RSL4 respectively.

The emitter of the bipolar transistor BT1 is connected with a read main bit line RSLG1.

In practice, the memory cell array 104 includes a plurality of memory cell blocks each having the aforementioned structure.

The WL decoder 106 selects the corresponding one of word lines WL1 to WL4 in response to the internal row address signal Ax supplied from the address buffer 102.

The SG decoder 114 activates any of the selector lines PSL1 to PSL4 to connect a subbit line corresponding to a column selected in response to the internal column address signal Ay supplied from the address buffer 102 with the program main bit line PMBL1 in write and erase operations. The SG decoder 114 activates any of the selector lines RSLL to RSL4 to connect a subbit line corresponding to a selected column with the read main bit line RMBL1 in a read operation.

The source decoder 116 adjusts the potential of the source line SL in response to the write, erase and read operations.

The nonvolatile semiconductor memory device 1000 further includes a high voltage generation circuit 110, a negative voltage generation circuit 112, a well potential generation circuit 120 and a read voltage generation circuit 132.

The high voltage generation circuit 110 receives the external power supply voltage VCC, and generates a high voltage necessary for a data write or erase operation for the memory cell array 104. The negative voltage generation circuit 112 receives the external power supply voltage VCC, and generates a negative voltage necessary for a write or erase operation for the memory cell array 104. The well potential generation circuit 120 receives an output of the high voltage generation circuit 110, and controls the well potential of the surface of a semiconductor substrate provided with the memory cell transistors MT11 to MT24. The read voltage generation circuit 132 generates an arbitrary read voltage.

The WL decoder 106 receives outputs of the high voltage generation circuit 110 and the negative voltage generation circuit 112, for supplying a prescribed positive voltage to a selected word line WL in the write operation, while supplying a negative voltage to a selected word line WL in the erase operation.

The nonvolatile semiconductor memory device 1000 further includes a write/erase control circuit 122, a data input/output buffer 124, a data driver 126, a sense amplifier 128 and a write circuit 130.

The write/erase control circuit 122 controls the write and erase operations for the memory cell array 104. The data input/output buffer 124 receives data from the exterior and transmits the same to the internal circuits or receives data read from the memory cell array 104 and outputs the same to the exterior. The data driver 126 receives write data inputted in the data input/output buffer 124, and drives the potential of a corresponding bit line. The sense amplifier 128 outputs corresponding read data in response to storage information of a selected memory cell through the read main bit line RMBL1 in data reading. The write circuit 130 receives the write data from the data driver 126, holds the same, and supplies the negative voltage from the negative voltage generation circuit 112 to a corresponding bit line.

The data driver 126 is connected with the program main bit line PMBL1 through a column selector gate PSLG1, and the sense amplifier 128 is connected with the read main bit line RMBL1 through a column selector gate RSLG1. The Y decoder 108 controls the gate potentials of the column selector gates PSG1 and RSG1. Thus, a selected main bit line (the program and read main bit lines are hereinafter generically called main bit lines) is connected with the sense amplifier 128 or the data driver 126 in response to the internal column address signal Ay from the address buffer 102.

Figure 2:
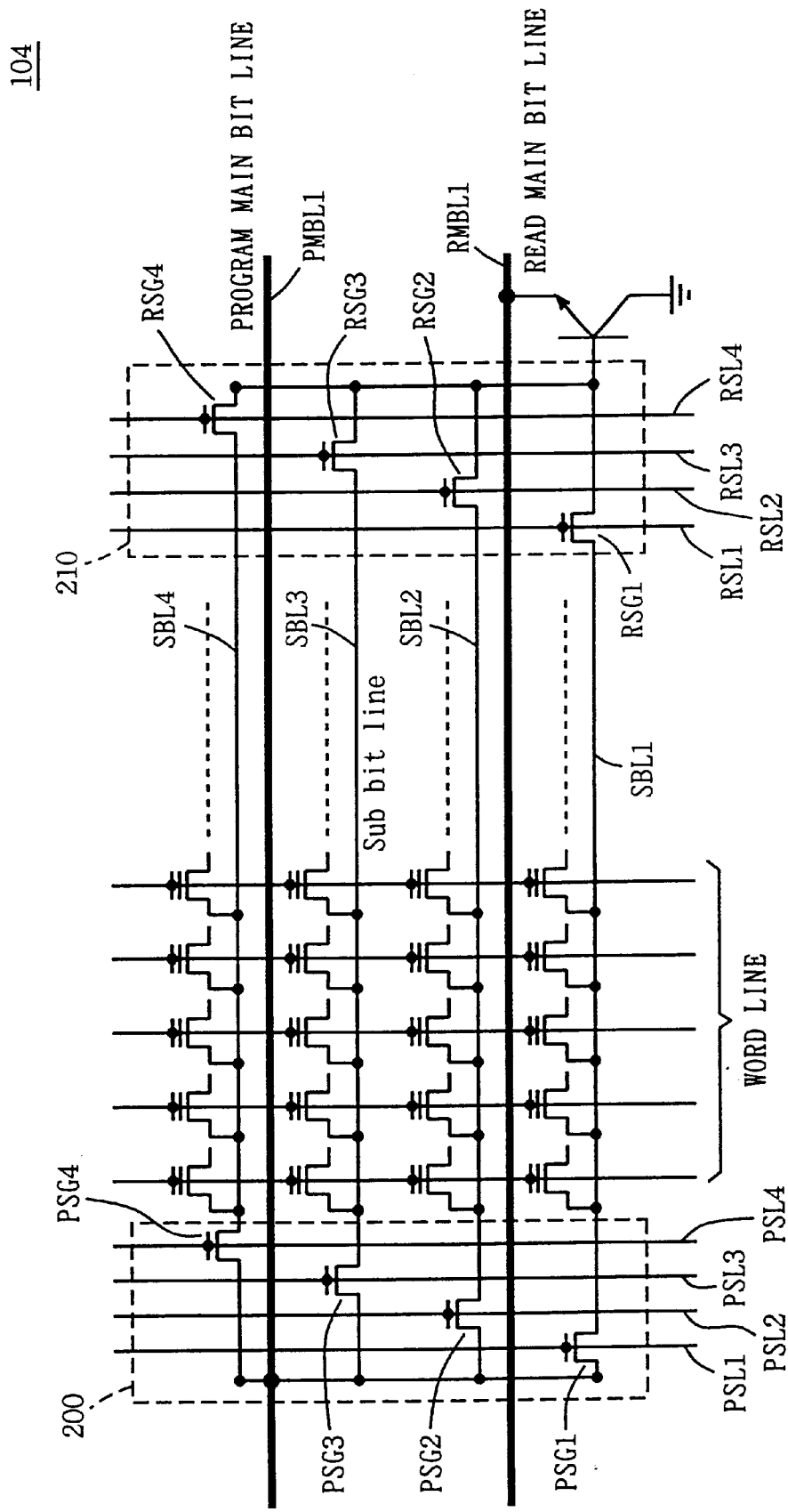
FIG. 2 is a circuit diagram showing the structure of a memory cell block 104.

FIG. 2 is a circuit diagram showing the structure of the memory cell array 104 shown in FIG. 1 in more detail.

Each of the four subbit lines SBL1 to SBL4 is connected with the drains of a plurality of memory cell transistors which are floating gate transistors.

The gates of the memory cell transistors belonging to the same rows among those connected with the four subbit lines SBL1 to SBL4 are connected to corresponding word lines WL in common.

First ends of the four subbit lines SBL1 to SBL4 are selectively connected with the program main bit line PMBL1 by a first switching circuit 200 respectively. The first switching circuit 200 is controlled by the SG decoder 114 through the selector lines PSL1 to PSL4.

The first switching circuit 200 includes the selector gates PSG1 to PSG4 which are connected between the corresponding subbit lines SBL1 to SBL4 and the program main bit line PMBL1 respectively.

The gates of the selector gates PSG1 to PSG4 are connected with the corresponding selector lines PSL1 to PSL4 respectively.

Second ends of the four subbit lines SBL1 to SBL4 are selectively connected with the base of the bipolar transistor BT1 by a second switching circuit 210. The second switching circuit 210 is controlled by the SG decoder 114 through selector lines RSL1 to RSL4.

The second switching circuit 210 includes the selector gates RSG1 to RSG4 which are connected between the corresponding subbit lines SBL1 to SBL4 and the read main bit line RMBL1 respectively.

The gates of the selector gates RSG1 to RSG4 are connected with the corresponding selector lines RSLS1 to RSL4 respectively.

[Operation of P-channel Floating Gate Memory Cell Transistor]

As hereinabove described, the memory cell transistors MT11 to MT24 are P-channel floating gate transistors in the example shown in FIG. 2.

Write and erase operations for each memory cell transistor, which is a P-channel floating gate transistor, and characteristics thereof are briefly described.

Figure 3:
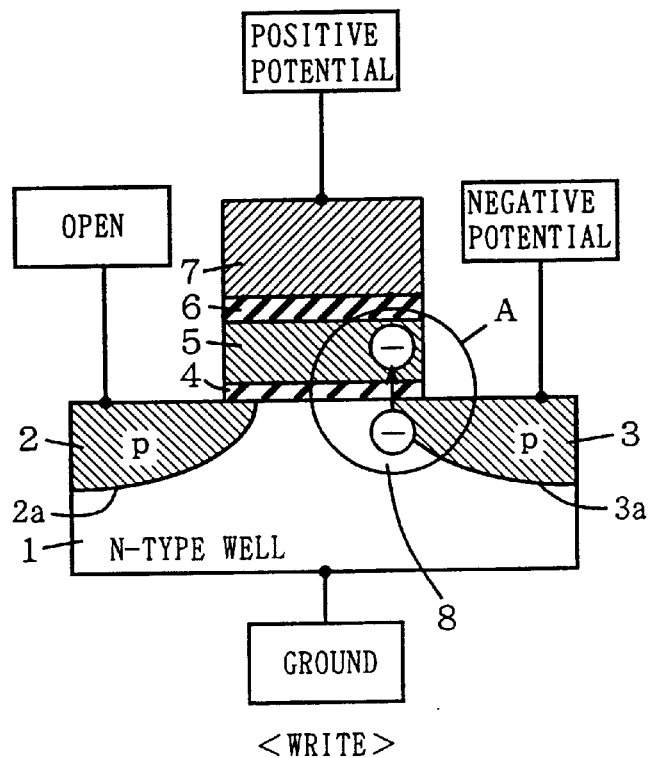
FIG. 3 is a conceptual diagram for illustrating a write operation of a P-channel memory cell transistor.

FIG. 3 is a sectional view showing the structure of each P-channel floating gate memory cell transistor. The P-channel floating gate memory cell transistor includes an N-type well 1, and P-type source and drain regions 2 and 3 formed on its surface. Referring to FIG. 3, P-N junctions 2a and 3a are formed on the boundaries between the source and drain regions 2 and 3 and the N-type well 1 respectively.

A floating gate electrode 5 is formed above a channel region 8 which is held between the source and drain regions 2 and 3, through a tunnel oxide film 4. A control gate electrode 7 is formed above the floating gate electrode 5 through an insulating film 6. In general, the insulating film 6 is prepared from a three-layer film consisting of an oxide film, a nitride film and another oxide film.

Write, erase and read operations of the nonvolatile semiconductor memory device 1000 having the aforementioned structure are now described.

Figures 5, 6:
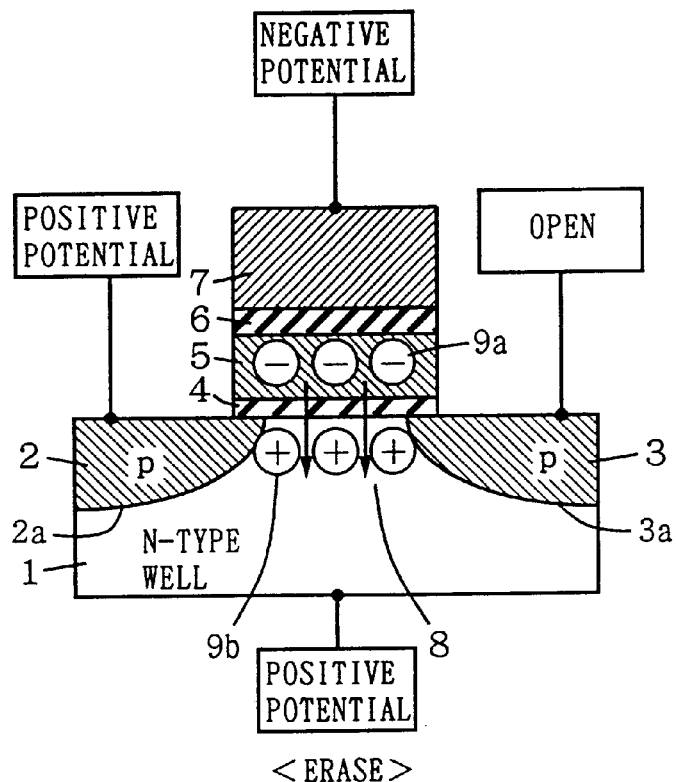
FIG. 5 is a conceptual diagram for illustrating an erase operation of the P-channel memory cell transistor.
FIG. 6 illustrates potential arrangements in write, erase and read operations of the P-channel memory cell transistor.

Referring to FIGS. 3 and 6, a positive potential of about 4 to 11 V is applied to the control gate electrode 7, a negative potential of about −3 to −10 V is applied to the drain region 3, the source region 2 is brought into an open state, and the N-type well 1 is set at the ground potential in writing. Namely, the potentials are applied in a potential arrangement of reverse polarity to that in writing for a conventional DINOR flash memory cell transistor formed by an N-channel MOS transistor.

Figure 4:
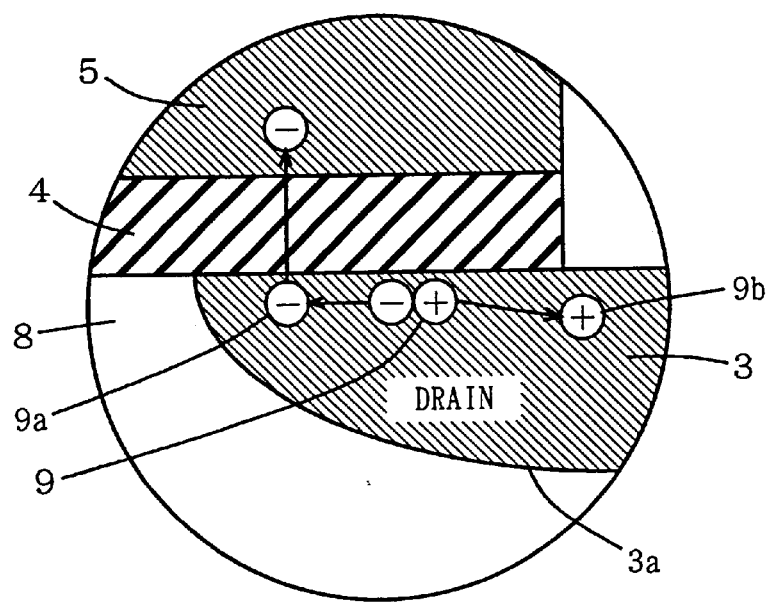
FIG. 4 is a conceptual diagram showing an electron-hole pair generation process in the write operation of the P-channel memory cell transistor.

FIG. 4 is a model diagram showing the write operation in an area A appearing in FIG. 3.

A band-to-band tunnel current is generated in the drain region 3, to form electron-hole pairs 9. An electron 9a is accelerated toward the channel region 8 by a transverse field, to become a hot electron having high energy. The positive potential is applied to the control gate electrode 7 at this time, whereby the hot electron 9a can be readily injected into the tunnel oxide film 4 to reach the floating gate electrode 5. Electrons are injected into the floating gate electrode 5 due to such hot electron injection induced by the band-to-band tunnel current, for writing data in the memory cell transistor.

Due to this write operation, the memory cell transistor enters a "Low Vt" state (a state having a low threshold voltage Vth: the absolute value is reduced with a negative sign since the memory cell transistor is a P-channel transistor).

The erase operation is now described with reference to FIGS. 5 and 6. In the erase operation, a negative potential of about −5 to −12 V is applied to the control gate electrode 7, a positive potential of about 5 to 12 V is applied to the source region 2 and the N-type well 1, and the drain region 3 is brought into an open state. Namely, a channel layer of holes is formed in the channel region 8 in a potential arrangement of reverse polarity to that in erasing of a DINOR flash memory cell transistor formed by an N-channel MOS transistor. Due to the aforementioned potential arrangement, a strong electric field is applied to the tunnel oxide film 4 between the channel layer and the floating gate electrode 5, so that electrons are extracted from the floating gate electrode 5 to the channel layer of the holes due to an F-N tunnel phenomenon. Thus, the memory cell transistor enters a "High Vt" state (a state having a high threshold voltage Vth: the absolute value is increased with a negative sign since this memory cell transistor is a P-channel transistor).

In the read operation, further, a negative potential of about −1.5 to −5 V substantially at an intermediate level between the "High Vt" and "Low Vt" states is applied to the control gate electrode 7, the source region 2 and the N-type well 1 are set at the ground potential, and a negative potential of about −0.1 to −2 V is applied to the drain region 3, as shown in FIG. 4.

Due to this potential arrangement, a determination is made as to whether or not the nonvolatile semiconductor memory device 1000 is in a "Low Vt" state depending on whether or not a current flows therein.

Due to the potential conditions for the P-channel floating gate memory cell transistor shown in FIG. 6, holes 9b of the electron-hole pairs 9 generated by the band-to-band tunnel current in the vicinity of the drain region 3 are pulled toward the drain region 3 and scattered to lose energy due to a high hole concentration in the drain region 3, not to become hot holes having high energy. Even if hot holes are present, these hot holes cannot be injected since the floating gate electrode 5 is at a positive potential.

Thus, no hot holes are injected into the tunnel oxide film 4, and hence it is possible to prevent remarkable deterioration of the tunnel oxide film 4 caused by hot hole injection, dissimilarly to the conventional N-channel MOS memory cell transistor.

Due to occurrence of no hot hole injection into the tunnel oxide film 4, no field relaxing layer is required for ensuring an effective gate length dissimilarly to the conventional N-channel MOS memory cell transistor, whereby further refinement is enabled, i.e., higher integration is enabled as compared with the structure of the conventional N-channel MOS memory cell transistor.

[Operation of Nonvolatile Semiconductor Memory Device 1000]

Operations of the nonvolatile semiconductor memory device 000 according to the embodiment 1 of the present invention are now briefly described.

[Program Operation]

In case of writing data in any memory cell transistor, the address signals A0 to Ai specifying the address of a memory cell to be selected are supplied to the address buffer 102. On the other hand, the data input/output buffer 124 is supplied with the data to be written, and the data driver 126 drives the potential level of the corresponding bit line BL in response. The write circuit 130 receives the write data from the data driver 126 through the program bit line BL1.

The case of writing data in the memory cell transistor MT11 is described. First, an erase operation is performed on a sector including the memory cell transistor MT11. It is assumed here that the term "sector" indicates a memory cell group formed in the same well, for example, and corresponds to the memory cell block shown in FIG. 2.

In the following description, the memory cell transistor MT11 is noted.

Under control by the write/erase control circuit 122, the program main bit line PMBL1 is brought into a floating state, while the high voltage generation circuit 110 and the negative voltage generation circuit 112 generate prescribed high and negative voltages respectively. In response to this, the source decoder 116 brings the source potential of the memory cell transistor MT11 into a prescribed positive level (e.g., 8 V) through the source line SL. The well potential generation circuit 120 also brings the well potential of the memory cell transistor MT11 into the same level (e.g., 8 V) as the source potential.

The SG decoder 114 supplies a prescribed potential to the selector lines PSL1 to PSL4 in the same sector, and opens the subbit lines SBL1 to SBL4 from the program main bit line PMBL1.

The WL decoder 106 is controlled by the write/erase control circuit 122, to supply a negative voltage (e.g., 10 V) outputted from the negative voltage generation circuit 112 to the word lines WL in the sector. Thus, electrons are injected from the floating gate electrode 5 of the memory cell transistor MT11 into the substrate, to increase the absolute value of the threshold voltage Vth of the memory cell transistor MT11. This also applies to the remaining memory cell transistors provided in the sector.

A write operation is now described. The write circuit 130 is controlled by the write/erase control circuit 122, to drive the potential level of the bit line BL1. The source decoder 116 brings the source line SL into a floating state. The well potential generation circuit 120 is controlled by the write/ erase control circuit 122, to set the well potential at 0 V, for example.

The SG decoder 114 supplies a prescribed potential to the sell selector line PSL1 corresponding to the selected column, in response to the internal address signal Ay.

The WL decoder 106 is controlled by the write/erase control circuit 122, to supply a potential (e.g., 8 V) supplied from the high voltage generation circuit 110 to the word line WL1. The write circuit 130 is also controlled by the write/ erase control circuit 122, to set the potential of the program main bit line PMBL1 at a prescribed high level (e.g., −5 V) on the basis of the negative voltage outputted from the negative voltage generation circuit 112.

Consequently, electrons are injected into the floating gate electrode 5 of the memory cell transistor MT11 to change its threshold voltage Vth, thereby writing the data.

In a conventional NOR flash memory, a high voltage is applied to drains of non-selected memory cell transistors connected to the same bit line as a selected memory cell transistor in which data is written. Therefore, charge quantities in floating gates of the non-selected memory cell transistors on the same bit line are so changed that the written data is changed in the worst case.

In the memory cell array 104 according to the embodiment 1, however, it is possible to connect only the subbit line selected in rewriting with the program main bit line PMBL1 by employing any selector gate transistor. Therefore, it is possible to reduce influence exerted by a rewrite operation for any memory cell transistor on the threshold voltages of the remaining memory cell transistors.

[Read Operation]

In case of reading data from any memory cell transistor, the address signals A0 to Ai specifying the address of the memory cell to be selected are supplied to the address buffer 102. The address buffer 102 outputs the internal address signal Ax.

It is assumed that the memory cell transistor MT11 is selected. The SG decoder 114 supplies a prescribed potential to the selector line RSL1 corresponding to the column selected for reading in response to the internal address signal Ay, thereby connecting the subbit line SBL1 with the base of the bipolar transistor BT1.

The WL decoder 106 supplies a prescribed potential (e.g., −1.8 V) to the word line WL1 selected for reading, in response to the internal address signal Ax.

Further, the read main bit line RMBL1 is supplied with a potential of −1.8 V, for example, and the source line SL is supplied with a prescribed voltage (e.g., 0 V).

When the memory cell transistor MT11 is in a conducting state at the potential of the word line WL1, i.e., the potential of the control gate electrode 7, the base of the bipolar transistor BT1 is biased to a potential of 1.0 V, for example, on a positive side as compared with the potential (−1.8 V) of the read main bit line RMBL1.

Therefore, the emitter and the base of the bipolar transistor BT1 are forward-biased, and a channel current of the memory cell transistor MT11 flows to the bipolar transistor BT1 as a base current.

In response to this, a current obtained by amplifying the base current in response to the emitter ground current amplification factor of the bipolar transistor BT1 flows to the read main bit line RMBL1.

The sense amplifier 128 detects a change of the potential of the read main bit line RMBL1 through the column selector gate RSLG1.

In the nonvolatile semiconductor memory device 1000 according to the embodiment 1 of the present invention, therefore, the current flowing in the memory cell transistor MT11 may charge only the subbit line SBL1, and the bipolar transistor BT1 supplies a charge current for the read main bit line RMBL1 having a high capacitance.

Therefore, the charge current for the main bit line RMBL1 can implement a high-speed read operation even if the power supply voltage VCC is reduced.

[First Modification of Memory Cell Structure of Embodiment 1]

Figure 7:
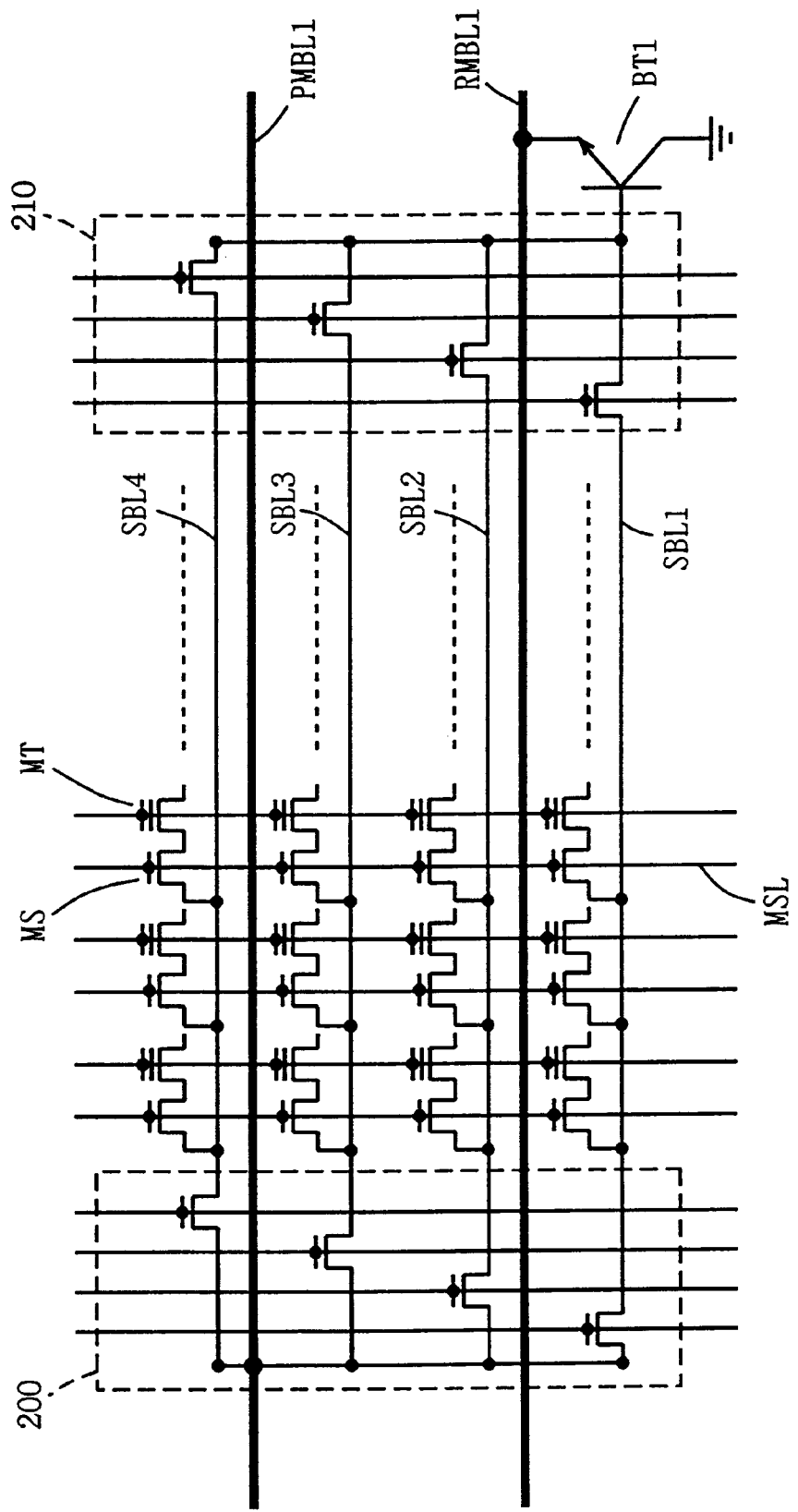
FIG. 7 is a circuit diagram for illustrating the structure of a modification of the memory cell block 104 in detail.

FIG. 7 is a circuit diagram showing the structure of a first modification of the memory cell block shown in FIG. 2. The structure shown in FIG. 7 is different from that of FIG. 2 in a point that cell selector transistors MS are connected between drains of memory cell transistors MT and corresponding subbit lines SBL. It is assumed that the SG decoder 114 controls the gate potentials of the cell selector transistors MS through cell selector lines MSL.

Namely, the SG decoder 114 brings a cell selector transistor in a selected memory cell by activating any cell selector line in response to an external address signal.

In the following description, a memory cell formed by a single memory cell transistor is referred to as a one-transistor memory cell, and the aforementioned memory cell is referred to as a two-transistor memory cell.

Further, connection of arranging a cell selector transistor MS between a drain region of a memory cell transistor MT and a subbit line SBL is referred to as drain select type connection.

The remaining points of this structure are identical to those of the structure of the memory cell block shown in FIG. 2, and hence identical portions are denoted by the same reference numerals, to omit redundant description.

Effects of the aforementioned structure are as follows:

First, it is possible to connect only a memory cell transistor selected in writing with a bit line in a two-transistor memory cell, by employing a cell selector transistor. Therefore, a write operation of a single memory cell transistor exerts no influence on the threshold voltages of the remaining memory cell transistors. Namely, no problem of drain disturb is caused.

Second, there is the following advantage:

Namely, it is possible to set a voltage applied to the control gate electrode of the memory cell transistor MT at an arbitrary level in a read operation, while it is possible to apply the same voltage as that in the read operation to all memory cell transistors in a standby state.

Figures 8, 9:
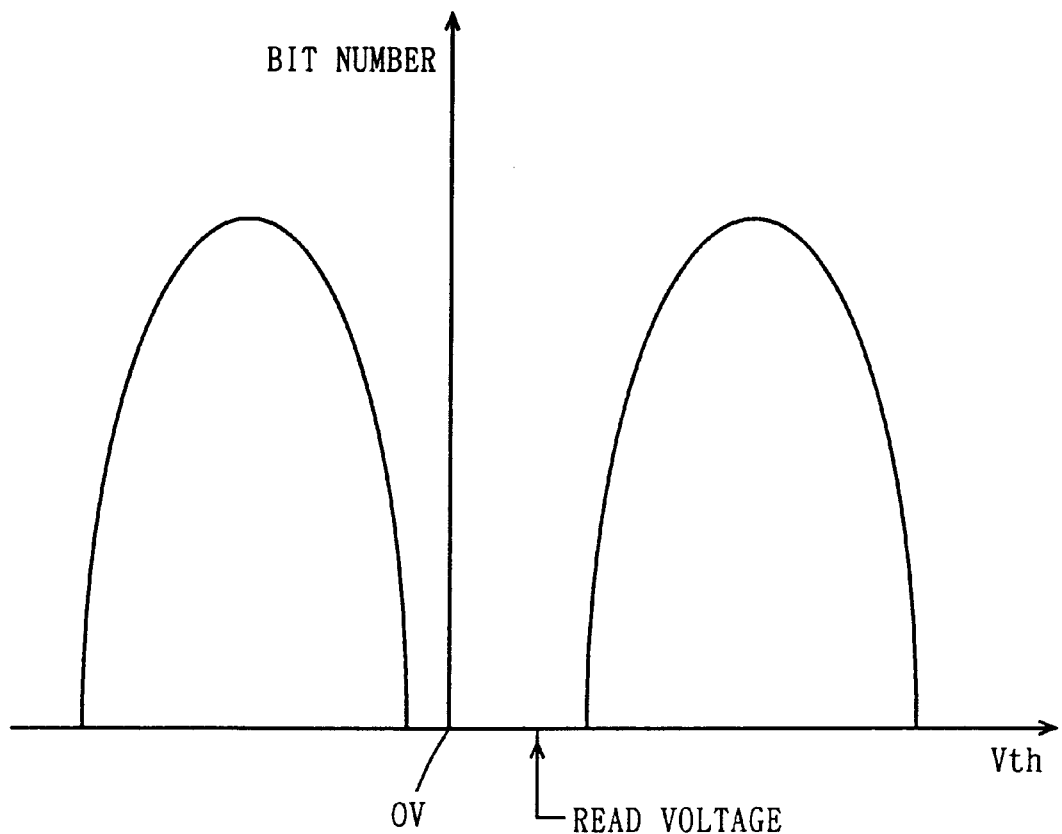
FIG. 8 illustrates threshold voltage distributions of P-channel memory cell transistors.
FIG. 9 illustrates potential arrangements in standby and read states of the P-channel memory cell transistors.

FIG. 8 shows exemplary threshold voltage distributions in a memory cell part of two-transistor memory cells. As shown in FIG. 8, the low-threshold voltage side distribution may be at least 0 V, for example. A voltage (read voltage) applied to the control gate electrodes of the memory cell transistors can be arbitrarily selected in response to this.

This is because a cell selector transistor is connected to each memory cell transistor of a two-transistor memory cell and hence leakage currents from non-selected memory cell transistors can be inhibited by bringing all cell selector transistors corresponding to the non-selected memory cell transistors connected with the same bit line as a selected memory cell transistor into OFF states.

The relation between voltages in read and standby states of a memory cell transistor part of a two-transistor memory cell.

FIG. 9 illustrates voltage conditions of various voltages applied to a two-transistor memory cell of drain select type connection. Referring to FIG. 9, Vcg, Vs, Vd and Vsg denote voltages applied to control gate electrodes of memory cell transistors, source regions connected with a source line, drain regions connected with a subbit line, and gate electrodes of cell selector transistors respectively.

As shown in FIG. 9, it is possible to apply the same voltage as that for reading to the control gate electrodes of the memory cell transistors in the standby state. This is because the memory cell transistors can be disconnected from the bit line by bringing the cell selector transistors corresponding to all memory cell transistors into OFF states and hence no voltage adjustment is required between the standby and read states.

When an arbitrary voltage other than the external power supply voltage VCC is employed as the read voltage Vcg, the read voltage generation circuit 132 shown in FIG. 1 generates the read voltage Vcg and supplies the same to the WL decoder 106.

Namely, a write or erase speed can be adjusted by setting the read voltage Vcg at an arbitrary level.

Enlargement of the margin for the threshold voltage of the memory cell transistor after writing is advantageous for a low power supply voltage operation.

Due to the standby state at the same voltage level as the read voltage Vcg, only the gate voltage of the cell selector transistor may be charged to a prescribed voltage in the read operation. Thus, the read operation is enabled without changing the read voltage Vcg (voltage applied to the word line), whereby a high-speed read operation is enabled without piling the word line with an aluminum wire.

[Second Modification of Memory Cell Structure according to Embodiment 1]

Figure 10:
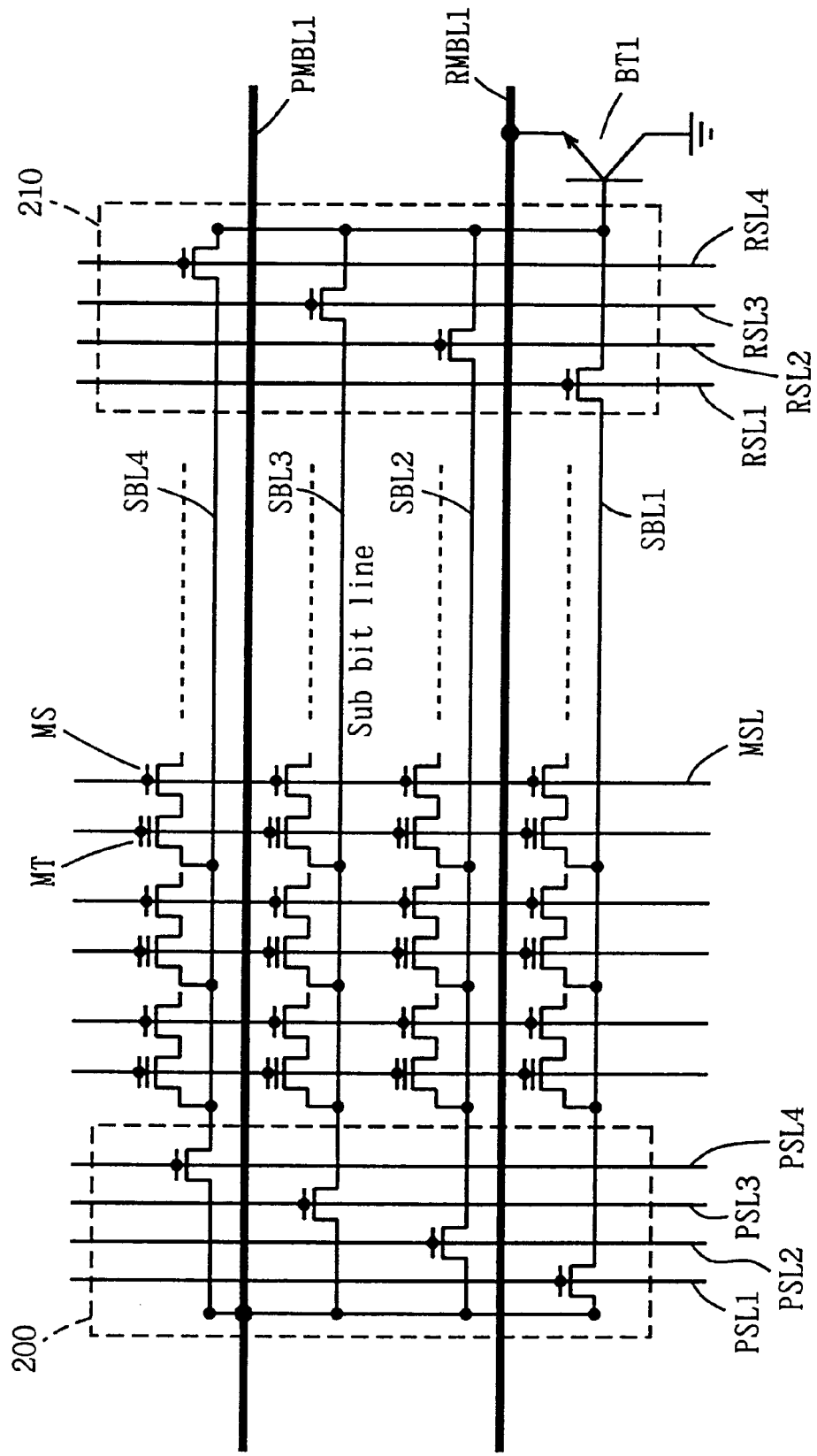
FIG. 10 is a circuit diagram showing another modification of the embodiment 1 of the present invention.
Figure 11:
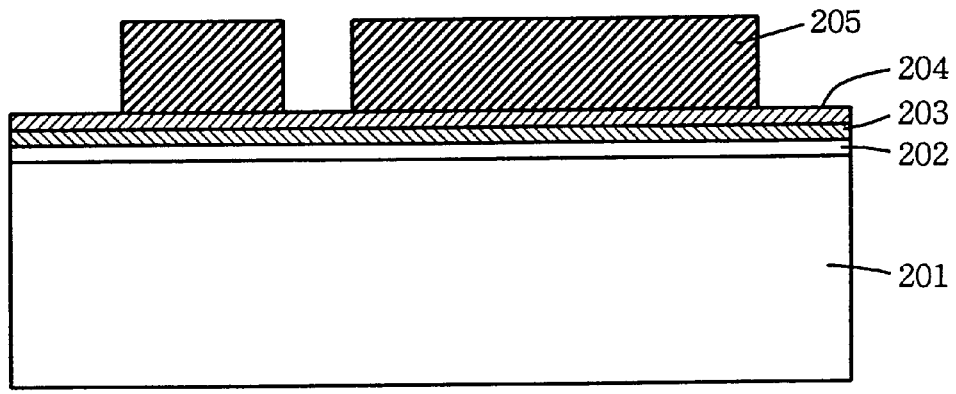
FIG. 11 is a sectional view showing a first step of fabricating a nonvolatile semiconductor memory device according to an embodiment 2 of the present invention.

FIG. 10 is a circuit diagram showing the structure of a second modification of the memory cell block shown in FIG. 2. The structure shown in FIG. 10 is different from that of FIG. 2 in a point that cell selector transistors MS are connected between sources of memory cell transistors MT and corresponding source lines. It is assumed that the SG decoder 114 controls the gate potentials of the cell selector transistors MS through cell selection lines MSL.

Namely, the SG decoder 114 brings a cell selector transistor in a selected memory cell into a conducting state by activating the cell selection line in response to an external address signal.

Connection of arranging a cell selector transistor MS between a source region of a memory cell transistor MT and a source line SL is referred to as source select type connection.

The remaining points of this structure are identical to those of the structure of the memory cell block shown in FIG. 2, and hence identical portions are denoted by the same reference numerals, to omit redundant description.

Due to the aforementioned structure, it is possible to adjust the write or erase speed by setting the read voltage Vcg at an arbitrarily level, similarly to the case of the drain select type connection.

Further, enlargement of the margin for the threshold voltage of the memory cell transistor after writing is advantageous for a low power supply voltage operation.

Due to the standby state at the same voltage level as the read voltage Vcg, only the gate voltage of the cell selector transistor may be charged to a prescribed voltage in the read operation. Thus, the read operation is enabled without changing the read voltage Vcg (voltage applied to the word line), whereby a high-speed read operation is enabled without piling the word line with an aluminum wire.

[Embodiment 2]

A method of fabricating the nonvolatile semiconductor memory device 1000 shown in FIGS. 1 and 2 is now described with reference to FIGS. 11 to 22.

FIGS. 11 to 22 are sectional views showing first to twelfth steps of the method of fabricating the nonvolatile semiconductor memory device 1000 having the aforementioned structure.

First, an underlayer oxide film 202 of about 300 Å in thickness is formed on a major surface of a P-type silicon substrate 201. A polycrystalline silicon film 203 of about 500 Å in thickness is formed on the underlayer oxide film 202 by CVD (chemical vapor deposition). A silicon nitride 204 of about 1000 Å is formed on the polycrystalline silicon film 203 by CVD or the like. A resist film 205 is formed on the silicon nitride film 204 to expose an element isolation region. Anisotropic etching is performed through the resist film 205 serving as a mask, thereby etching parts of the silicon nitride film 204 and the polycrystalline silicon film 203 on the element isolation region.

Figure 12:
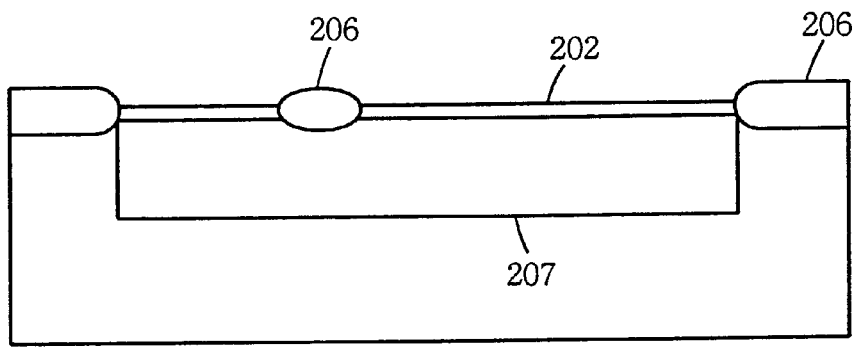
FIG. 12 is a sectional view showing a second step of fabricating the nonvolatile semiconductor memory device according to the embodiment 2.

Thereafter the resist film 205 is removed and selective oxidation is performed through the silicon nitride film 204 serving as a mask, thereby forming field oxide films 206 as shown in FIG. 12. The polycrystalline silicon film 203 and the silicon nitride film 204 are removed.

Then, phosphorus (P) is ion-implanted into a memory cell transistor area and driven at a temperature of about 1000° C. for forming an N-type well 207, as shown in FIG. 12.

Figure 13:
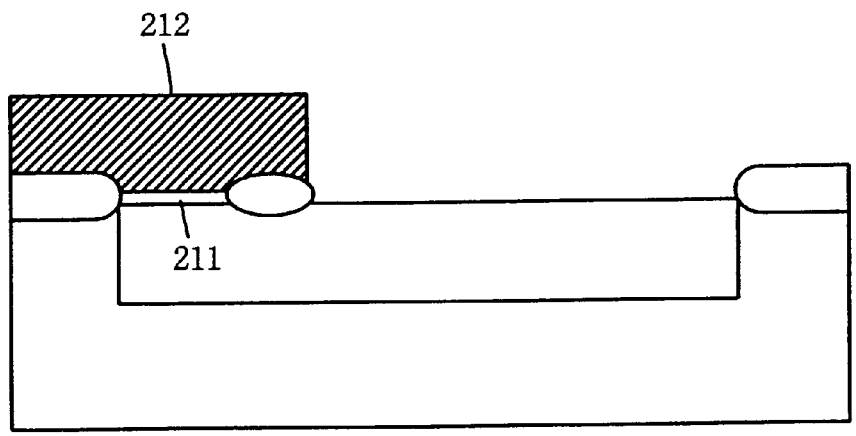
FIG. 13 is a sectional view showing a third step of fabricating the nonvolatile semiconductor memory device according to the embodiment 2.

Referring to FIG. 13, impurity injection is performed for controlling threshold voltages of respective memory cell transistors, the underlayer oxide film 202 is removed and thermal oxidation is performed, thereby forming a gate oxide film 211 of about 150 Å in thickness on the overall upper surface of the P-type silicon substrate 201. Then, a resist film 212 is formed to cover a selector gate transistor forming area. Etching is performed through the resist film 212 serving as a mask, thereby removing the gate oxide film 211 from the remaining area.

Figure 14:
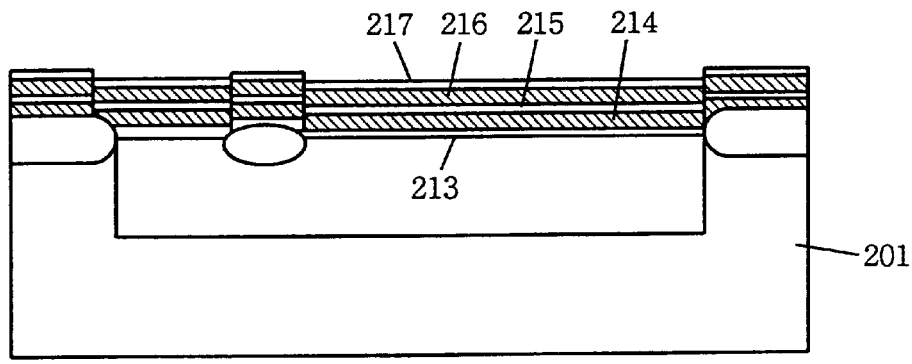
FIG. 14 is a sectional view showing a fourth step of fabricating the nonvolatile semiconductor memory device according to the embodiment 2.

Referring to FIG. 14, the resist film 212 is removed and thermal oxidation is performed again, thereby forming a gate oxide film 213 of about 100 Å in thickness on the overall upper surface of the P-type silicon substrate 201. Thus, the gate oxide film 213 of about 250 Å in thickness is formed on an area for forming selector gate transistors. A first polycrystalline silicon film 214 is formed on the gate oxide film 213 by CVD in a thickness of about 1200 Å.

A high temperature oxide film of about 100 Å in thickness is formed on the first polycrystalline silicon film 214 by CVD or the like, a silicon nitride film is formed on the high temperature oxide film by CVD in a thickness of about 100 Å, and a high temperature oxide film of about 150 Å in thickness is formed on the silicon nitride film by CVD. Thus, an ONO film 215 is defined.

Then, a polycrystalline silicon layer into which an impurity is introduced is formed on the ONO film 215 by CVD in a thickness of about 1200 Å. A tungsten silicide (WSi) layer is formed on the polycrystalline silicon layer in a thickness of about 1200 Å by sputtering. Thus, a conductive layer 216 for defining control gate electrodes is formed.

A TEOS film 217 of about 2000 Å in thickness is formed on the conductive layer 216 by CVD.

Figure 15:
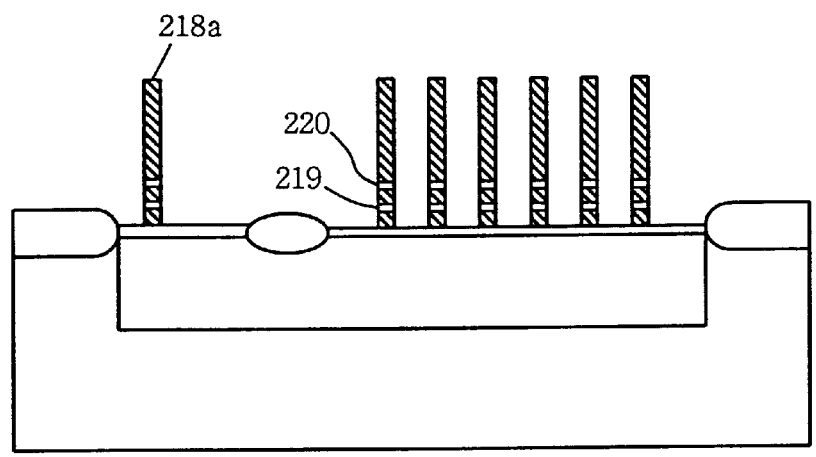
FIG. 15 is a sectional view showing a fifth step of fabricating the nonvolatile semiconductor memory device according to the embodiment 2.

Referring to FIG. 15, resist films 218a are transversely intermittently formed on the TEOS film 217. The resist films 218a are employed as masks for etching the TEOS film 217, the conductive layer 216, the ONO film 215 and the first polycrystalline silicon film 214. Thus, floating gate electrodes 219 and control gate electrodes 220 are formed.

Figure 16:
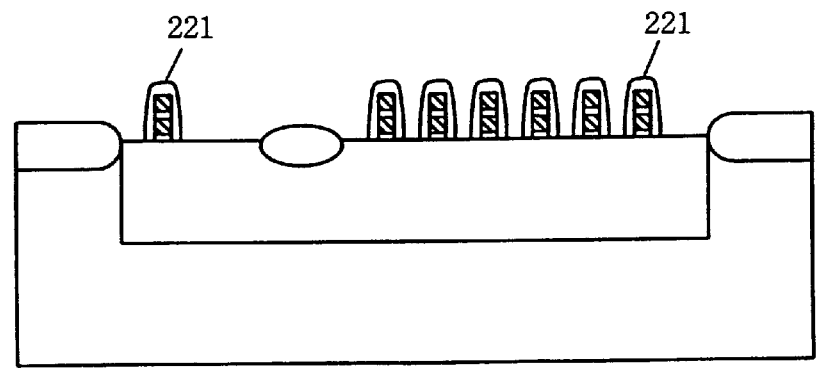
FIG. 16 is a sectional view showing a sixth step of fabricating the nonvolatile semiconductor memory device according to the embodiment 2.

Referring to FIG. 16, high temperature oxide films of about 2000 Å in thickness are formed on selector gate transistor and memory cell transistor areas. The high temperature oxide films are anisotropically etched, thereby forming side walls 221 on side surfaces of gates of transistors.

Figure 17:
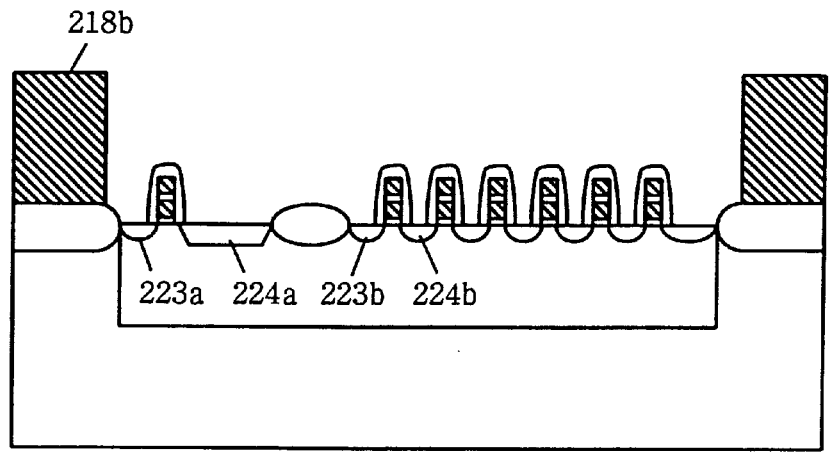
FIG. 17 is a sectional view showing a seventh step of fabricating the nonvolatile semiconductor memory device according to the embodiment 2.

Referring to FIG. 17, the side walls 221 and resist patterns 218b are employed as masks for injecting $BF_2$ or B, thereby forming P-type impurity layers of 1E17 to 1E20 $cm^{-3}$ in concentration and 0.1 to 0.3 μm in thickness in the selector gate transistor part. Thus, a source region 224a and a drain region 223a and source regions 224b and drain regions 223b of a selector gate transistor and memory cell transistors are formed. A base region of a bipolar transistor is also formed at the same time.

The impurity concentration of the source region 224a is preferably set to be lower than that of the source regions 224b, although the present invention is not particularly restricted to this.

This is because emitter injection efficiency is reduced if the impurity concentration of the source region 224a also serving as the base region of the bipolar transistor is excessively high.

Figure 18:
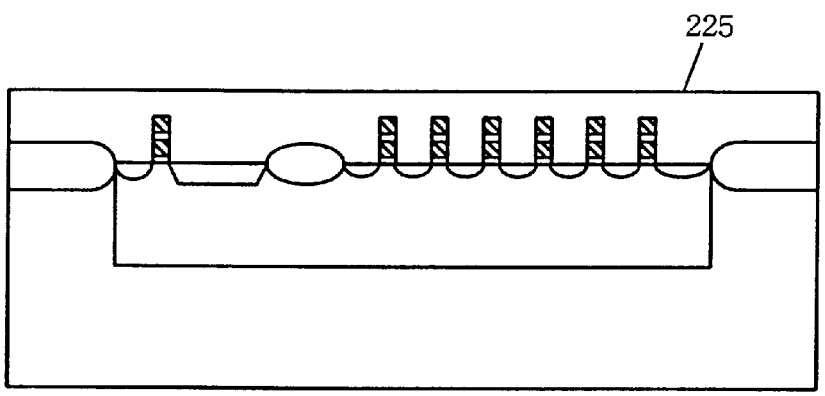
FIG. 18 is a sectional view showing an eighth step of fabricating the nonvolatile semiconductor memory device according to the embodiment 2.

Thereafter the resist patterns 218b are removed, and a silicon oxide film 225 consisting of a TEOS film or the like is formed on the memory cell transistors and the selector gate transistor, as shown in FIG. 18.

Figure 19:
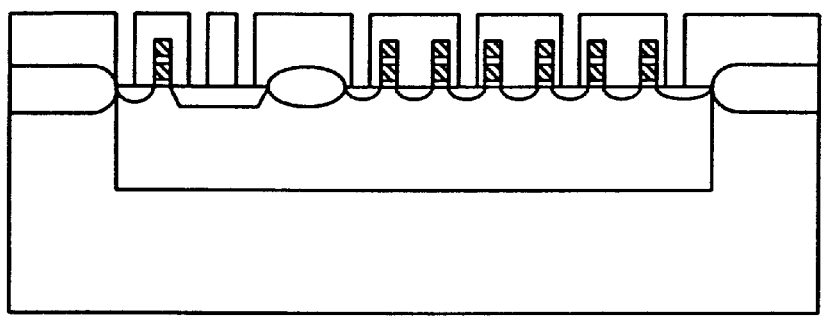
FIG. 19 is a sectional view showing a ninth step of fabricating the nonvolatile semiconductor memory device according to the embodiment 2.

Then, a resist pattern opening only on the drain regions 224b of the memory cell transistors, a base contact region in the source region 223a of the selector gate transistor, a region of the source region 223a of the selector gate transistor other than the base contact region and the drain region 224a is formed, for forming contact holes shown in FIG. 19.

Figure 20:
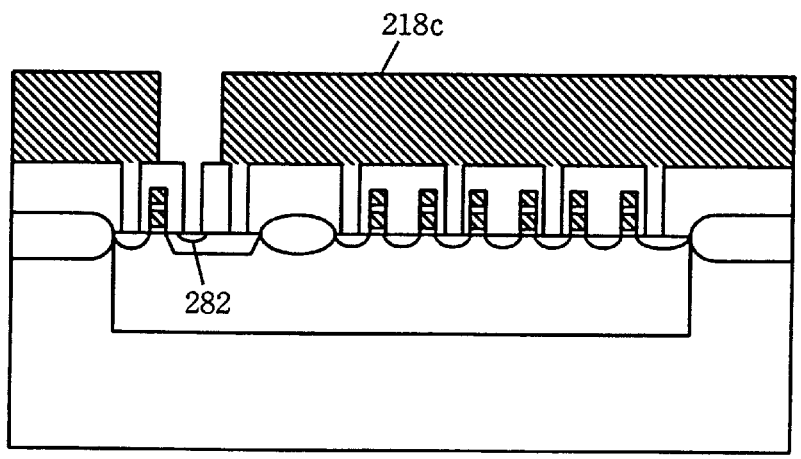
FIG. 20 is a sectional view showing a tenth step of fabricating the nonvolatile semiconductor memory device according to the embodiment 2.

Then, a resist pattern 218c opening only on the region of the source region 223a of the selector gate transistor other than the base contact region is formed and this resist pattern 218c and the silicon oxide film 225 are employed as masks for ion-implanting arsenic (As) or phosphorus (P), for forming an emitter region of 1E19 to 1E21 $cm^{-3}$ in N-type impurity concentration and 0.05 to 0.2 μm in depth, as shown in FIG. 20.

Figure 21:
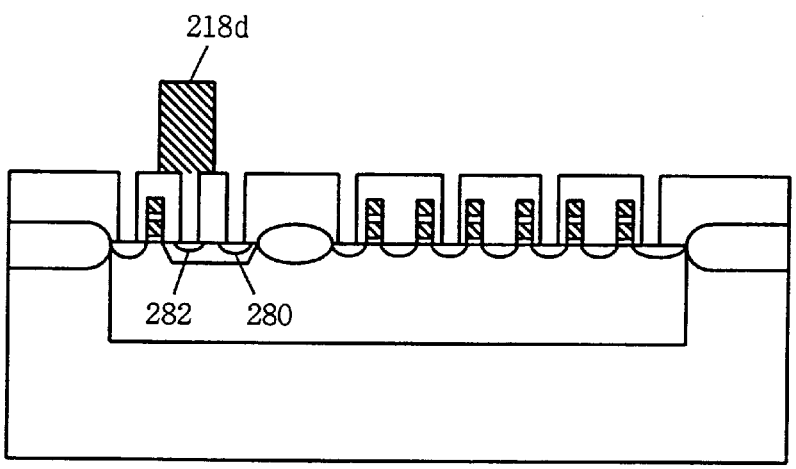
FIG. 21 is a sectional view showing an eleventh step of fabricating the nonvolatile semiconductor memory device according to the embodiment 2.

Then, BF2 or B is injected through a resist pattern 218d reverse to the resist pattern 218c shown in FIG. 20, for forming a $P^+$ region 280 for contact, as shown in FIG. 21.

After the resist pattern 218d is removed, an $N^+$-type emitter region 282 is formed to be enclosed with the P-type source region 223a of the selector gate transistor.

After ion implantation of an N-type impurity is completed on the surface side of the source region 223a of the selector gate transistor, annealing is performed for activating the impurity, thereby forming an emitter region 282 and a base contact layer 280 of the bipolar transistor on the semiconductor surface side of the source region 223a of the selector gate transistor.

Figure 22:
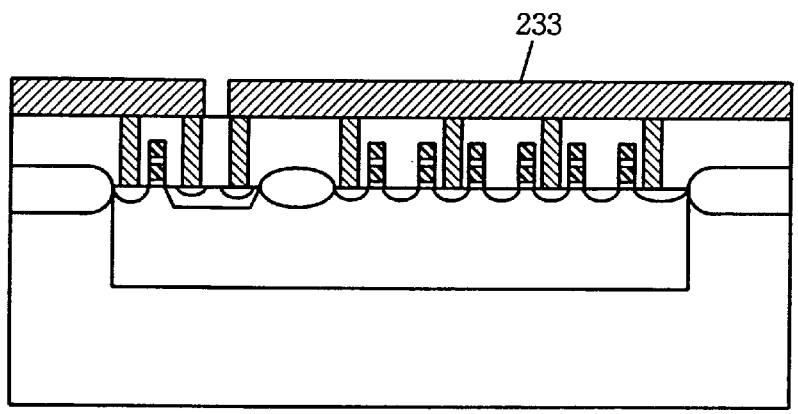
FIG. 22 is a sectional view showing a twelfth step of fabricating the nonvolatile semiconductor memory device according to the embodiment 2.

Referring to FIG. 22, a first aluminum alloy layer of about 5000 Å in thickness is formed on the silicon oxide film 225 by sputtering or the like.

A resist film (not shown) of a prescribed shape is deposited on the first aluminum alloy layer for patterning the first aluminum alloy layer through the resist film serving as a mask, thereby forming a bit line 233.

Thereafter the resist film employed for patterning the first aluminum alloy layer is removed, and an interlayer isolation layer (not shown) is formed on the bit line 233.

Figure 23:
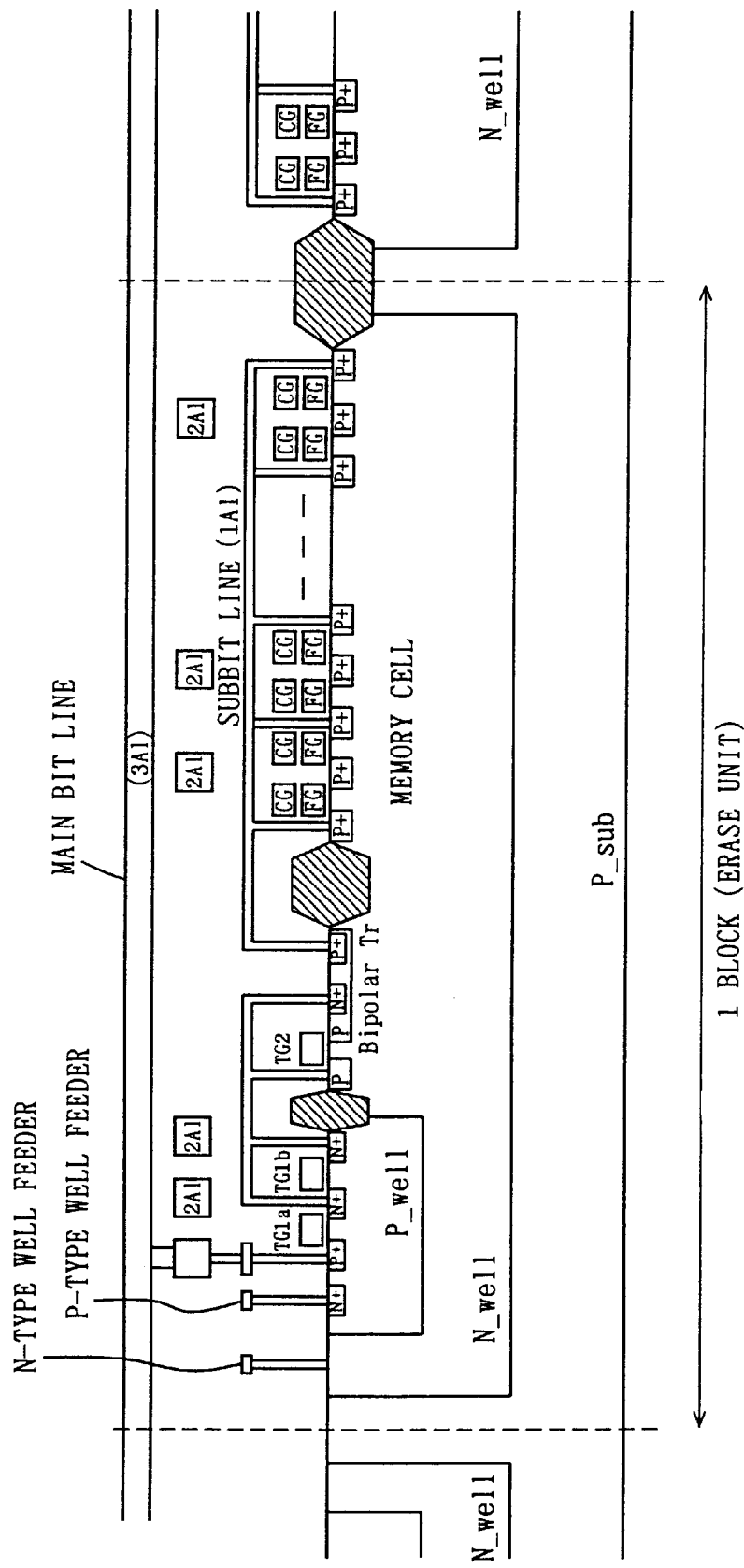
FIG. 23 is a sectional view showing a sectional structure of the nonvolatile semiconductor memory device.

Further, a second aluminum alloy layer, an interlayer isolation film and a third aluminum alloy layer are formed, thereby forming a nonvolatile semiconductor memory device 1000 having a sectional structure shown in FIG. 23. In practice, a passivation film is further formed in continuation.

Referring to FIG. 23, the third aluminum alloy layer forms a main bit line.

Due to the aforementioned process, it is possible to form a bipolar transistor sharing a source region with a selector gate transistor in each memory cell block while suppressing increase of a memory cell area.

[Well Structure]

Figure 24:
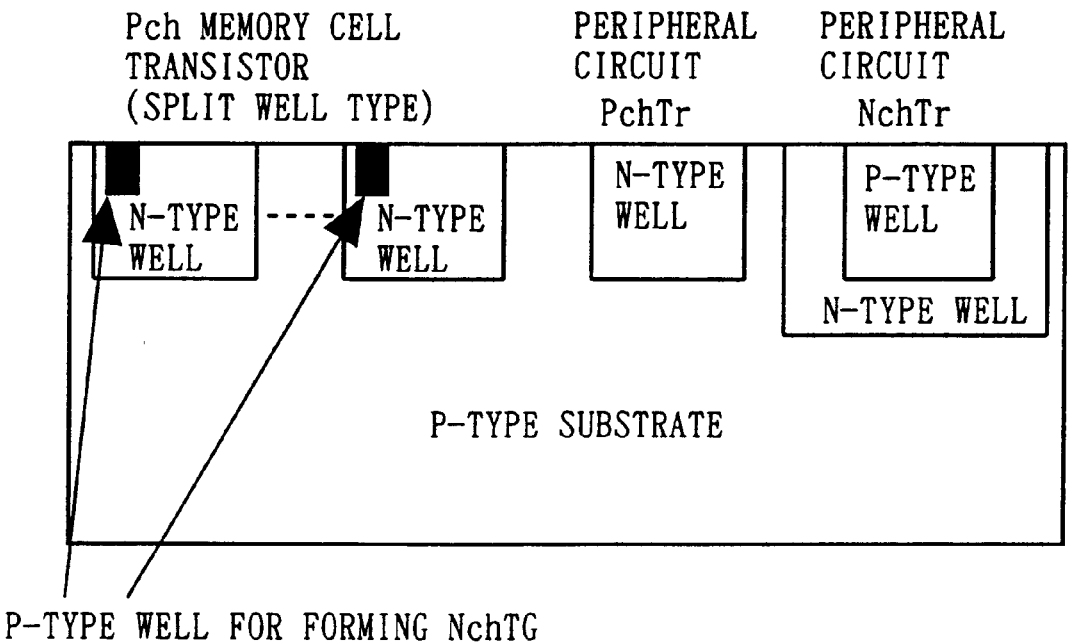
FIG. 24 is a first diagram showing a well structure of the nonvolatile semiconductor memory device.

FIG. 24 is a sectional view showing the structure of a well provided with the nonvolatile semiconductor memory device 1000 according to the embodiment 1 of the present invention. In the structure shown in FIG. 24, a P-type well is formed in an N-type well provided on a surface side of a P-type substrate, to be provided with an N-channel transistor of a peripheral circuit.

Therefore, a CMOS transistor forming the peripheral circuit is formed in the so-called triple well.

Due to this well structure, resistance against a latch-up phenomenon of the peripheral circuit etc. is improved.

Figure 25:
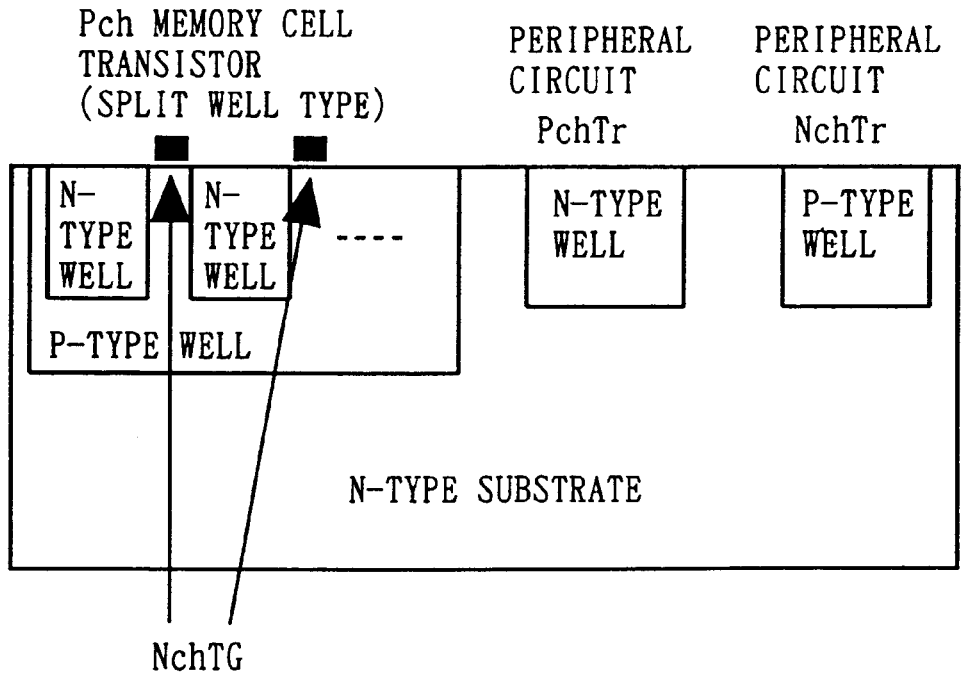
FIG. 25 is a second diagram showing another well structure of the nonvolatile semiconductor memory device.

FIG. 25 is a sectional view showing another exemplary well structure for the nonvolatile semiconductor memory device 1000 shown in FIG. 1.

Referring to FIG. 25, a memory cell array is formed in a region of an N-type well which is formed in a P-type well formed on a surface of an N-type substrate.

In this case, therefore, the N-type well provided with memory cell transistors can be split for each erase block.

Further, a P-channel transistor of a CMOS circuit forming a peripheral circuit is formed in an N-type well region formed on the surface of the N-type substrate. An N-channel MOS transistor of the CMOS circuit forming the peripheral circuit is formed in a P-type well region formed on the surface of the N-type substrate.

Due to the well structure shown in FIGS. 24 or 25, the nonvolatile semiconductor memory device 1000 shown in FIG. 1 can be formed on either a P-type substrate or an N-type substrate.

Particularly when a P-type substrate is employed, a well provided with P-channel memory cell transistors can be split for each erase block when forming the P-channel memory cell transistors.

[Embodiment 3]

Figure 26:
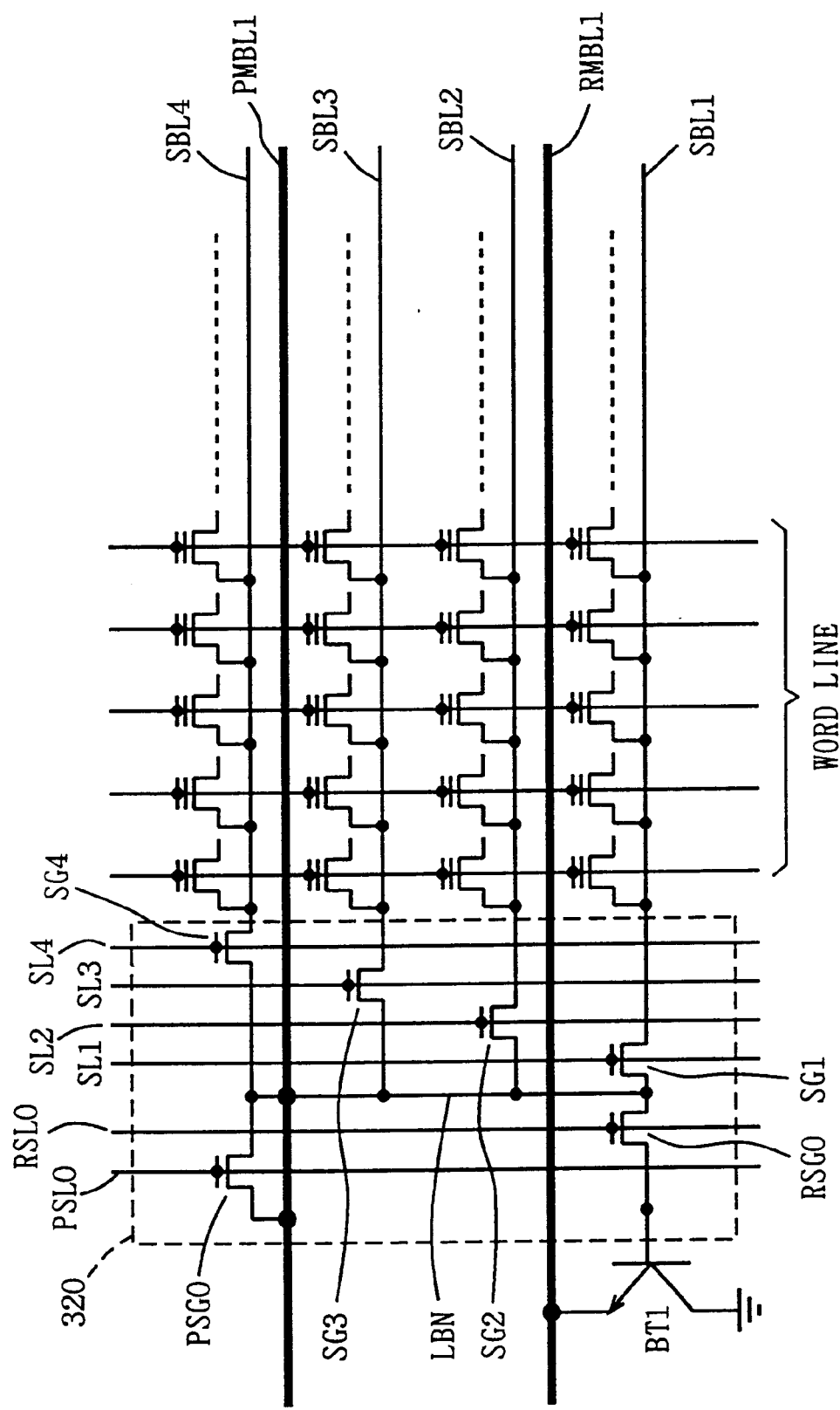
FIG. 26 is a circuit diagram showing the structure of a memory cell block 304 of a nonvolatile semiconductor memory device according to an embodiment 3 of the present invention.

FIG. 26 is a circuit diagram showing the structure of a memory cell block 304 of a nonvolatile semiconductor memory device according to an embodiment 3 of the present invention in comparison with FIG. 2 showing the embodiment 1.

The memory cell block 304 is different in structure from the memory cell block 104 according to the embodiment 1 in a point that a program main bit line PMBL1 is selectively connected with subbit lines SBL1 to SBL4, or a read main bit line RMBL1 is selectively connected with the subbit lines SBL1 to SBL4.

Namely, a switching circuit 320 connects the main bit line PMBL1 or RMBL1 with the subbit lines SBL1 to SBL4 in the memory cell block 304 shown in FIG. 26.

The switching circuit 320 includes an internal block wire LBN provided in common over the subbit lines SBL1 to SBL4 included in the memory cell block 304, a selector gate transistor SG1 provided between the internal block wire LBN and the subbit line SBL1, a selector gate transistor SG2 provided between the internal block wire LBN and the subbit line SBL2, a selector gate transistor SG3 provided between the internal block wire LBN and the subbit line SBL3, and a selector gate transistor SG4 provided between the internal block wire LBN and the subbit line SBL4.

An SG decoder 114 controls the gate potentials of the selector gate transistors SG1 to SG4 through selector lines SL1 to SL4 respectively.

The switching circuit 320 further includes a program selector gate transistor PSG0 provided between the internal block wire LBN and the program main bit line PMBL1 and a read selector gate transistor RSG0 provided between the internal block wire LBN and the read main bit line RMBL1.

The SG decoder 114 controls the gates of the program selector gate transistor PSG0 and the read selector gate transistor RSG0 through a program selector line PSL0 and a read selector line RSL0 respectively.

The remaining points of this structure are similar to those of the structure according to the embodiment 1 shown in FIGS. 1 and 2, and hence identical portions are denoted by the same reference numerals, to omit redundant description.

In the memory cell block 304 according to the embodiment 3, the SG decoder 114 brings the program selector gate transistor PSG0 into a conducting state while bringing any of the selector gate transistors SG1 to SG4 corresponding to a selected column in response to an externally supplied address signal in a program operation.

In a read operation, on the other hand, the SG decoder 114 brings the read selector gate transistor RSG0 into a conducting state, while bringing any of the selector gate transistors SG1 to SG4 corresponding to a selected column.

Due to the aforementioned structure, the program and read operations can be performed similarly to the memory cell block 104 according to the embodiment 1 shown in FIG. 2.

In the structure of the memory cell block 304 according to the embodiment 3, further, the number of the selector lines to be controlled by the SG decoder 114 is reduced from eight to six, and this is effective for high integration.

[Modification of Embodiment 3]

Also in the memory cell block 304 according to the embodiment 3, memory cell transistors may be formed in drain select type two-transistor memory cells or source select type two-transistor memory cells.

Figure 27:
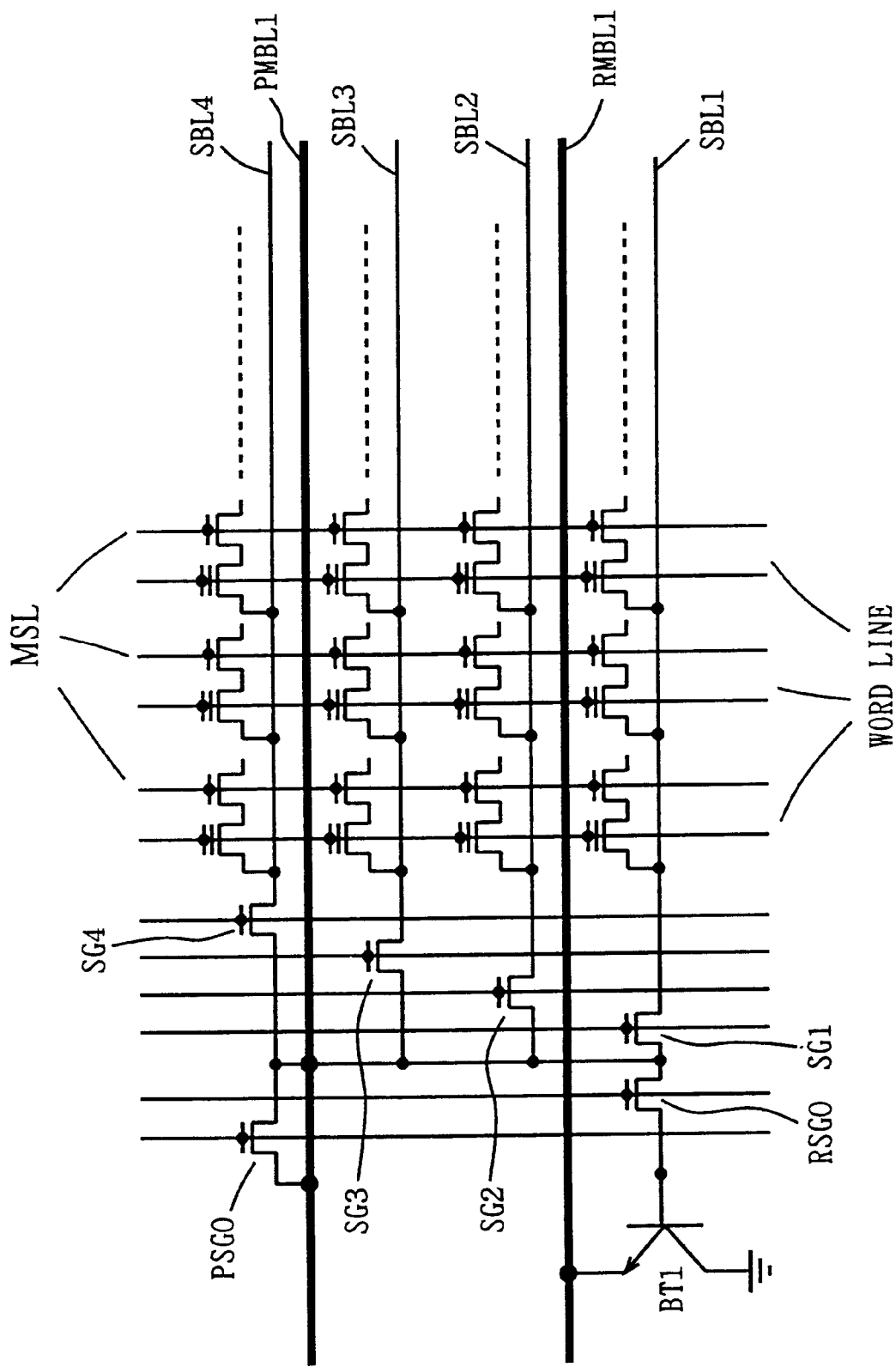
FIG. 27 is a circuit diagram showing a first modification of the embodiment 3 of the present invention.
Figure 28:
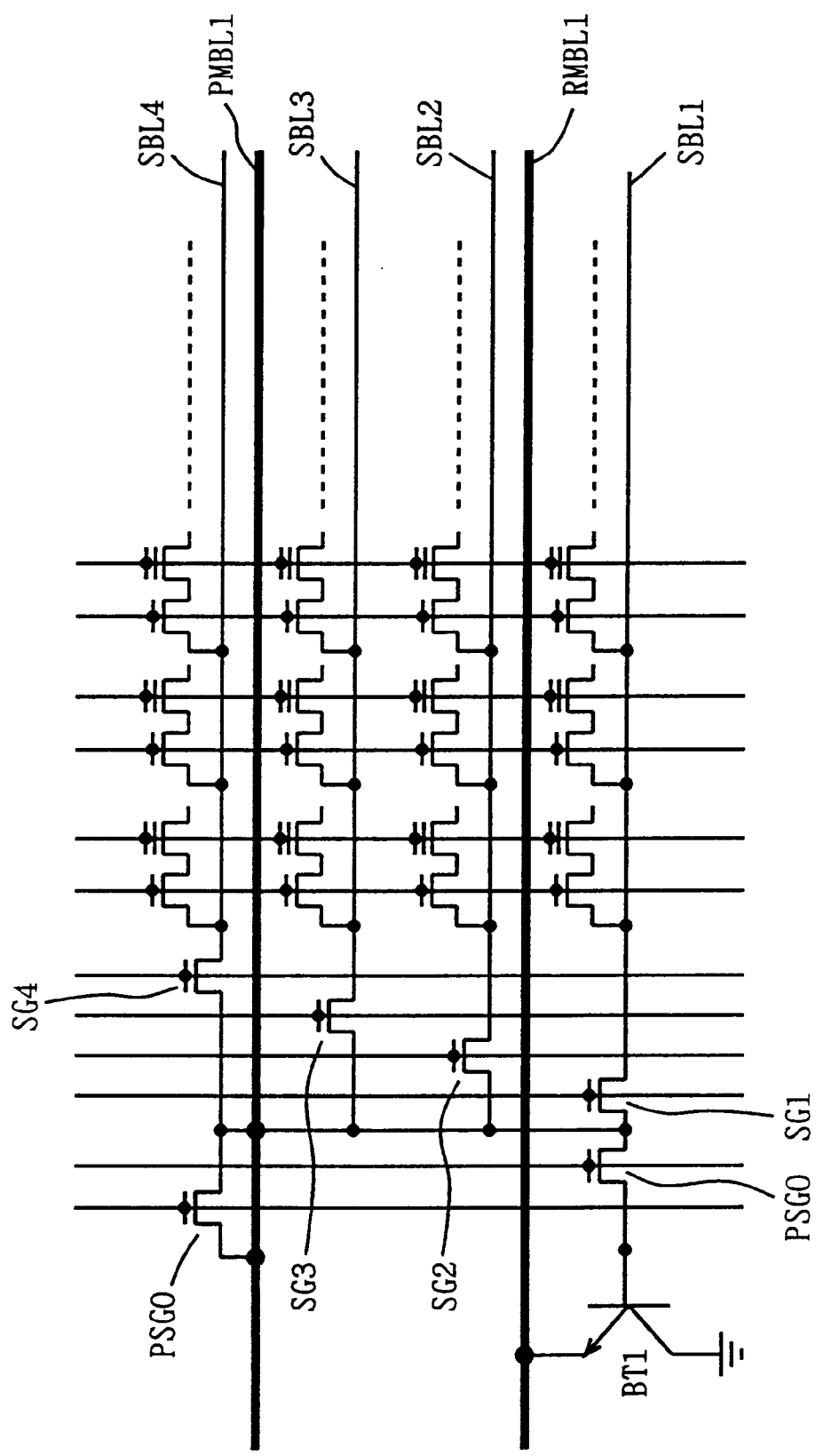
FIG. 28 is a circuit diagram showing a second modification of the embodiment 3 of the present invention.

FIG. 27 shows a modified memory cell block having source select type two-transistor memory cells, and FIG. 28 shows another modified memory cell block having drain select type two-transistor memory cells.

Also according to the structure shown in FIGS. 27 or 28, it is possible to suppress drain disturb and increase the read speed, similar to the embodiment 1.

[Embodiment 4]

Figure 29:
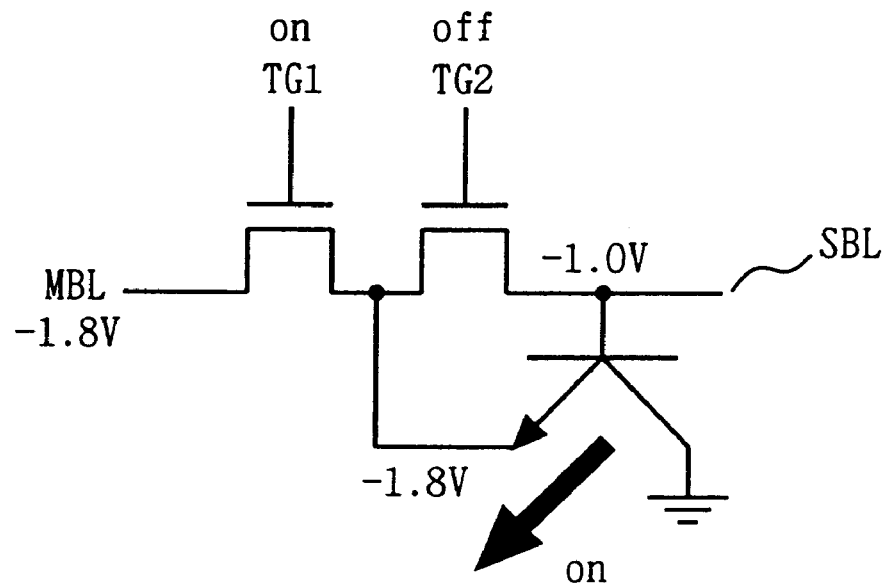
FIG. 29 is a conceptual diagram for illustrating a read operation in a nonvolatile semiconductor memory device according to an embodiment 4 of the present invention.
Figure 30:
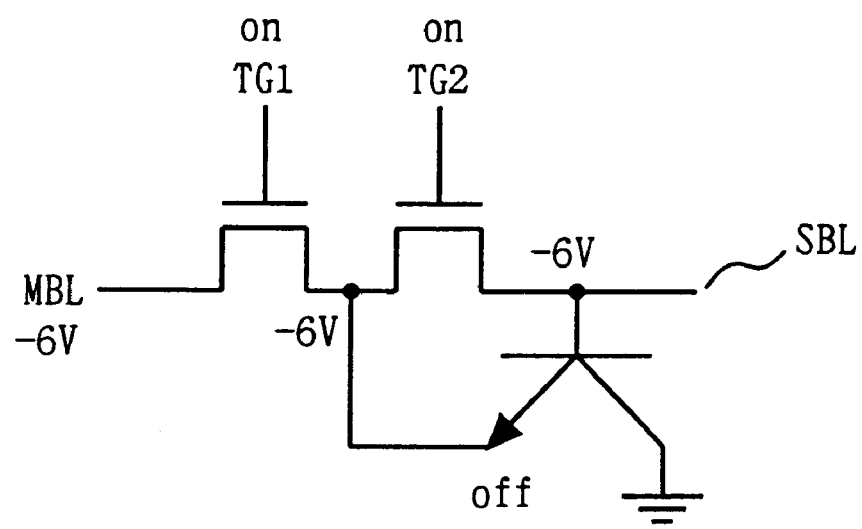
FIG. 30 is a conceptual diagram for illustrating a program operation in the nonvolatile semiconductor memory device according to an embodiment 4 of the present invention.

FIGS. 29 and 30 are conceptual diagrams for illustrating read and program operations in a memory cell block according to an embodiment 4 of the present invention.

FIG. 29 is a conceptual diagram showing an exemplary potential arrangement in relation to a bipolar transistor in the memory cell block according to the embodiment 4.

According to the embodiment 4, gate transistors TG1 and TG2 are serially arranged between a main bit line MBL and a subbit line SBL.

The base of the bipolar transistor is connected to subbit line sides of the serially arranged gate transistors TG1 and TG2. The emitter of the bipolar transistor is connected with a connection node between the two gate transistors TG1 and TG2.

The collector of the bipolar transistor receives the ground potential.

Referring to FIG. 29, the gate transistor TG2 connected between the emitter and the base of the bipolar transistor is brought into a cutoff state.

Consequently, the emitter of the bipolar transistor is connected with the main bit line MBL when the gate transistor TG1 enters a conducting state.

On the other hand, the base of the bipolar transistor is connected to the subbit line sides.

Therefore, when the potential level of the main bit line MBL is set at −1.8 V in a read operation, for example, the emitter of the bipolar transistor is also biased to −1.8 V. At this time, the base of the bipolar transistor is at a potential of −1.0 V, for example, which is higher by a rise voltage of the bipolar transistor.

Consequently, the bipolar transistor amplifies a base current flowing from the subbit line sides to the base, and supplies a current to the main bit line MBL.

Namely, the bipolar transistor amplifies the current flowing to the main bit line MBL with the base current of a channel current from a selected memory cell flowing in the subbit line SBL, similarly to the embodiment 1.

FIG. 30 shows an exemplary potential arrangement in the program operation.

In the program operation, both gate transistors TG1 and TG2 are brought into conducting states.

Therefore, the base and the emitter of the bipolar transistor are shorted, so that the bipolar transistor performs no amplification.

In the program operation, the potential level of the main bit line MBL is held at −6 V, for example. Consequently, the subbit line SBL is also biased at −6 V through the gate transistors TG1 and TG2 formed by N-channel MOS transistors.

Namely, it is possible to transmit a negative potential necessary for programming from the main bit line MBL to the subbit line SBL with no potential difference in a P-N junction part of the bipolar transistor in the program operation.

Figure 31:
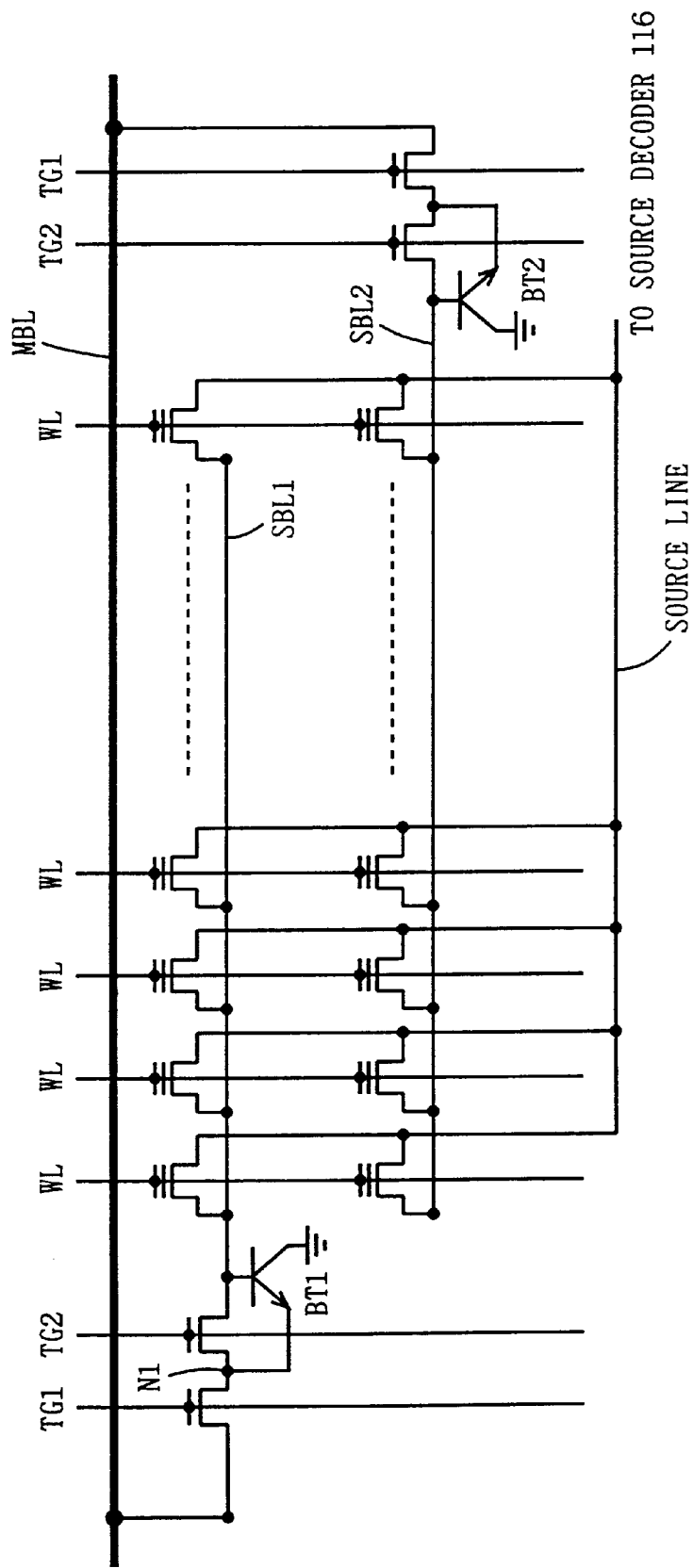
FIG. 31 is a circuit diagram showing the structure of a memory cell block 404 of the nonvolatile semiconductor memory device according to the embodiment 4 of the present invention.

FIG. 31 is a circuit diagram showing the structure of a memory cell block 404 of a nonvolatile semiconductor memory device according to the embodiment 4.

The nonvolatile semiconductor memory device according to the embodiment 4 is similar in structure to the nonvolatile semiconductor memory device 1000 according to the embodiment 1, except the following points.

In the memory cell block 404, single bipolar transistors are arranged for single subbit lines respectively.

Further, the bipolar transistors are alternately arranged on both sides of the subbit lines.

In other words, a bipolar transistor BT1 corresponding to a subbit line SBL1 is provided on one side of the subbit line SBL1, while a bipolar transistor BT2 provided in correspondence to a subbit line SBL2 is provided on a side of the subbit line SBL2 opposite to the bipolar transistor BT1.

Memory cells are one-transistor type ones.

Similarly to the description with reference to FIG. 29 or 30, a gate transistor TG1 is provided between a main bit line MBL and a node N1, and another gate transistor TG2 is provided between the node N1 and the base of the bipolar transistor BT1. The base of the bipolar transistor BT1 is connected with the corresponding subbit line SBL1. This also applies to the subbit line SBL2.

Therefore, a current obtained by amplifying a current flowing in any subbit line by any bipolar transistor flows to the main bit line MBL in the read operation, as described with reference to FIGS. 29 and 30. In the program operation, operations of the bipolar transistors are stopped, and the potential level of the main bit line MBL is transmitted to a selected subbit line SBL.

In the memory cell block 404 according to the embodiment 4, a single main bit line MBL is arranged for each memory cell block 404.

Figure 32:
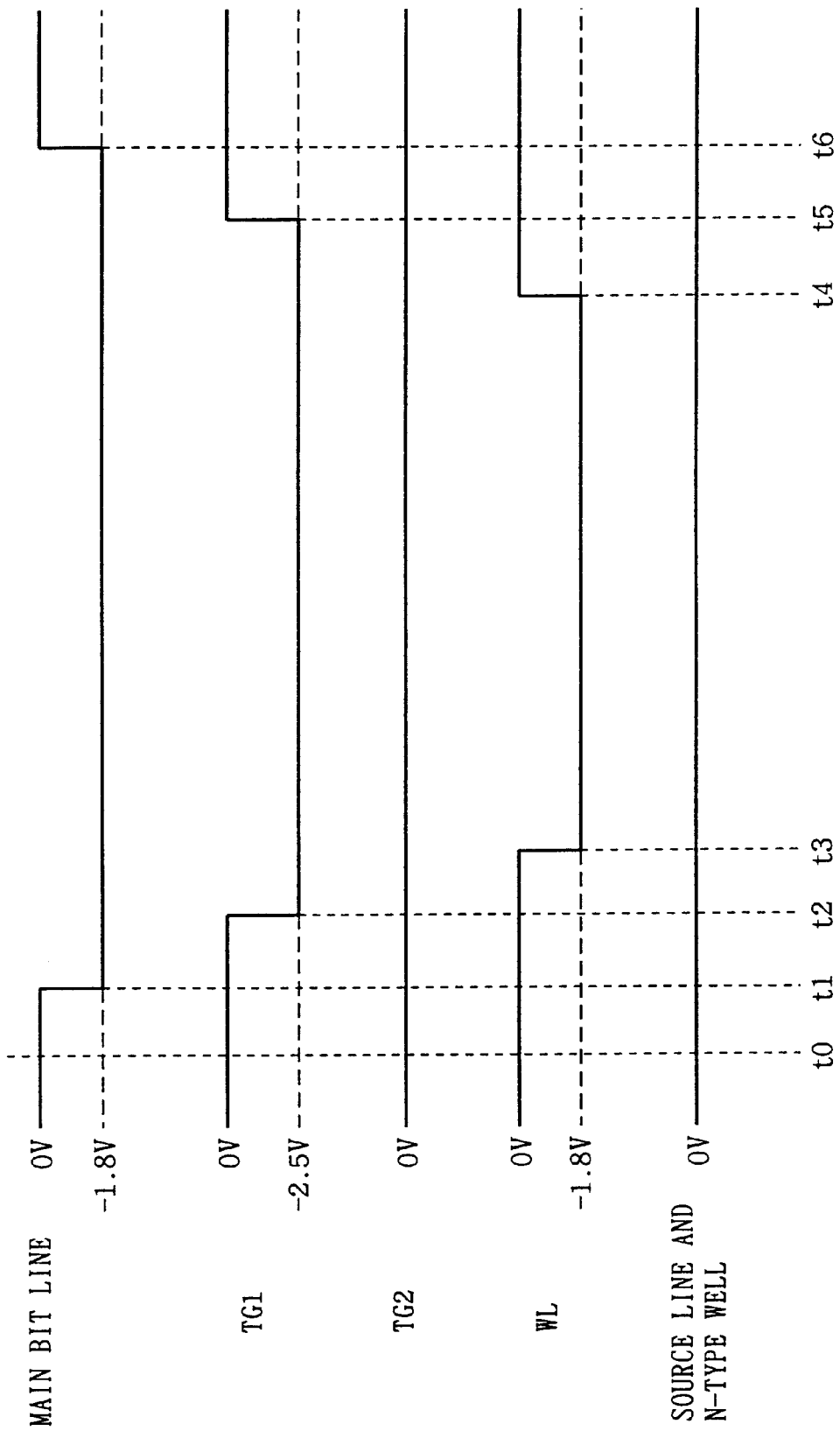
FIG. 32 is a timing chart for illustrating the read operation of the nonvolatile semiconductor memory device according to the embodiment 4 of the present invention.

FIG. 32 is a timing chart for illustrating the read operation for the memory cell block 404 shown in FIG. 31.

It is assumed that the potential level of the main bit line MBL, the gate potentials of the gate transistors TG1 and TG2, the potential level of a word line WL, and the potential levels of a source line SL and an N-type well are 0 V at a time t0 in a standby state.

At a time t1, the potential level of the main bit line MBL changes to −1.8 V.

At a time t2, the gate potential level of the first gate transistor TG1 falls to −2.5 V. Thus, the main bit line MBL is connected with the emitter of the bipolar transistor BT1.

The gate potential level of the first gate transistor TG1 is changed to −2.5 V, since it is necessary to bias the same further to a negative side as compared with the potential level of the main bit line MBL, so that no influence is caused by potential rise of the gate transistor TG1 which is a P-channel transistor.

At a time t3, the potential level of a selected word line WL falls to −1.8 V. Thus, the source line SL supplies a base current to the base of the bipolar transistor BT1 through a selected memory cell in response to data stored therein. In response to this, a sense amplifier 128 detects potential change based on an emitter current of the bipolar transistor BT1 flowing in the main bit line MBL.

At a time t4, the potential level of the word line WL returns to 0 V. At a time t5, the gate potential level of the first gate transistor TG1 returns to 0 V, and that of the main bit line MBL returns to 0 V at a time t6. Thus, the read operation is completed.

Figure 33:
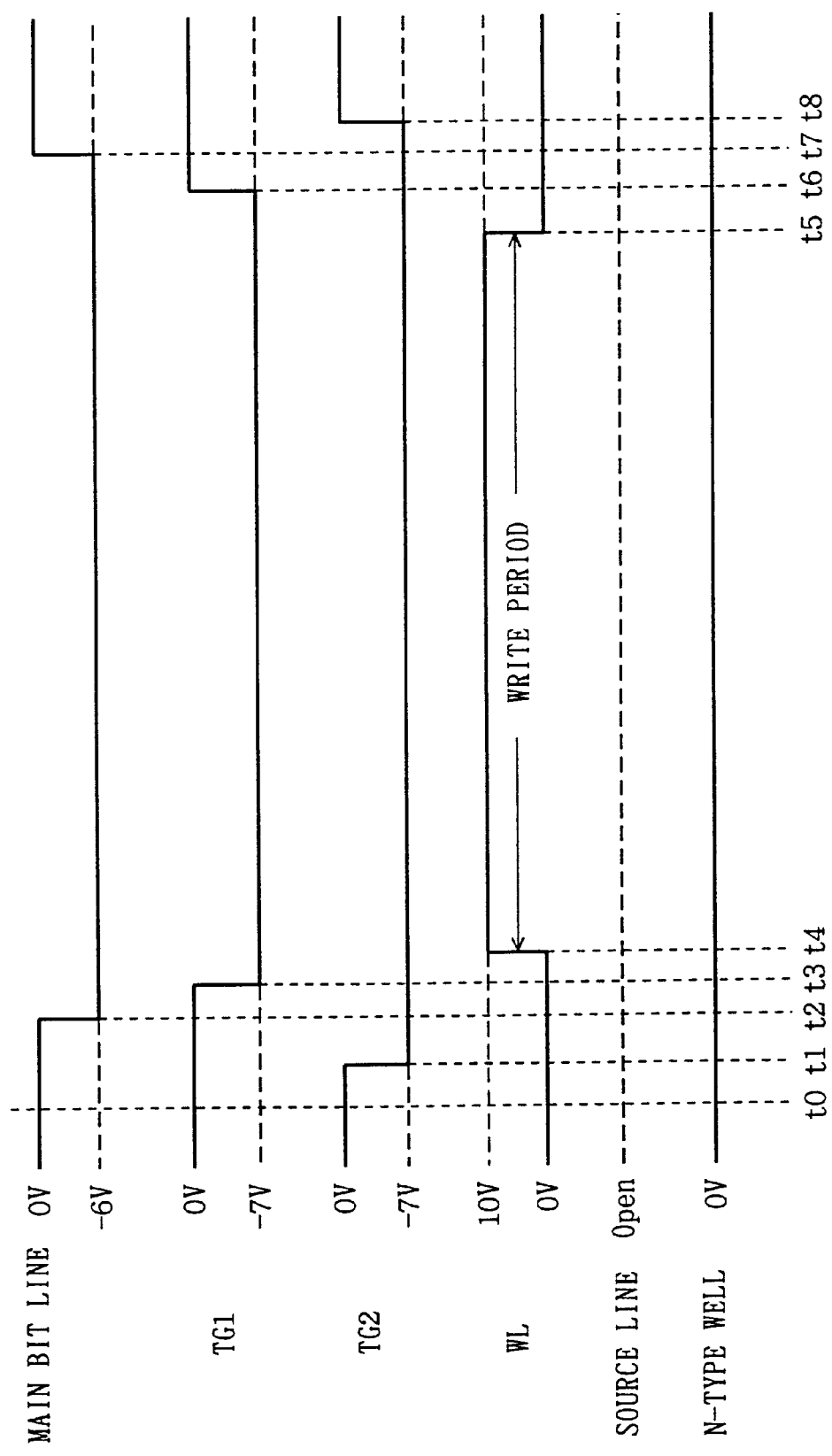
FIG. 33 is a timing chart for illustrating a write operation of the nonvolatile semiconductor memory device according to the embodiment 4 of the present invention.

FIG. 33 is a timing chart for illustrating a write operation for the memory cell block 404 shown in FIG. 31.

From a standby state at a time t0, the gate potential level of the second gate transistor TG2 falls to −7 V at a time t1. In response to this, the emitter and the base of the bipolar transistor BT1 are shorted.

At a time t2, the potential level of the main bit line MBL is set at −6 V.

At a time t3, the potential level of the first gate transistor TG1 also falls to −7 V. In response to this, the potential level of the main bit line MBL is transmitted to a selected subbit line SBL.

The potential level of the first gate transistor TG1 is biased to a negative side as compared with that of the main bit line MBL, in order to avoid influence by voltage rise of the first gate transistor TG1. At a time t4, the potential level of a selected word line WL rises to 10 V.

At this time, the source line SL is in an open state, and the potential level of the N-type well is 0 V.

In response to the change of the potential level of the word line WL to a positive high voltage, electrons are injected into a floating gate of a memory cell transistor, to start the write operation.

Referring to FIG. 33, the potential level of the word line WL is constant at 10 V during the write period, for simplifying the illustration. In practice, the potential level of the word line WL is pulsingly applied during the write period. Further, a verify operation and the like are performed after a plurality of times of pulsing rise of the potential level of the word line WL in practice.

At a time t5, the potential level of the word line WL falls to 0 V.

At a time t6, the potential level of the first gate transistor TG1 rises to 0 V. In response to this, the main bit line MBL and the subbit line SBL are isolated from each other.

At a time t7, the potential level of the main bit line MBL returns to 0 V.

At a time t8, the potential level of the second gate transistor TG2 returns to 0 V. In response to this, the write operation is completed.

Figure 34:
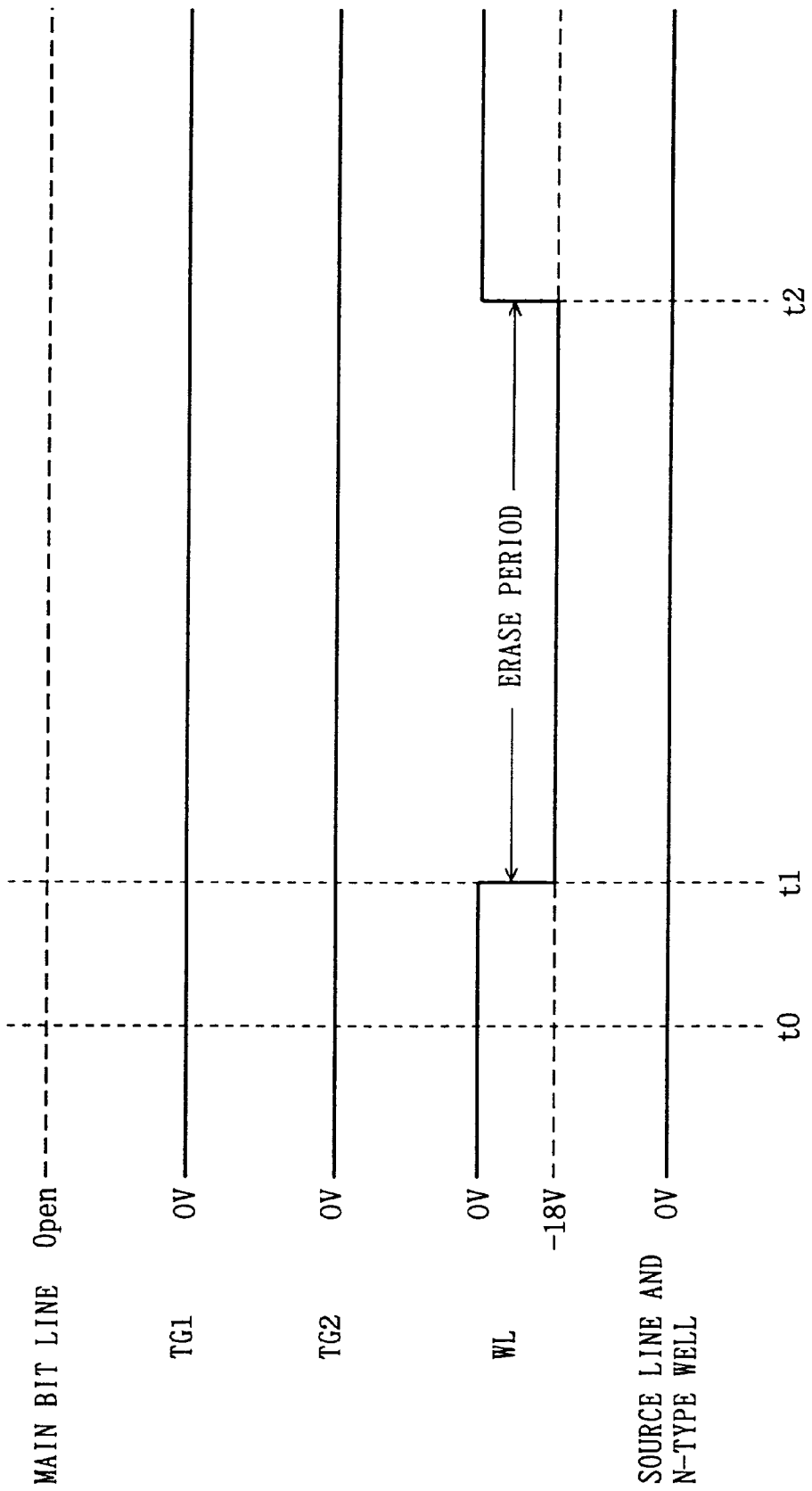
FIG. 34 is a timing chart for illustrating an erase operation of the nonvolatile semiconductor memory device according to the embodiment 4 of the present invention.

The potential level of the second gate transistor TG2 is changed to −7 V in advance of changes of the potential levels of the remaining wires and returns to 0 V after complete potential level changes of the remaining wires, in order to protect the bipolar transistor BT1 by the second gate transistor TG2 entering a conducting state. FIG. 34 is a timing chart for illustrating an erase operation for the memory cell block 404 shown in FIG. 31.

It is assumed that the main bit line MBL is in an open state, and the potential levels of the first and second gate transistors TG1 and TG2, the word line WL, the source line SL and the N-type well are 0 V at a time t0.

At a time t1, only the potential level of the word line WL falls to −18 V.

In response to this, the electrons in the floating gate are injected into the substrate side, for erasing written data.

At a time t2, the potential level of the word line WL returns to 0 V, to complete the erase operation.

When the memory cell block 404 is arranged in one of split wells, it is also possible to reduce the absolute value of the negative potential applied to the word line WL by controlling only the potential of the well provided with the memory cell block 404.

Due to the aforementioned operations, the read, write and erase operations for the memory cell block 404 shown in FIG. 31 are performed.

Figure 35:
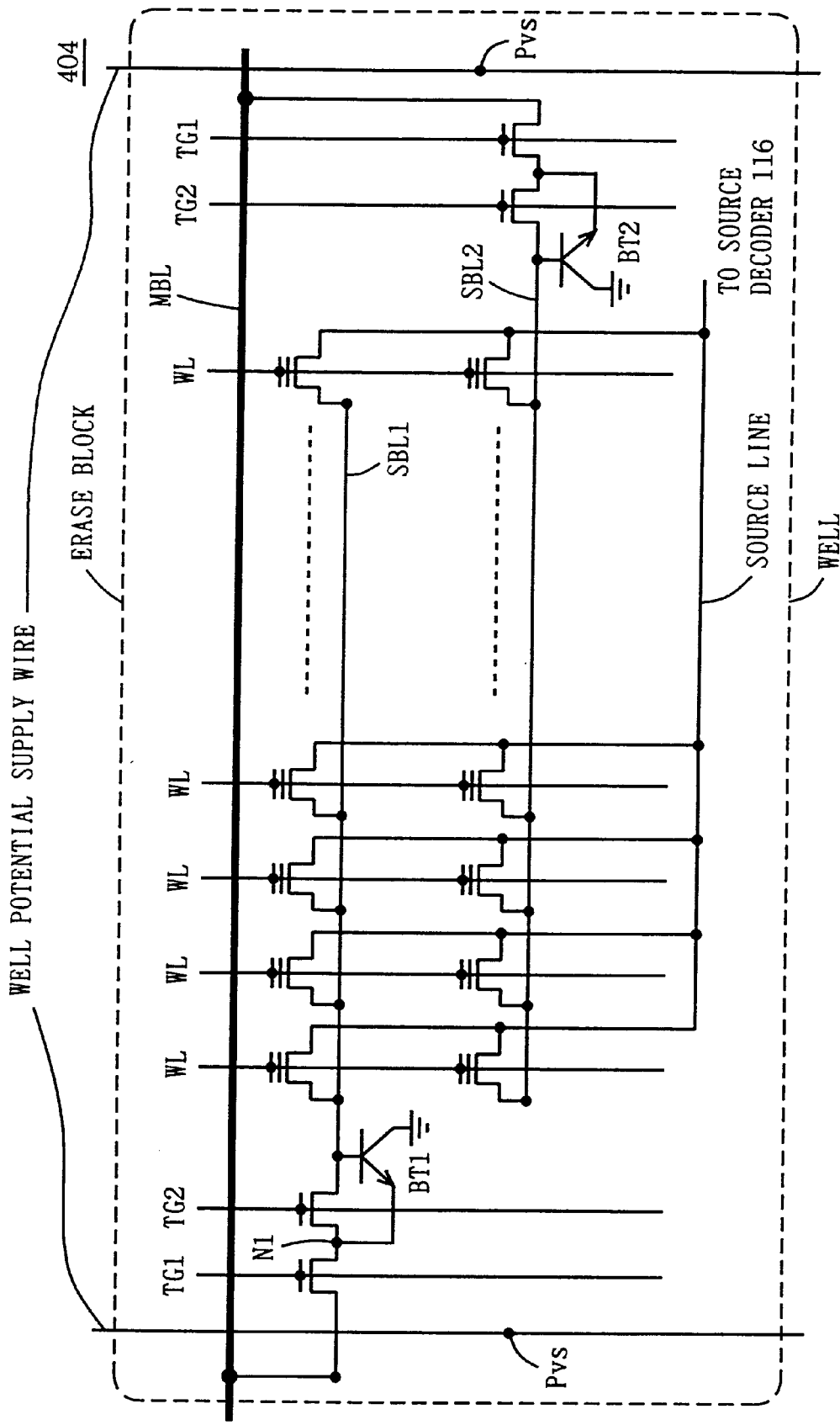
FIG. 35 is a circuit diagram showing the arrangement of well potential supply wires in the nonvolatile semiconductor memory device.

FIG. 35 is a schematic block diagram showing the structure of well potential supply wires for supplying a potential to a well from the well potential generation circuit 120 in the structure of the memory cell array 104 shown in FIG. 1.

It is assumed that the memory cell array shown in FIG. 35 is present in the same erase block 1 in case of performing an erase operation.

Namely, it is assumed that FIG. 35 shows the memory cell array which is present in the same well in case of splitting a well in response to each erase block.

The example shown in FIG. 35 indicates that at least two wires supplied with the well potential from the well potential generation circuit 120 are present in the same erase block.

The well potential supply wires are adapted to supply the ground potential or a positive high voltage to an N-type well, and in contact with the N-type well at feeder points Pvs.

The bipolar transistor BT1 having an emitter region in the source region of the memory cell transistor has a collector region defined by the well region, and hence the potential level supplied by the well potential supply wires remarkably influences on operations of the bipolar transistor BT1.

If only a single well potential supply wire is present in the erase block, for example, collector resistance is effectively increased in a bipolar transistor separated from the contact position between the well potential supply wire and the well surface.

Thus, there is such a possibility that saturation characteristics of this bipolar transistor are deteriorated to cause difficulty in normal read operation.

Thus, it is possible to reduce such saturation of the bipolar transistor by arranging a plurality of well potential supply wires in the erase block as shown in FIG. 35.

[Modification of Embodiment 4]

Figure 36:
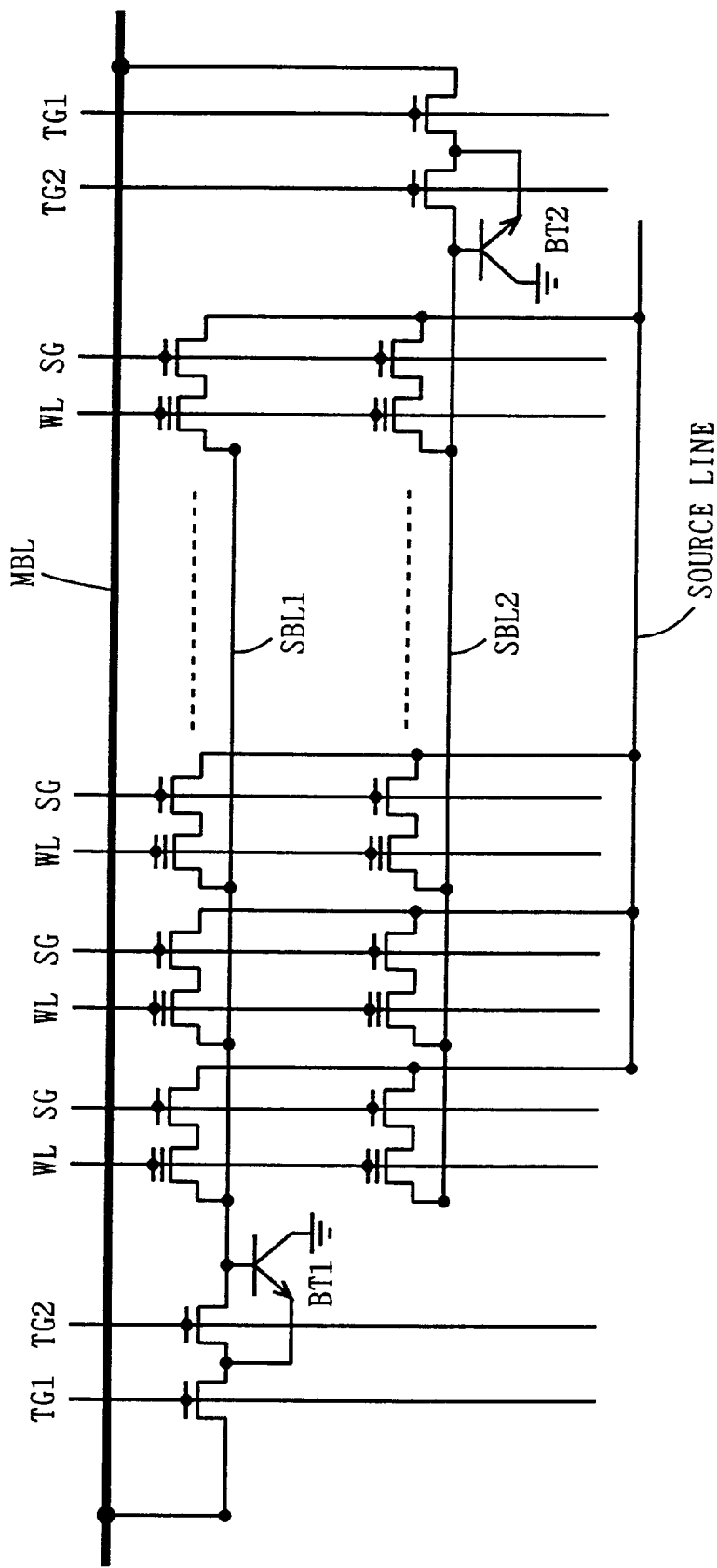
FIG. 36 is a circuit diagram showing a modification of the embodiment 4 of the present invention.

FIG. 36 is a circuit diagram showing a modification of the structure of the memory cell block 404 shown in FIG. 31.

This modification is different in structure from that of the memory cell block 404 shown in FIG. 31 in a point that each memory cell is a source select type two-transistor memory cell.

Namely, cell selector lines SG are arranged for the respective memory cells, in addition to word lines WL.

In the example shown in FIG. 36, a cell selector line SG corresponding to a selected memory cell is activated, for bringing a cell selector transistor of the corresponding memory cell into a conducting state.

The remaining points of this modification are similar to those of the memory cell block 404 shown in FIG. 31, and hence redundant description is omitted.

The structure shown in FIG. 36 attains effects similar to those of the modification of the embodiment 1.

The memory cells may be replaced with drain select type two-transistor memory cells.

Also in this case, effects similar to those of the modification of the embodiment 1 are attained.

[Embodiment 5]

Figure 37:
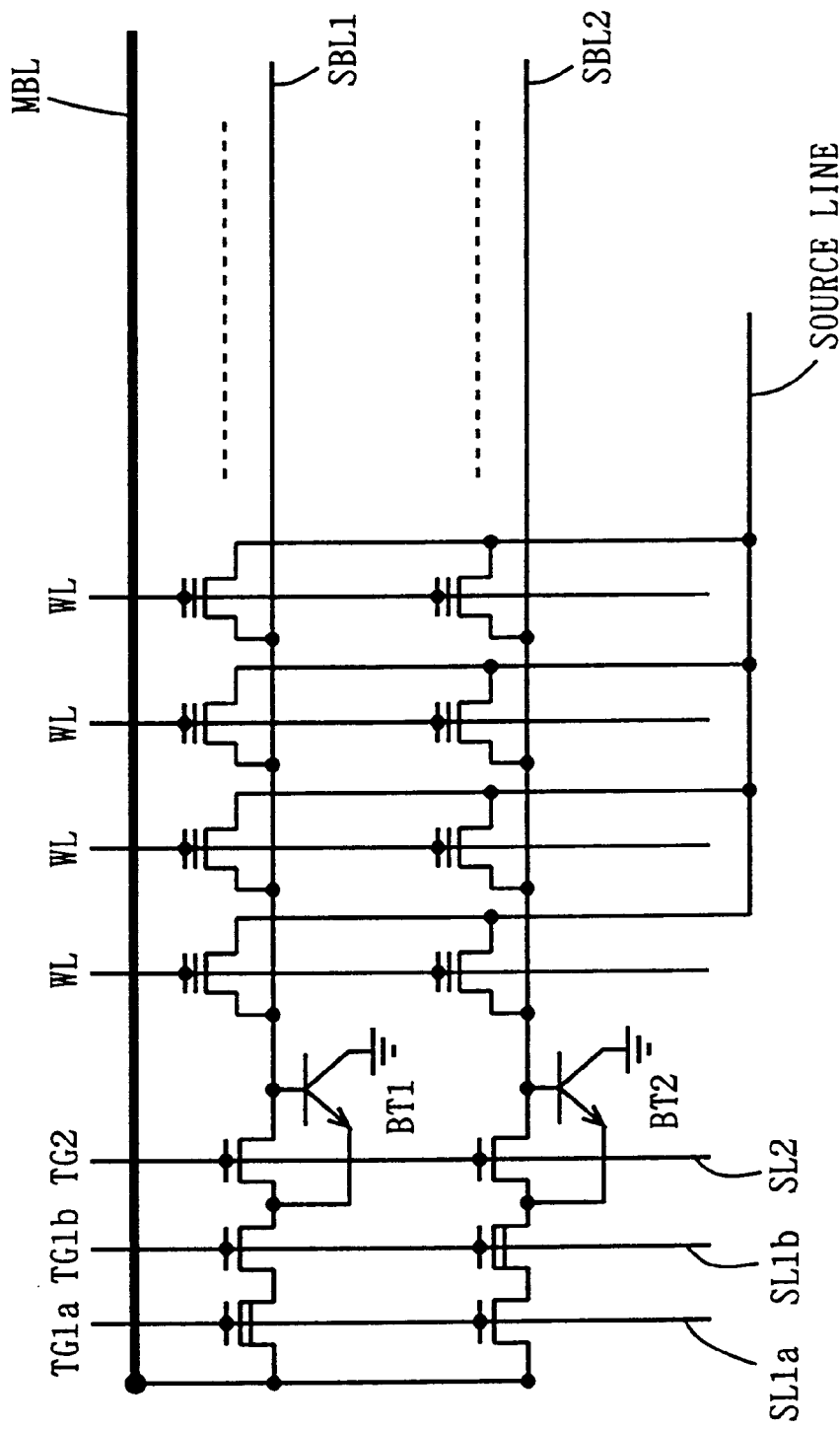
FIG. 37 is a circuit diagram showing a memory cell block 504 of a nonvolatile semiconductor memory device according to an embodiment 5 of the present invention.

FIG. 37 is a circuit diagram showing the structure of a memory cell block 504 in a nonvolatile semiconductor memory device according to an embodiment 5 of the present invention.

The memory cell block 504 is different from the memory cell block 404 according to the embodiment 4 in the following points:

In the memory cell block 404 according to the embodiment 4, bipolar transistors are arranged for the respective subbit lines to be capable of shorting bases and emitters independently of each other.

However, only a single main bit line is arranged for memory cells included in a single memory cell block, and hence write, erase and read operations are not simultaneously performed. Therefore, the emitters and the bases of the bipolar transistors included in a single memory cell block can be simultaneously shorted.

Referring to FIG. 37, a second gate transistor TG2 controlled by a selector line SL2 in common shorts emitters and bases of bipolar transistors BT1 and BT2 provided in correspondence to subbit lines SBL1 and SBL2.

An SG decoder 114 controls the selector line SL2. In the memory cell block 504 according to the embodiment 5, further, gate transistors TG1a and TG1b are further connected in series with the second gate transistor TG2 for shorting the emitters and the bases of the bipolar transistors BT1 and BT2 between the bases of the bipolar transistors BT1 and BT2 and a corresponding main bit line MBL.

27

The SG decoder 114 controls the gate potential of the gate transistor TG1*a* through a selector line SL1*a*.

The SG decoder 114 also controls the gate potential of the gate transistor TG1*b* through a selector line SL1*b*.

The gate transistor TG1*a* corresponding to the subbit line SBL1 is a depression-mode transistor, and the gate transistor TG1*b* corresponding to the subbit line SBL1 is an enhancement-mode transistor.

On the other hand, the gate transistor TG1*a* corresponding to the subbit line SBL2 is an enhancement-mode transistor, and the gate transistor TG1*b* corresponding to the subbit line SBL2 is a depression-mode transistor.

The gate transistors TG1*a* and TG1*b* corresponding to the subbit lines SBL1 and SBL2 respectively have different operation modes (enhancement and depression modes), whereby a plane pattern for forming the gate transistors TG1*a* and TG1*b* can be simplified, as hereinafter described.

Figure 38:
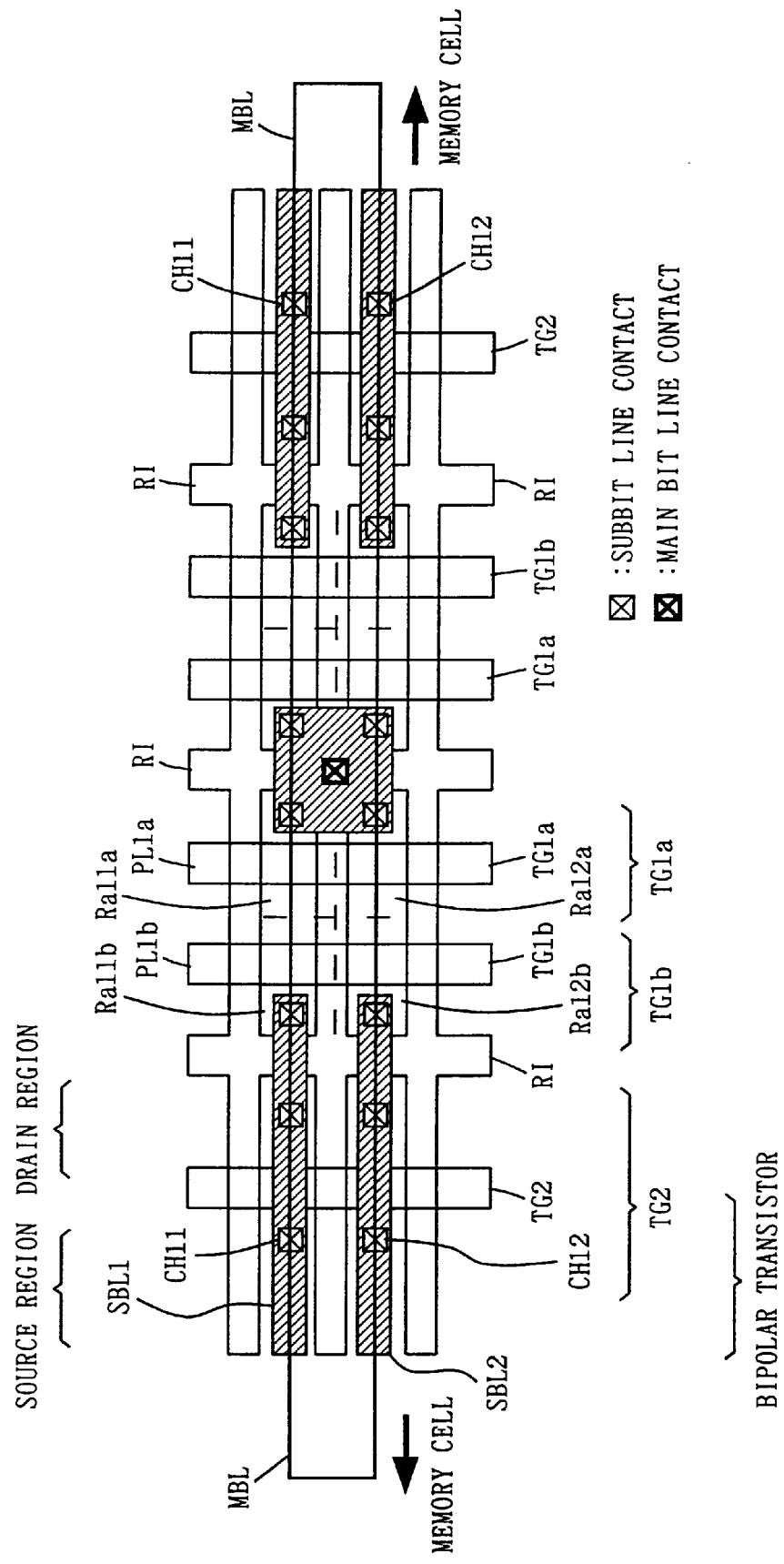
FIG. 38 is a plan view showing the pattern of the memory cell block 504 shown in FIG. 37.

FIG. 38 illustrates the plane pattern of a part related to the gate transistors TG1*a*, TG1*b* and TG2 in the structure of the circuit diagram shown in FIG. 37.

Referring to FIG. 38, it is assumed that the bit lines SBL1 and SBL2 are formed by a first aluminum alloy wire. Emitters of the bipolar transistors BT1 and BT2 are formed in portions of contact holes CH11 and CH12 for bringing the source region of the gate transistor TG2 into contact with the bit lines SBL1 and SBL2 respectively.

The P-type source region of the gate transistor TG2 also defines base regions of the bipolar transistors BT1 and BT2. When the gate transistor TG2 enters a conducting state, therefore, the bit lines SBL1 and SBL2 are connected with the bases of the bipolar transistors BT1 and BT2 through the channel of the gate transistor TG2. Namely, the emitters and the bases of the bipolar transistors BT1 and BT2 are shorted.

The gate transistors TG1*a* and TG1*b* are formed in active regions Ra11*a*, Ra11*b*, Ra12*a* and Ra12*b* enclosed with isolation regions RI. At the time of impurity injection for adjusting the threshold voltages of the gate transistors TG1*a* and TG1*b*, impurities are ion-implanted in adjusted quantities so that these regions define depression- and enhancement-mode transistors.

Therefore, the impurity concentrations are so adjusted that the active regions Ra11*a* and Ra11*b* are of depression and enhancement modes respectively, for example. Gate electrodes PL1*a* and PL1*b* of the gate transistors TG1*a* and TG1*b* corresponding to the subbit line SBL1 are formed on these regions Ra11*a* and Ra11*b*, thereby implementing the circuit structure shown in FIG. 37 as a plane pattern.

Due to the structure shown in FIG. 38, the emitters and the bases of the bipolar transistors BT1 and BT2 may not be shorted by wires, whereby no contact may be formed in diffusion regions of the gate transistors TG1*a* and TG1*b*, which in turn can be formed in a smaller area.

In the example shown in FIG. 38, the drain region of the gate transistor TG1*a* is connected with a third aluminum alloy wire, i.e., the main bit line MBL, through the first aluminum alloy wire.

[Modification of Embodiment 5]

Figure 39:
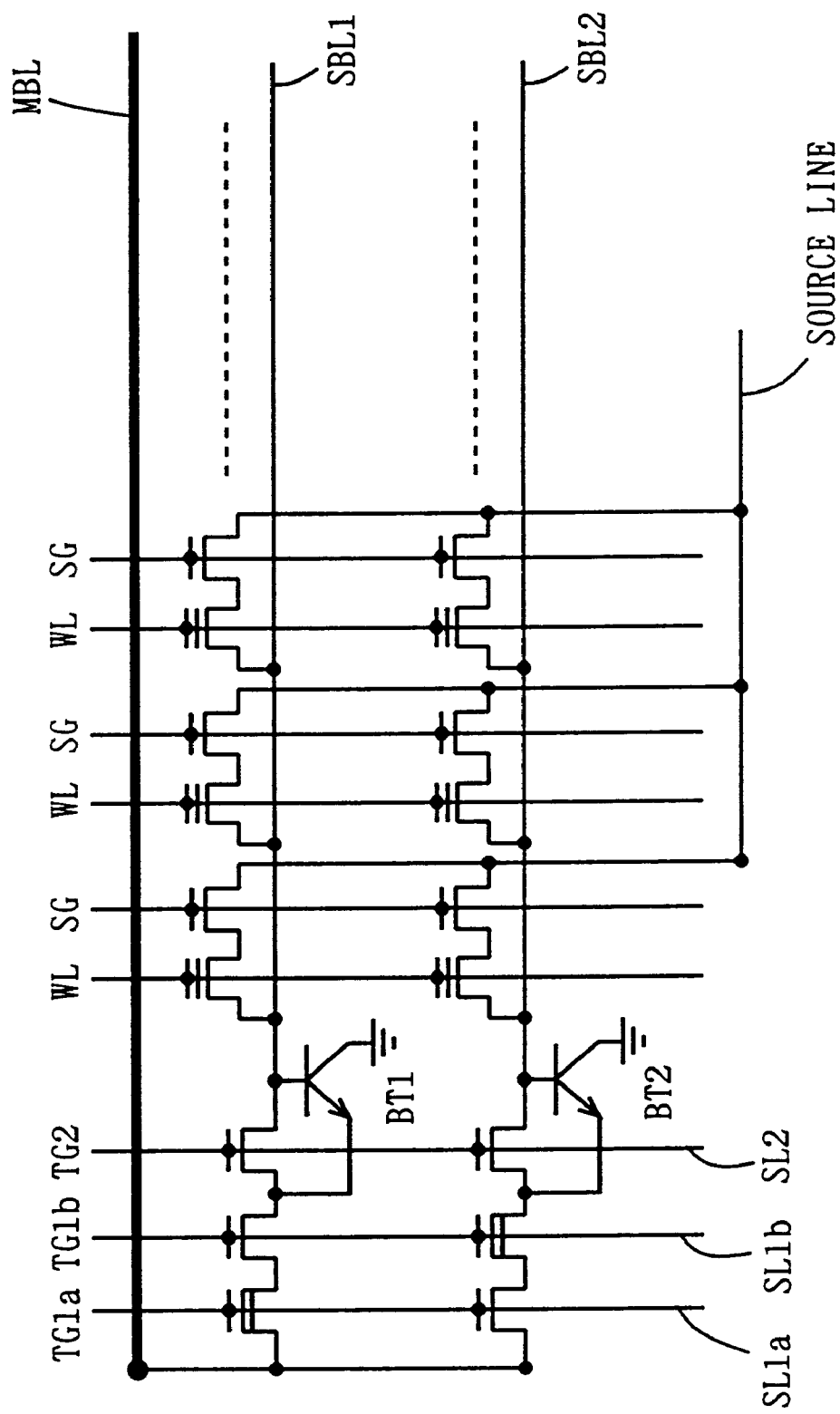
FIG. 39 is a circuit diagram showing a modification of the embodiment 5 of the present invention.

FIG. 39 is a circuit diagram showing a modification of the embodiment 5.

This modification is different in circuit structure from the embodiment 5 shown in FIG. 37 in a point that memory cells are source select type two-transistor memory cells.

Also in this case, the memory cells may be replaced with drain select type two-transistor memory cells, similarly to the embodiment 1.

Effects similar to those of the embodiment 1 can be attained whether the memory cells are source or drain select type ones.

[Embodiment 6]

Figure 40:
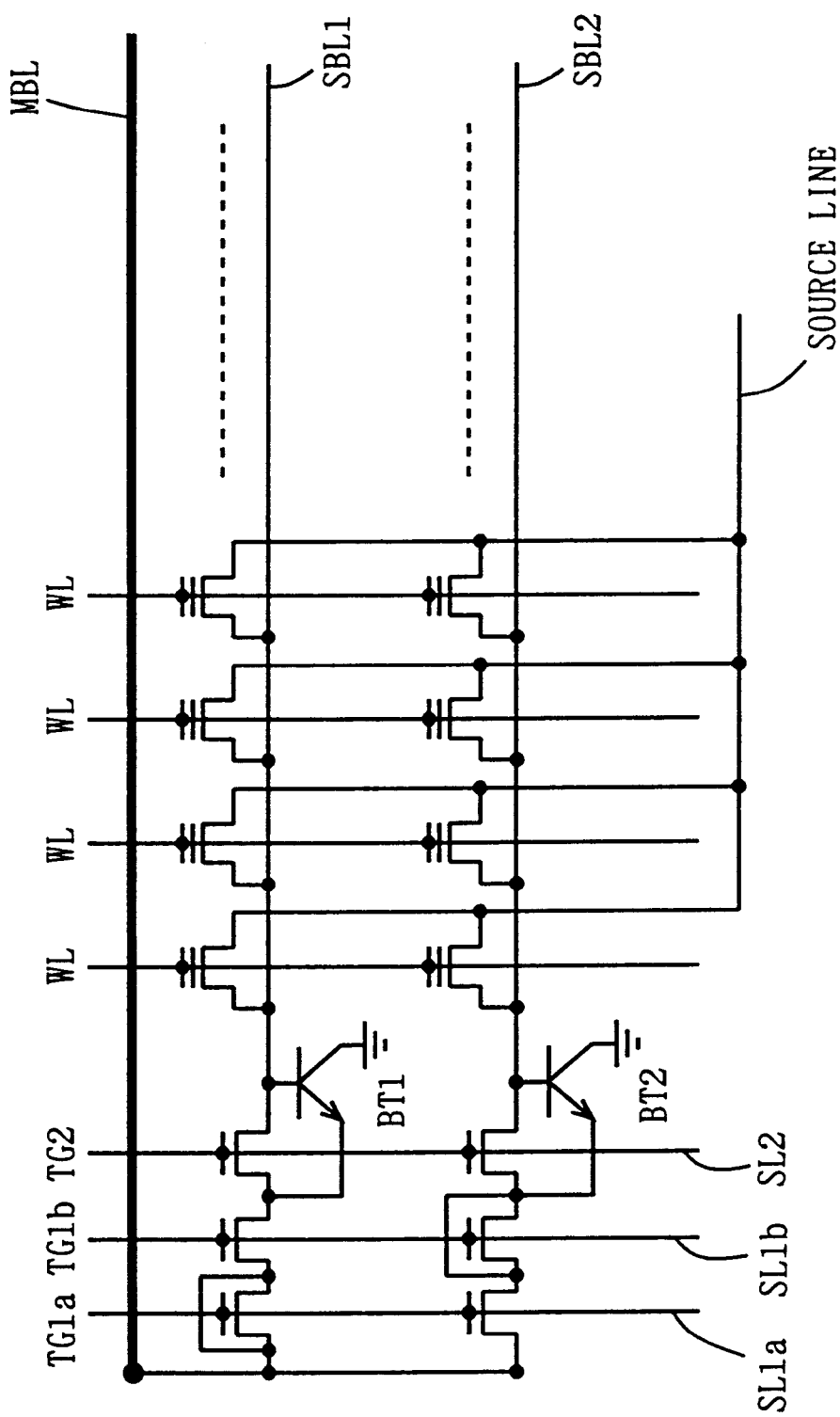
FIG. 40 is a circuit diagram showing the structure of a memory cell block 604 of a nonvolatile semiconductor memory device according to an embodiment 6 of the present invention.

FIG. 40 is a circuit diagram showing the structure of a memory cell block 604 of a nonvolatile semiconductor memory device according to an embodiment 6 of the present invention.

This memory cell block 604 is different in structure from the memory cell block 504 according to the embodiment 5 in the following point:

In the memory cell block 604 according to the embodiment 6, the source and the drain of a gate transistor TG1*a* is shorted by a wire, dissimilarly to the gate transistor TG1*a* of the embodiment 5 formed by a depression-mode transistor.

The remaining points of this embodiment are similar to those of the embodiment 5 shown in FIG. 37, and identical portions are denoted by the same reference numerals, to omit redundant description.

An advantage of the structure shown in FIG. 40 is now described with reference to its plane pattern.

Figure 41:
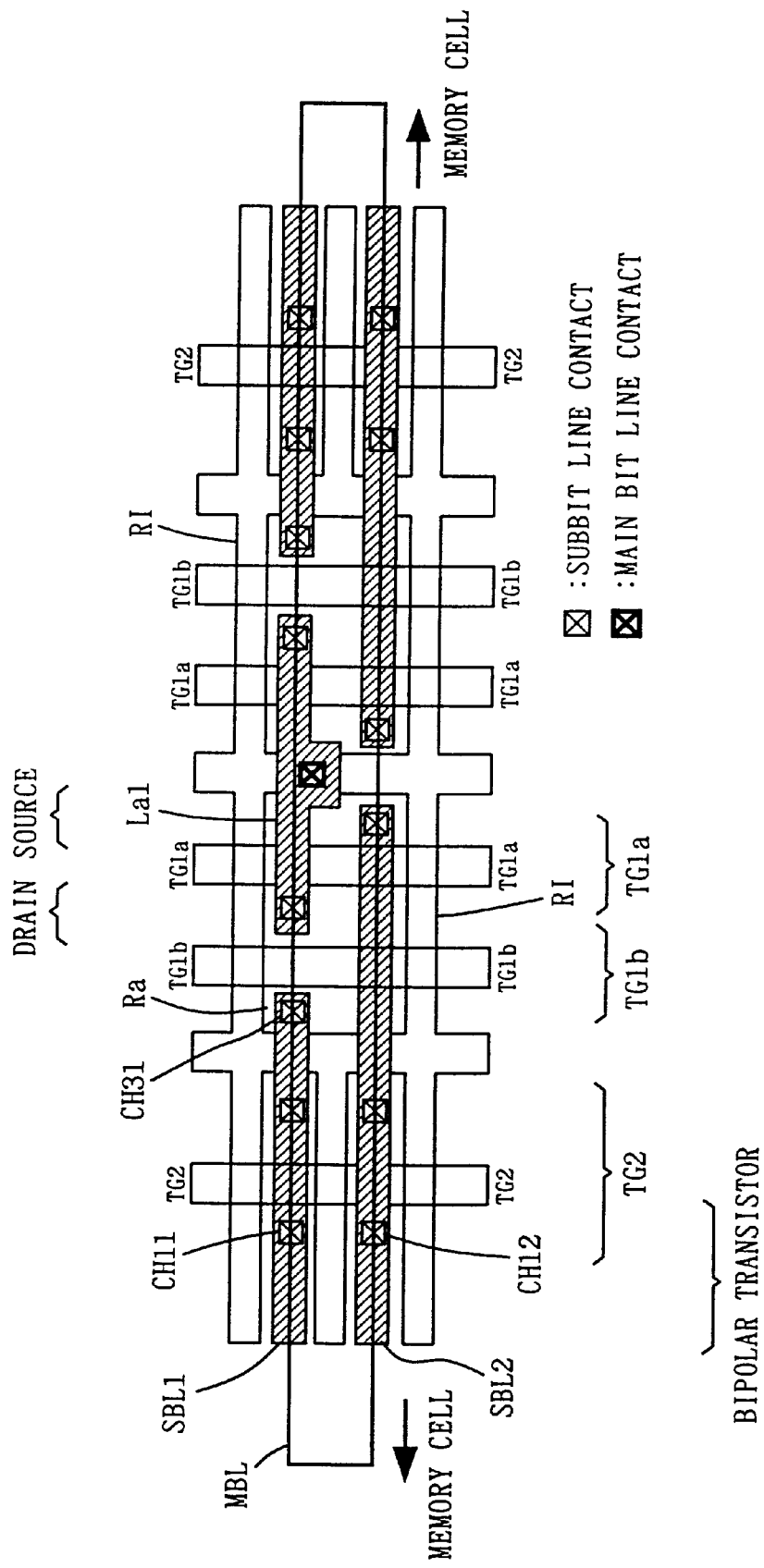
FIG. 41 is a pattern diagram showing a first plane pattern of the memory cell block 604 according to the embodiment 6 of the present invention.

FIG. 41 illustrates a plane pattern for implementing the circuit diagram shown in FIG. 40.

Referring to FIG. 41, the gate transistors TG1*a* and TG1*b* are formed in an active region having a homogeneous impurity concentration, which is enclosed with isolation regions RI.

Referring to FIG. 41, a subbit line SBL1 is connected with the source region of the gate transistor TG1*b* through a contact hole CH31, and the drain region of the gate transistor TG1*b* is connected with a main bit line MBL through a wire La1 which is a first aluminum alloy wire, for example. Therefore, the subbit line SBL1 is in the circuit structure shown in FIG. 40. A contact hole CH11 connecting the subbit line SBL1 with the source region of a gate transistor TG2 defines an emitter region of a bipolar transistor, similarly to the structure shown in FIG. 38.

A subbit line SBL2 is connected with the source of the gate transistor TG1*a* through a contact hole CH12. When the gate transistor TG1*a* enters a conducting state, therefore, the subbit line SBL2 is connected with the wire La1 through the gate transistor TG1*a*, as well as with the main bit line MBL.

Thus, this plane pattern implements the circuit structure shown in FIG. 40. The plane pattern shown in FIG. 41 has the following advantages:

The gate widths of the gate transistors TG1*a* and TG1*b* can be set at values corresponding to two pitches of the subbit lines SBL1 and SBL2.

Therefore, On-state resistance values of the gate transistors TG1*a* and TG1*b* can be reduced.

Figure 42:
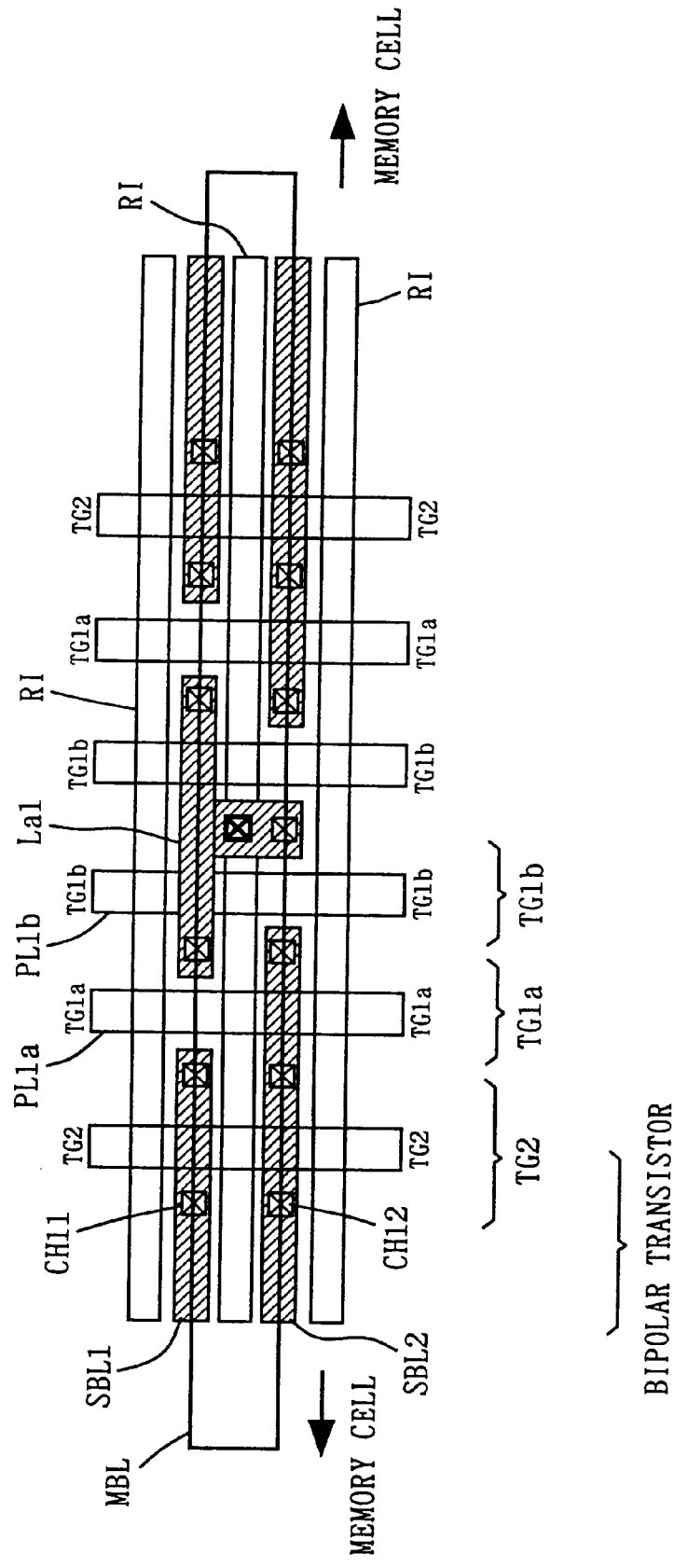
FIG. 42 is a pattern diagram showing a second plane pattern of the memory cell block 604 according to the embodiment 6 of the present invention.

FIG. 42 illustrates another exemplary plane pattern for implementing the circuit structure shown in FIG. 40.

This plane pattern is different from that shown in FIG. 41 in a point that isolation regions are provided between gate transistors TG1*a* and TG1*b* corresponding to a first subbit line SBL1 and gate transistors TG1*a* and TG1*b* corresponding to a second subbit line SBL2.

In the plane pattern shown in FIG. 42, therefore, the gate widths of the gate transistors TG1*a* and TG1*b* correspond to one pitch of the subbit lines SBL1 and SBL2.

Due to this structure, no isolation region is required between the gate transistors TG1*a* and TG2.

Further, no isolation region is required between the gate transistors TG1*b* corresponding to the subbit lines SBL1 and SBL2 belonging to an adjacent pair of memory blocks.

As compared with the plane pattern shown in FIG. 41, therefore, the pattern can advantageously be formed in a smaller area in the bit line direction.

[Modification of Embodiment 6]

Figure 43:
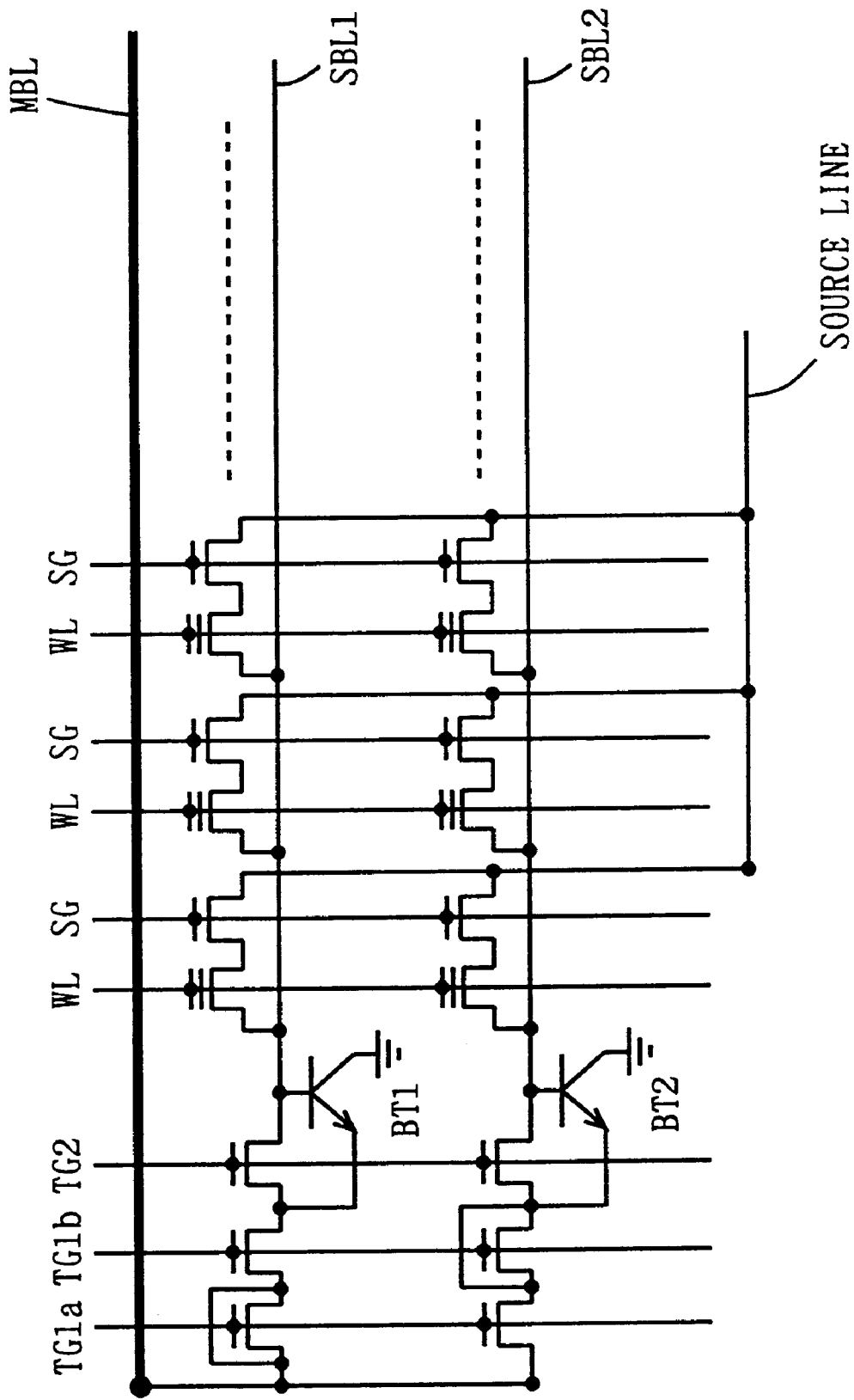
FIG. 43 is a circuit diagram showing a modification of the embodiment 6 of the present invention.

FIG. 43 is a circuit diagram showing the structure of a modification of the embodiment 6 shown in FIG. 40.

This structure is different from that shown in FIG. 40 in a point that memory cells are source select type two-transistor memory cells.

These memory cells may be replaced with drain select type two-transistor memory cells.

Effects similar to those of the modification of the embodiment 1 can be attained also by this structure.

[Embodiment 7]

Figure 44:
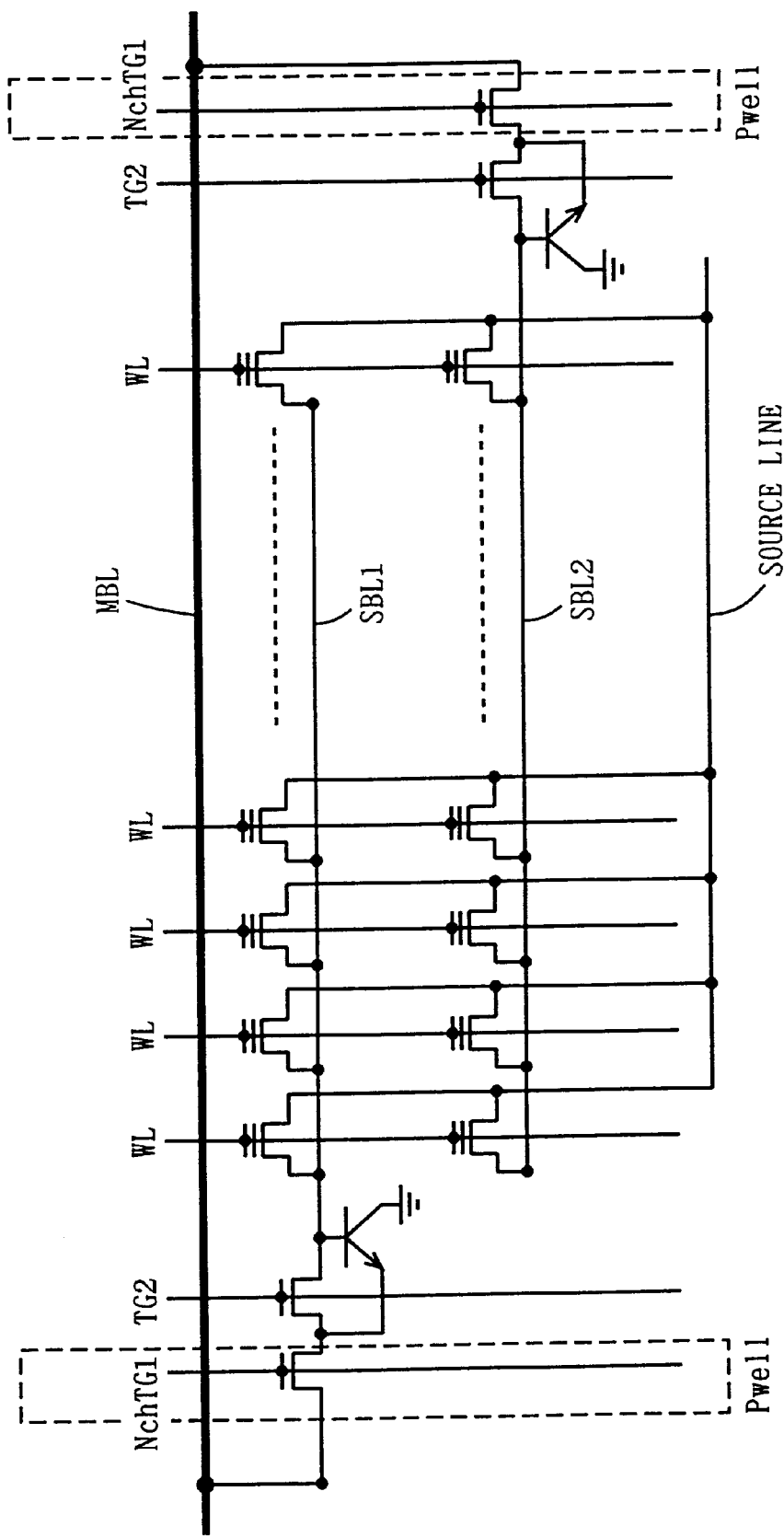
FIG. 44 is a circuit diagram showing the structure of a memory cell block 704 of a nonvolatile semiconductor memory device according to an embodiment 7 of the present invention.

FIG. 44 is a circuit diagram showing the structure of a memory cell block 704 of a nonvolatile semiconductor memory device according to an embodiment 7 of the present invention.

This structure is different from that of the memory cell block 404 according to the embodiment 4 shown in FIG. 31 in the following point:

In the memory cell block 404 according to the embodiment 4, the first gate transistors TG1 are P-channel MOS transistors.

In the memory cell block 704 according to the embodiment 7 shown in FIG. 44, on the other hand, first gate transistors TG1 are N-channel MOS transistors formed in a P-type well.

The remaining points of this embodiment are similar to those of the memory cell block 404 according to the embodiment 4 shown in FIG. 31, and hence identical portions are denoted by the same reference numerals, to omit redundant description.

It is possible to avoid influence by potential rise of the first gate transistors TG1 by the threshold voltage, by preparing the same from N-channel MOS transistors.

In a read operation, for example, a main bit line MBL is set at a negative potential (e.g., −1.8 V). Therefore, it is possible to reduce the absolute value of a potential applied to the gates of the first gate transistors TG1 in the read operation by preparing the same from N-channel MOS transistors.

Figure 45:
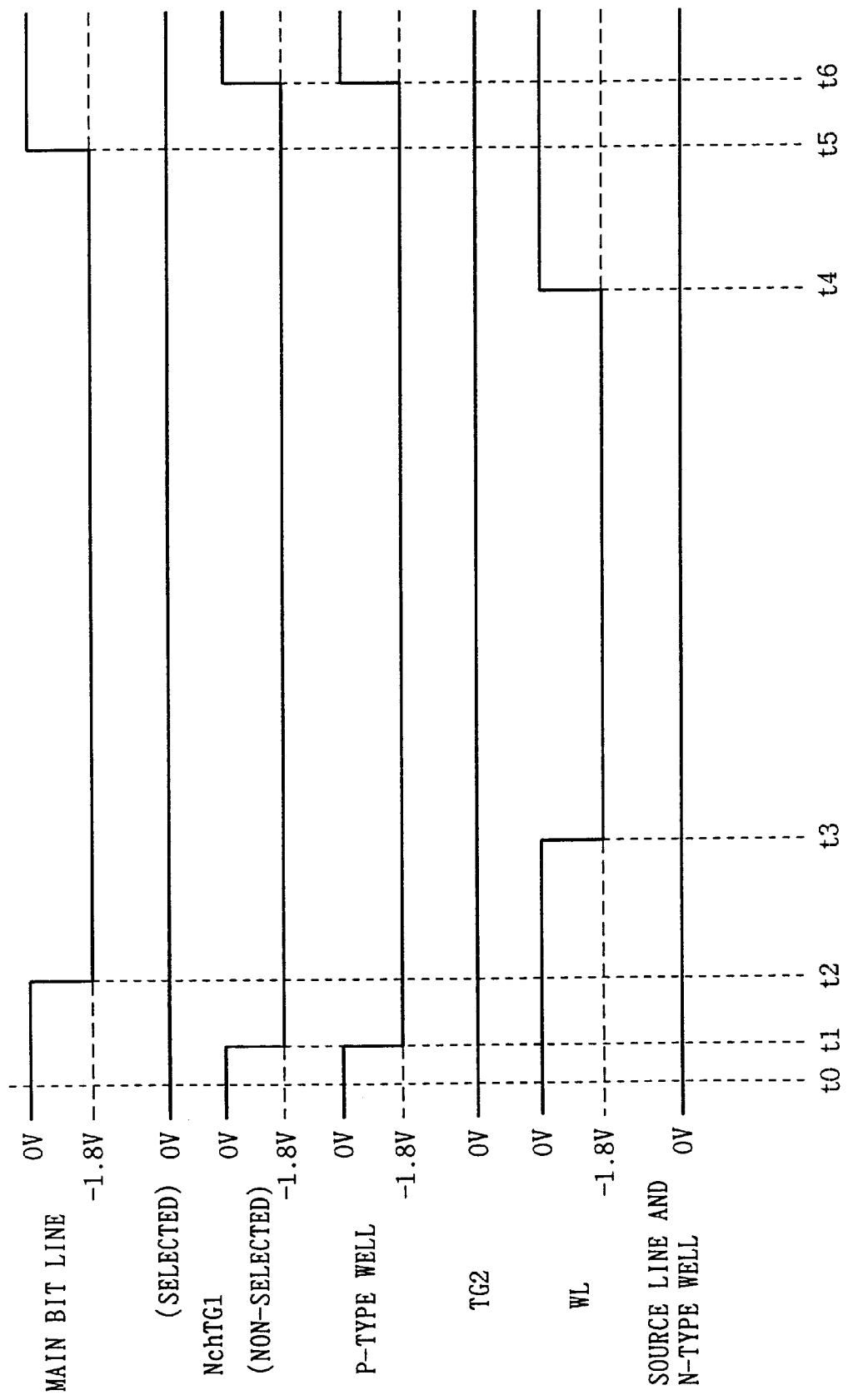
FIG. 45 is a timing chart for illustrating a read operation of the nonvolatile semiconductor memory device according to the embodiment 7 of the present invention.

FIG. 45 is a timing chart for illustrating the read operation for the memory cell block 704 shown in FIG. 44.

It is assumed that all potential levels of the main bit line MBL, the first gate transistors TG1, the P-type well, a second gate transistor TG2, a word line WL, a source line SL and an N-type well are 0 V in a standby state at a time t0.

At a time t1, the P-type well is set at a potential level of −1.8 V. At the same time t1, the gate potential of the selected first gate transistor TG1 remains at 0 V, while that of a non-selected first gate transistor TG1 is set at −1.8 V. In response to this, only a selected first gate transistor TG1 enters a conducting state. Therefore, an emitter of a bipolar transistor corresponding to a selected subbit line is connected with the main bit line MBL.

At a time t2, the potential level of the main bit line MBL falls to −1.8 V. At a time t3, the potential level of a selected word line WL falls to −1.8 V.

In response to this, the bipolar transistor receives a current flowing in a channel of a selected memory cell transistor as a base current, and feeds an amplified current to the main bit line MBL.

At a time t4, the potential level of the word line WL returns to 0 V, while that of the main bit line MBL returns to 0 V at a time t5. At a time t6, the gate potential of the selected first gate transistor TG1 and the potential level of the P-type well return to 0 V, to complete the read operation.

Figure 46:
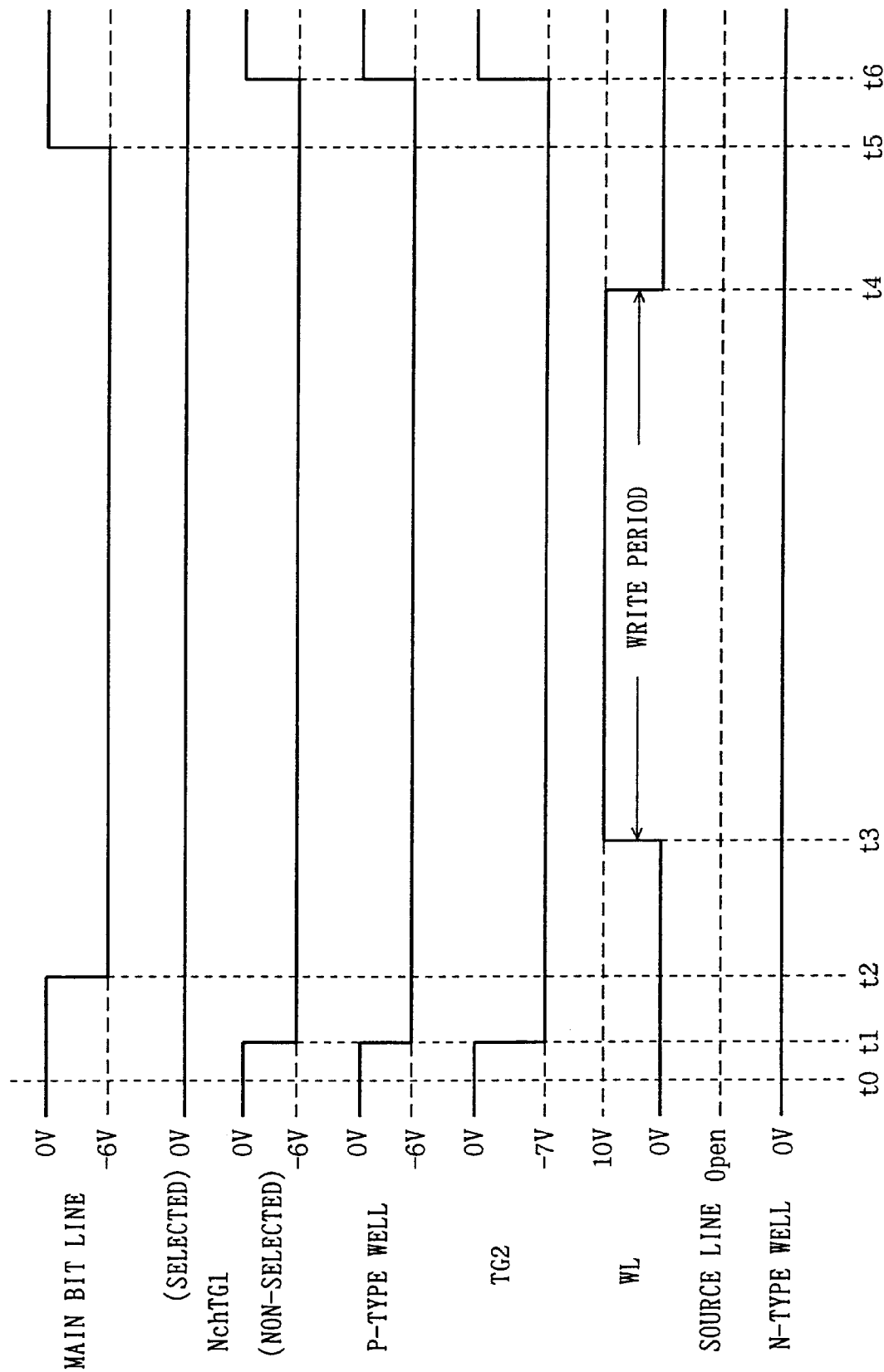
FIG. 46 is a timing chart for illustrating a write operation of the nonvolatile semiconductor memory device according to the embodiment 7 of the present invention.

FIG. 46 is a timing chart for illustrating a write operation for the memory cell block 704 shown in FIG. 44.

At a time t1, the potential level of the P-type well falls to −6 V. The gate potential of the non-selected first gate transistor TG1 also falls to −6 V. The gate potential of the second gate transistor TG2 falls to −7 V, whereby the second gate transistor TG2 enters a conducting state.

In response to this, the emitter and the base of the bipolar transistor are shorted.

At a time t2, the potential level of the main bit line MBL falls to −6 V.

At a time t3, the potential level of a selected word line WL rises to 10 V.

While FIG. 46 illustrates the potential level of the word line WL as constant in the write period between times t3 and t4, the potential level of the word line WL is pulsingly changed during this write period in practice. After application of a prescribed number of times of write pulses, further, a verify operation is also performed in practice. At the time t4, the write operation is completed, and the potential level of the word line WL returns to 0 V.

At a time t5, the potential level of the main bit line MBL returns to 0 V.

At a time t6, all potential levels of the first gate transistors TG1, the P-type well and the second gate transistor TG2 return to 0 V, to complete the write operation.

Figure 47:
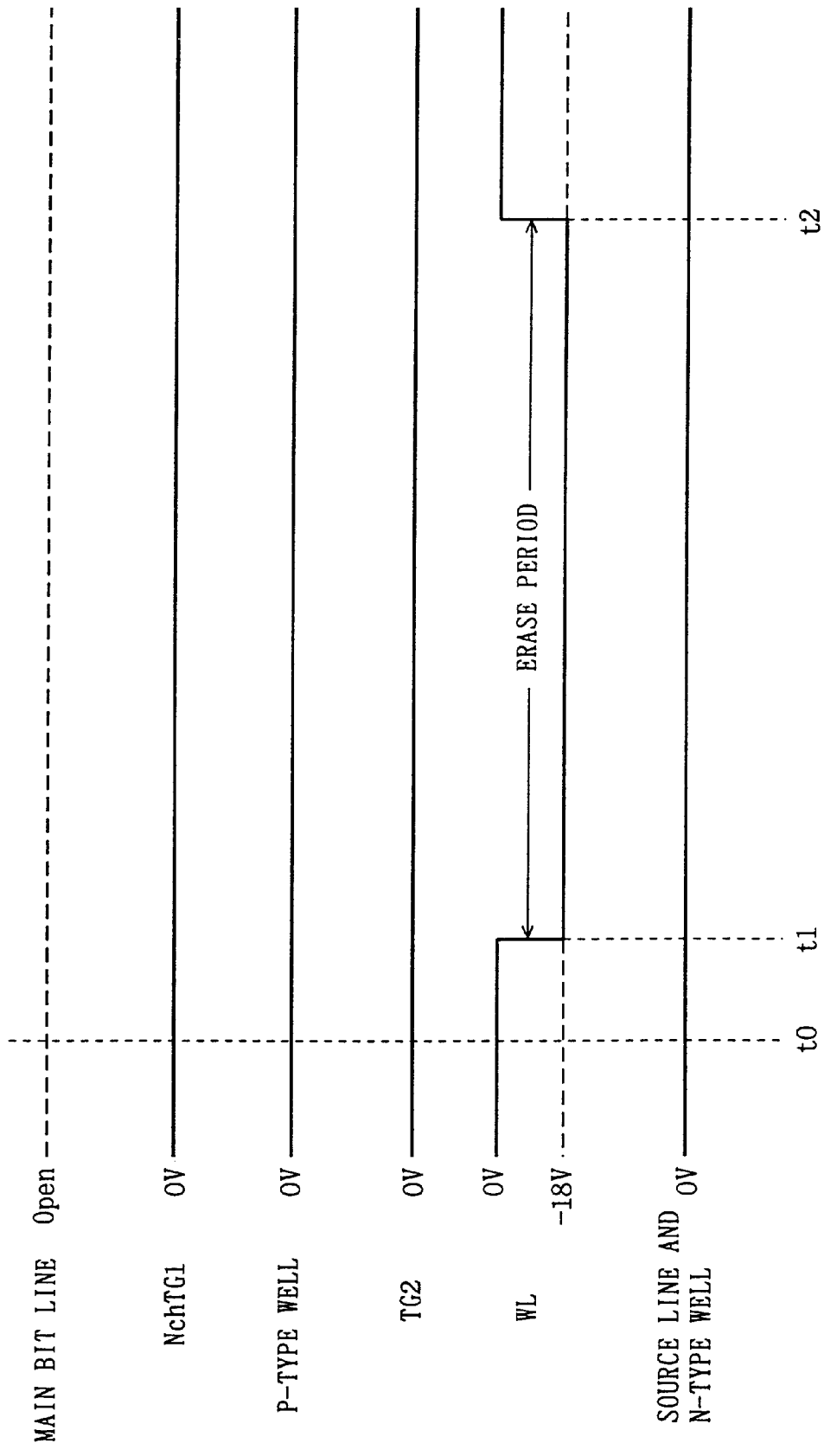
FIG. 47 is a timing chart for illustrating an erase operation of the nonvolatile semiconductor memory device according to the embodiment 7 of the present invention.

FIG. 47 is a timing chart for illustrating an erase operation for the memory cell block 704 shown in FIG. 44.

In a standby state at a time t0, the main bit line MBL is in an open state, and all potential levels of the first gate transistors TG1, the P-type well, the second gate transistor TG2, the word line WL, the source line SL and the N-type well are 0 V.

At a time t1, the potential level of the word line WL falls to −18 V. In response to this, electrons are injected into a substrate side from a floating gate, for performing the erase operation.

At a time t2, the potential level of the word line WL returns to 0 V, to complete the erase operation.

When the memory cell block 704 is formed in a split well whose potential level can be independently controlled, the absolute value of the potential applied to the word line WL during the erase time can be reduced by adjusting the well potential.

As described with reference to FIGS. 45 to 47, the read, write and erase operations are performed in the memory cell block 704 shown in FIG. 45 respectively.

Further, it is possible to avoid influence by potential rise by the threshold voltage of the first gate transistors TG1.

[Modification of Embodiment 7]

Figure 48:
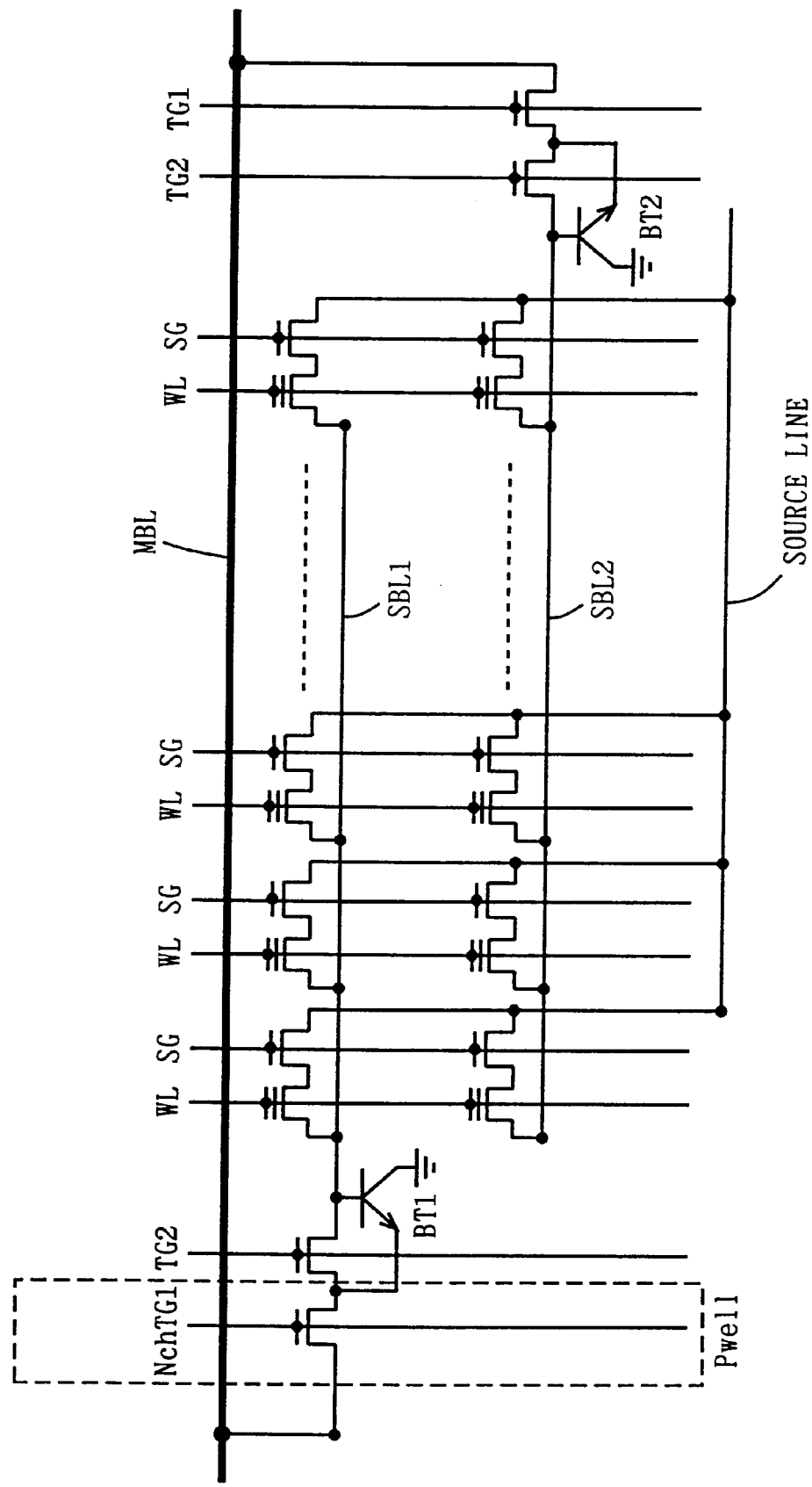
FIG. 48 is a circuit diagram showing a modification of the embodiment 7.

FIG. 48 is a circuit diagram showing the structure of a modification of the embodiment 7.

This structure is different from that of the memory cell block 704 according to the embodiment 7 shown in FIG. 44 in a point that memory cells are source select type two-transistor memory cells.

Also in FIG. 48, the memory cells may be replaced with drain select type two-transistor memory cells, similarly to the embodiment 1.

Effects similar to those of the modification of the embodiment 1 can be attained by source or drain select type two-transistor memory cells.

[Embodiment 8]

Figure 49:
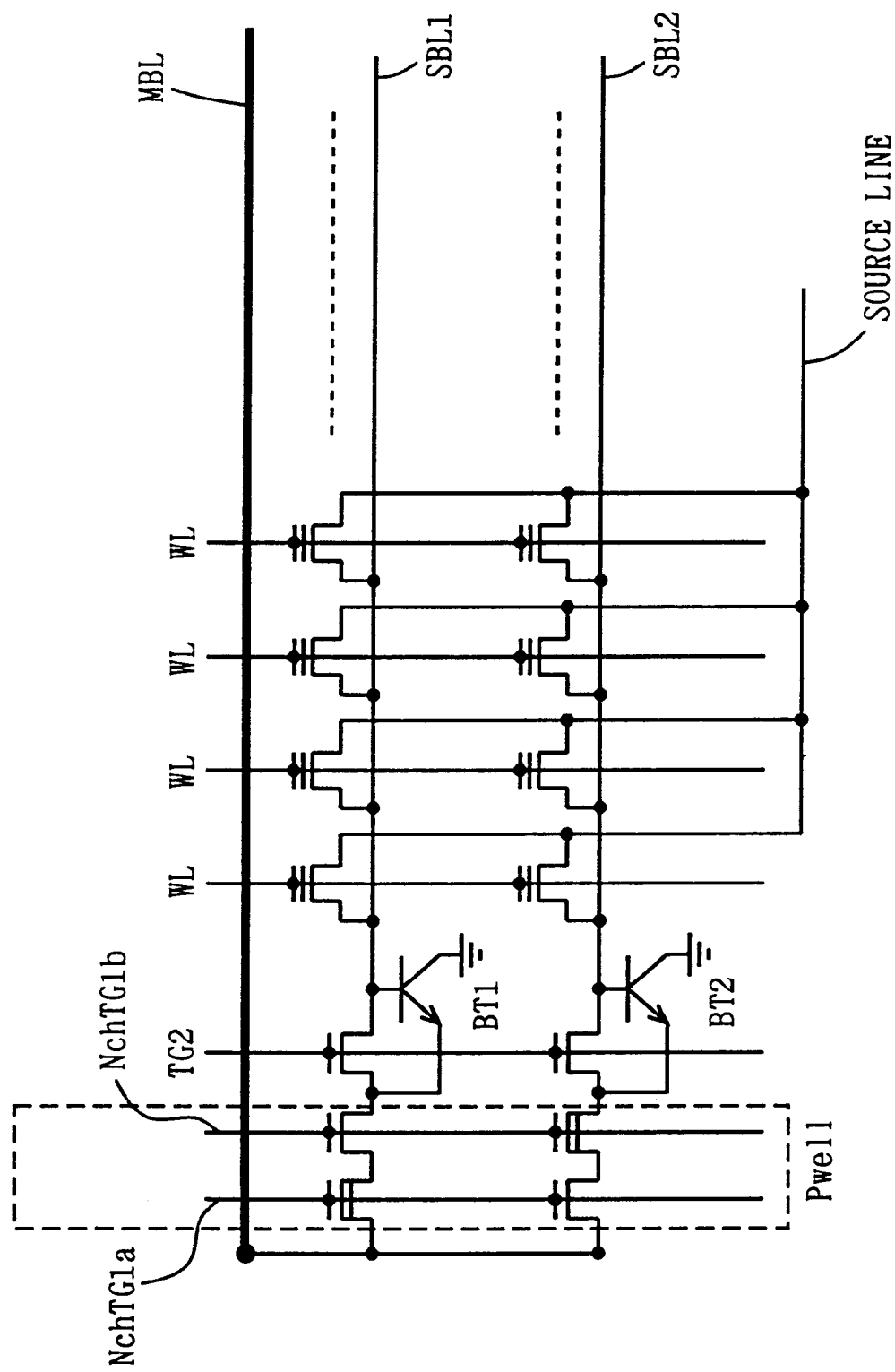
FIG. 49 is a circuit diagram showing the structure of a memory cell block 804 of a nonvolatile semiconductor memory device according to an embodiment 8 of the present invention.

FIG. 49 is a circuit diagram showing the structure of a memory cell block 804 of a nonvolatile semiconductor memory device according to an embodiment 8 of the present invention.

This structure is different from that of the memory cell block 504 according to the embodiment 5 shown in FIG. 37 in a point that gate transistors TG1a and TG1b are N-channel MOS transistors formed in a P-type well.

The remaining points of this structure are similar to those of the memory cell block 504 according to the embodiment 5 shown in FIG. 37, and hence identical portions are denoted by the same reference numerals, to omit redundant description.

Due to the structure shown in FIG. 49, it is possible to avoid influence by potential rise by the threshold voltage of the gate transistors TG1a and TG1b when a main bit line is set at a negative potential in a read operation.

[Modification of Embodiment 8]

Figure 50:
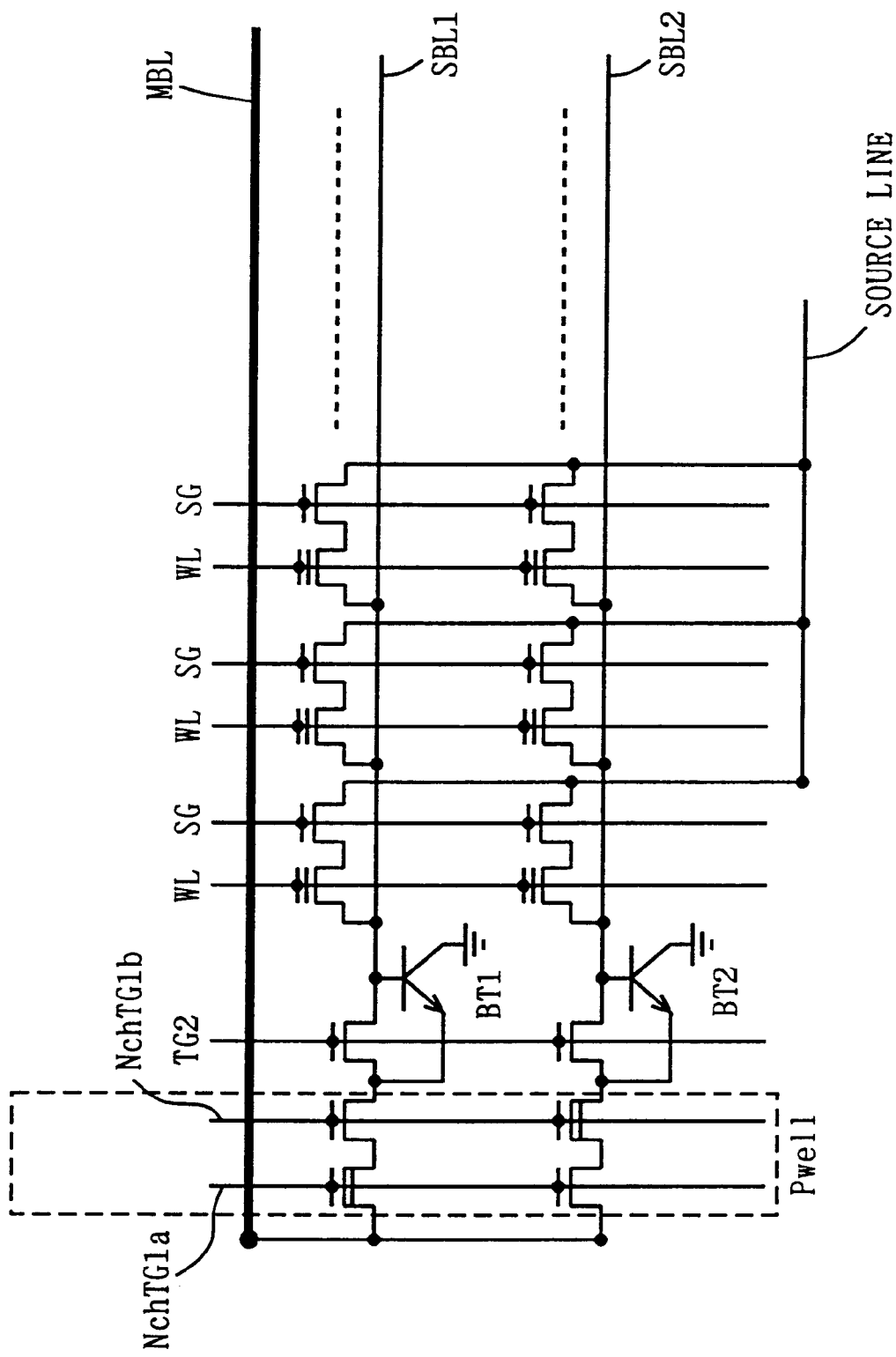
FIG. 50 is a circuit diagram showing a modification of the embodiment 8.

FIG. 50 is a circuit diagram showing a modification of the memory cell block 804 according to the embodiment 8.

This structure is different from that shown in FIG. 49 in a point that memory cells are source select type two-transistor memory cells.

Also in FIG. 50, the memory cells can be replaced with drain select type two-transistor memory cells.

Due to this structure, effects similar to those of the modification of the embodiment 1 can be attained.

[Embodiment 9]

Figure 51:
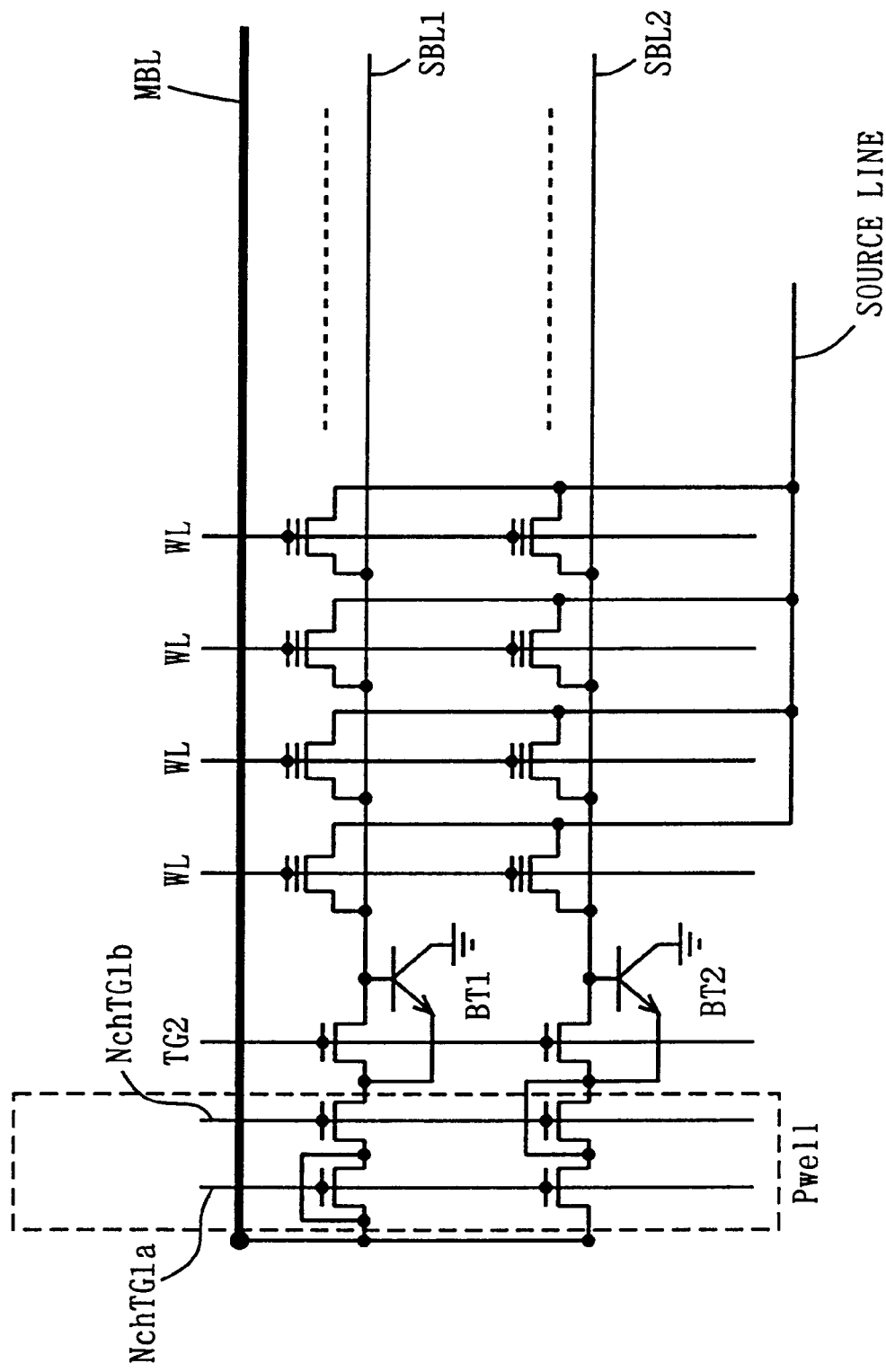
FIG. 51 is a circuit diagram showing the structure of a memory cell block 904 of a nonvolatile semiconductor memory device according to an embodiment 9 of the present invention.

FIG. 51 is a circuit diagram showing the structure of a memory cell block 904 of a nonvolatile semiconductor memory device according to an embodiment 9 of the present invention.

This structure is different from that of the memory cell block 604 according to the embodiment 6 shown in FIG. 40 in a point that gate transistors TG1a and TG1b are N-channel MOS transistors formed in a P-type well.

The remaining points of this embodiment are similar to those of the memory cell block 604 according to the embodiment 6 shown in FIG. 40, and hence identical portions are denoted by the same reference numerals, to omit redundant description.

Due to the structure shown in FIG. 51, it is possible to avoid influence by potential rise by the threshold voltage of the gate transistors TG1a and TG1b when a main bit line is set at a negative potential in a read operation.

[Modification of the Embodiment 9]

Figure 52:
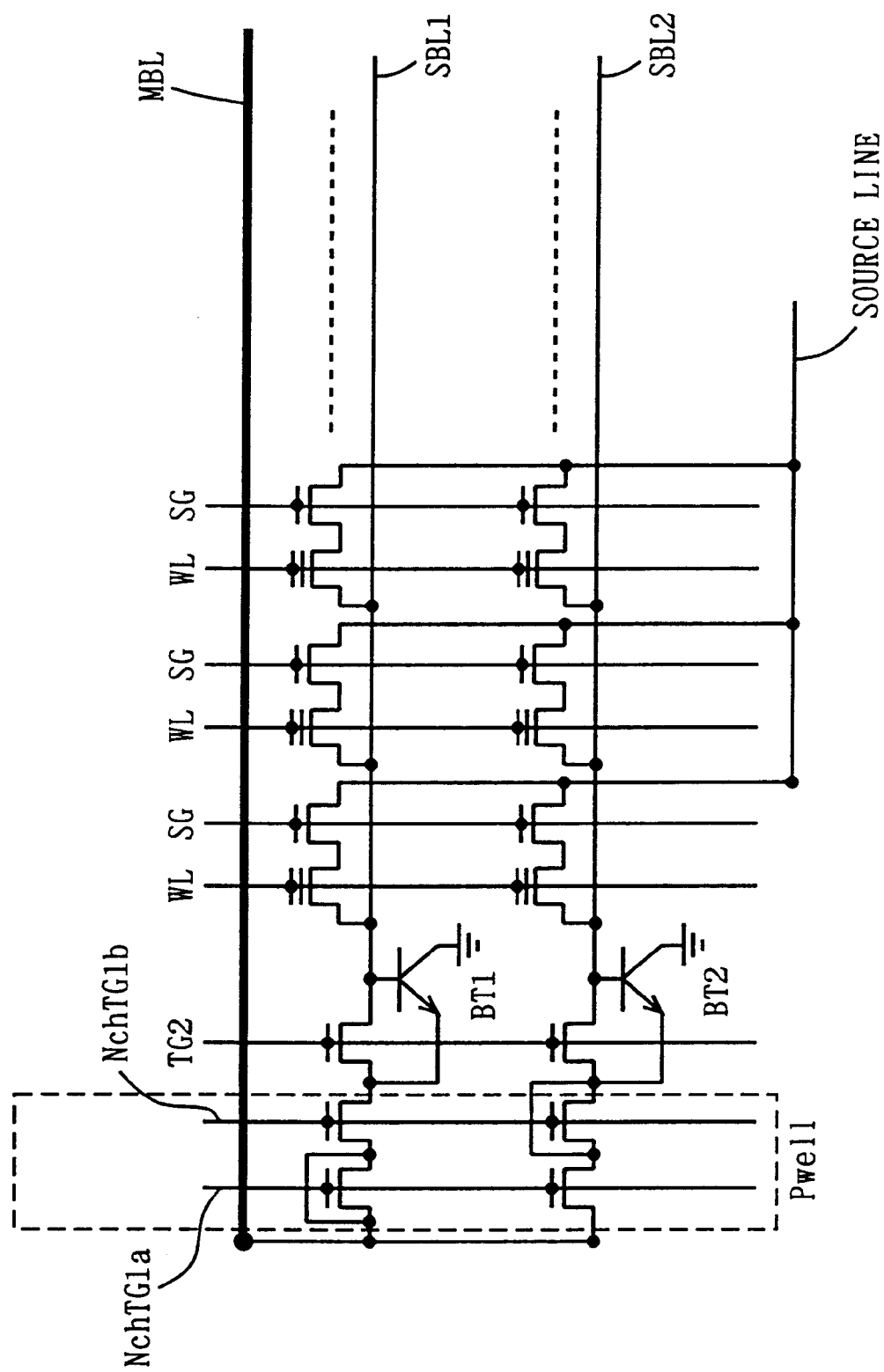
FIG. 52 is a circuit diagram showing a modification of the embodiment 9.

FIG. 52 is a circuit diagram showing a modification of the memory cell block 904 shown in FIG. 51.

This structure is different from that of the memory cell block 904 in a point that memory cells are source select type two-transistor memory cells.

Also in FIG. 52, the memory cells can be replaced with drain select type two-transistor memory cells.

Due to this structure, effects similar to those of the modification of the embodiment 1 can be attained.

[Embodiment 10]

Figure 53:
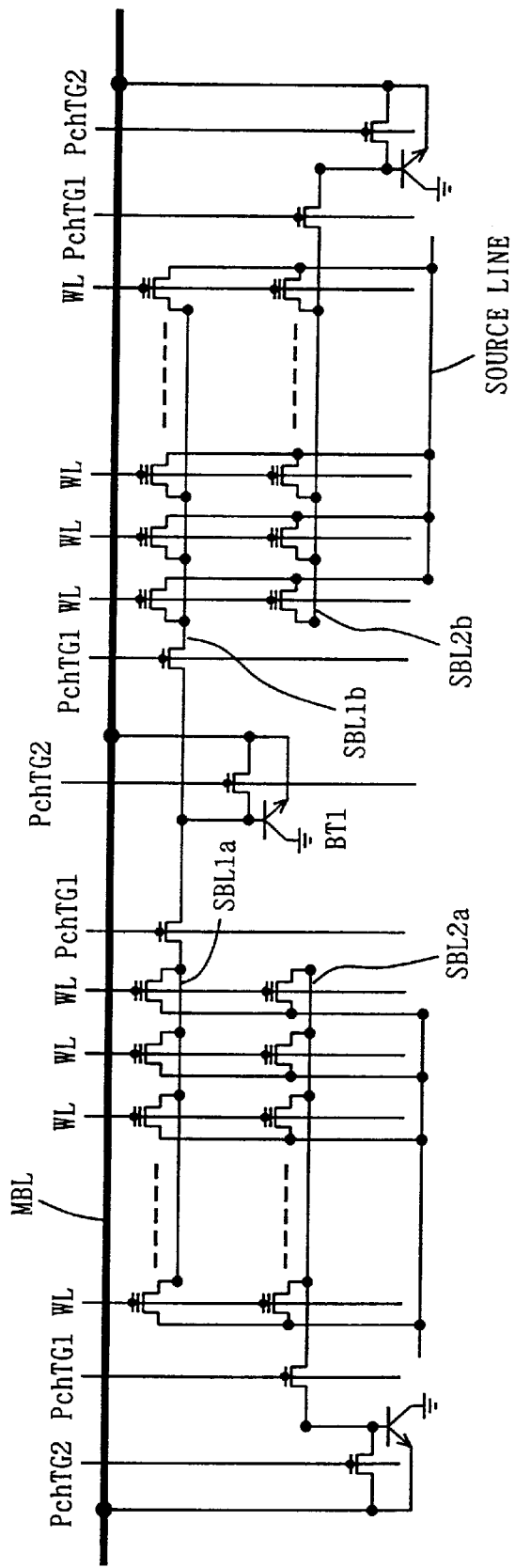
FIG. 53 is a circuit diagram showing the structure of memory cell blocks 1004 of a nonvolatile semiconductor memory device according to an embodiment 10 of the present invention.

FIG. 53 is a circuit diagram for illustrating the structure of memory cell blocks 1004 of a nonvolatile semiconductor memory device according to an embodiment 10 of the present invention.

This structure is different from that of the memory cell block 404 according to the embodiment 4 shown in FIG. 31 in a point that a bipolar transistor BT1 is shared by an adjacent pair of memory cell blocks 1004.

In the memory cell blocks 1004 according to the embodiment 10 shown in FIG. 53, the emitter of the bipolar transistor BT1 is directly connected with a main bit line MBL, and the emitter and the base of the bipolar transistor BT1 are controlled by a second P-channel gate transistor TG2, to be shorted.

The base of the bipolar transistor BT1 is selectively coupled to either one of adjacent subbit lines SBL1a and SBL1b by the first gate transistor TG1.

Due to the aforementioned structure, the number of selector lines for controlling the first and second gate transistors BT1 and BT2 can be reduced, to attain a structure suitable for higher integration.

[Modification of Embodiment 10]

Figure 54:
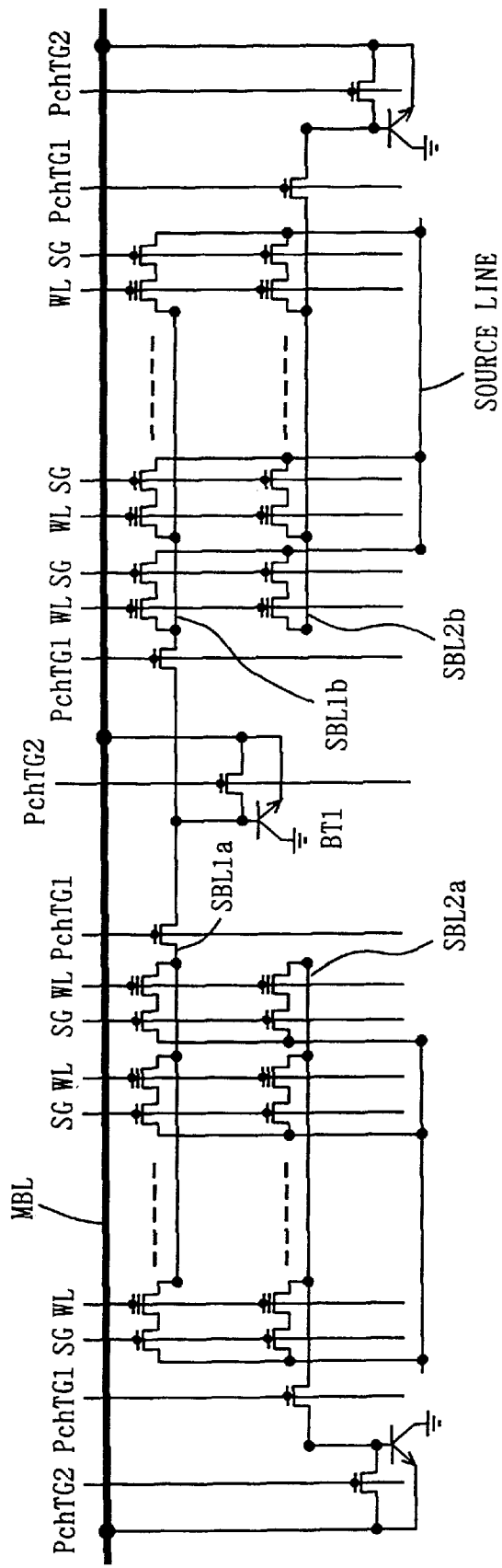
FIG. 54 is a circuit diagram showing a modification of the embodiment 10.

FIG. 54 is a circuit diagram showing a modification of the memory cell blocks 1004 according to the embodiment 10 shown in FIG. 53.

This structure is different from that shown in FIG. 53 in a point that memory cells are source select type two-transistor memory cells.

Also in FIG. 54, the memory cells can be replaced with drain select type two-transistor memory cells.

Due to the aforementioned structure, effects similar to those of the modification of the embodiment 1 can be attained.

[Embodiment 11]

Figure 55:
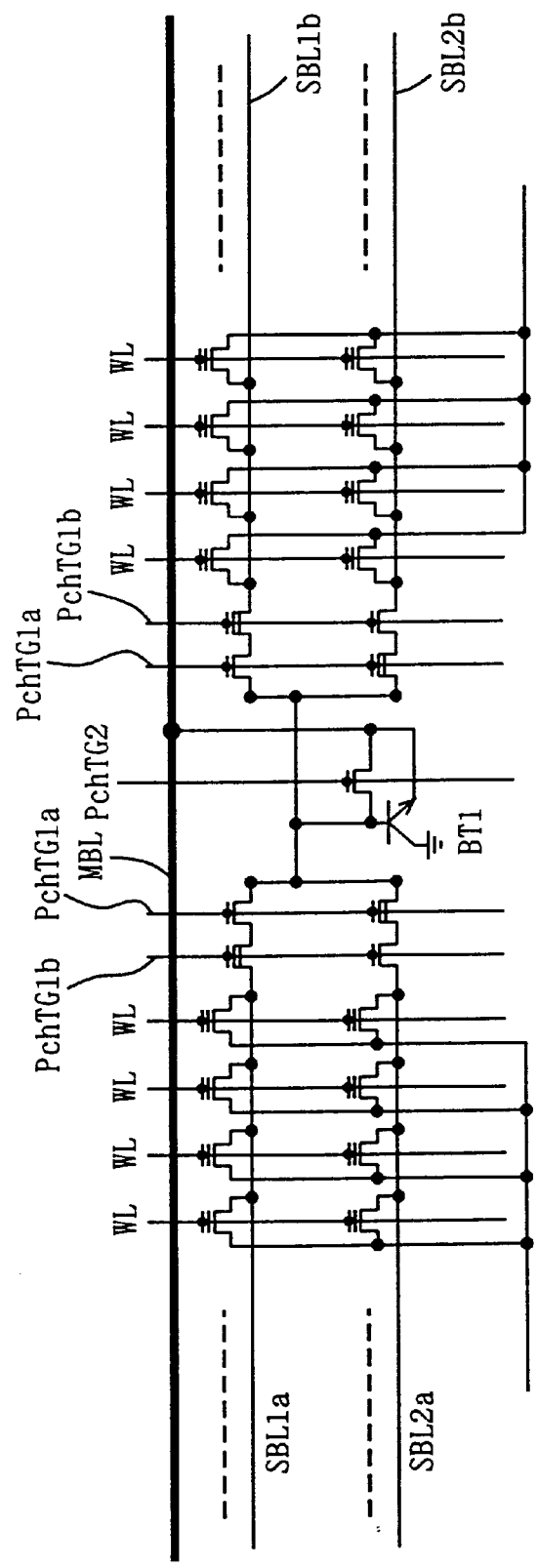
FIG. 55 is a circuit diagram showing the structure of memory cell blocks 1104 of a nonvolatile semiconductor memory device according to an embodiment 11 of the present invention.

FIG. 55 is a circuit diagram showing the structure of memory cell blocks 1104 of a nonvolatile semiconductor memory device according to an embodiment 11 of the present invention.

This structure is different from that of the memory cell block 504 according to the embodiment 5 shown in FIG. 37 in a point that a bipolar transistor BT1 is shared by an adjacent pair of memory cell blocks 1104.

Referring to FIG. 55, the emitter of the bipolar transistor BT1 is directly connected with a main bit line MBL, and the emitter and the base of the bipolar transistor BT1 are controlled by a second P-channel gate transistor TG2, to be shorted.

The base of the bipolar transistor BT1 is controlled by gate transistors TG1a and TG1b, to be selectively connected with any of subbit lines SBL1a, SBL1b, SBL2a and SBL2b in the adjacent pair of memory cell blocks 1104.

Also in FIG. 55, the gate transistors TG1b and TG1a corresponding to the subbit line SBL1a are depression- and enhancement-mode transistors respectively, while those corresponding to the subbit line SBL2a are enhancement- and depression-mode transistors respectively.

Due to the structure shown in FIG. 55, a structure further suitable for higher integration is implemented in addition to the effects described with reference to the embodiment 5.

[Modification of Embodiment 11]

Figure 56:
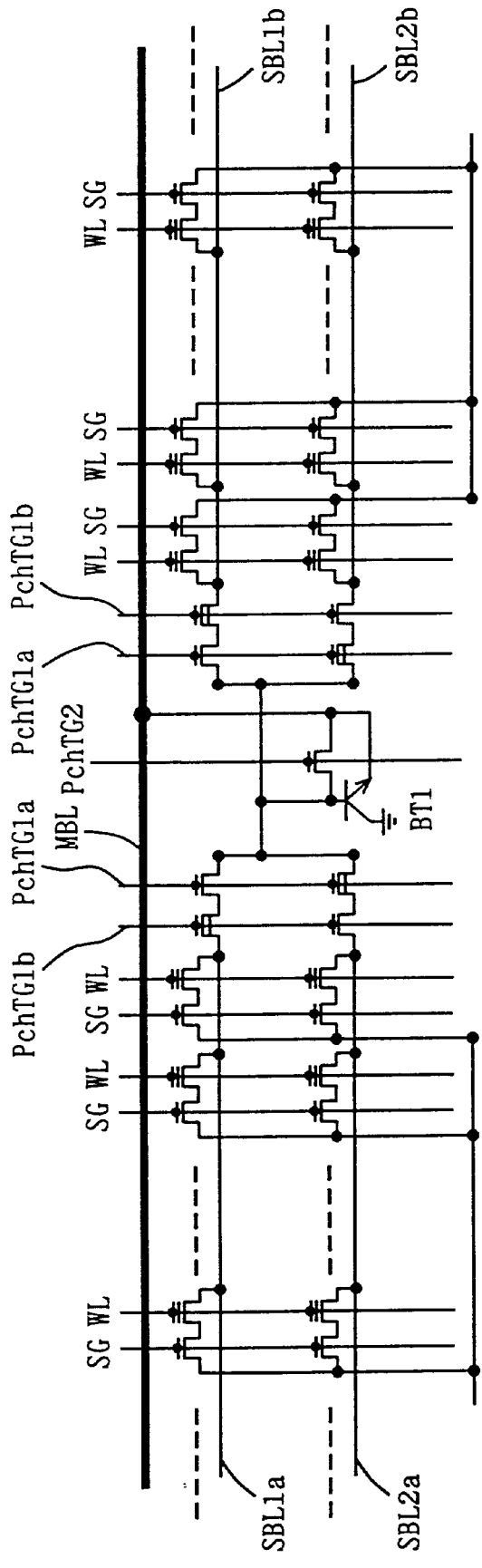
FIG. 56 is a circuit diagram showing a modification of the embodiment 11.

FIG. 56 is a circuit diagram showing a modification of the embodiment 11.

This structure is different from that shown in FIG. 55 in a point that memory cells are source select type two-transistor memory cells.

Also in FIG. 56, the memory cells can be replaced with drain select type two-transistor memory cells.

Due to the aforementioned structure, effects similar to those of the modification of the embodiment 1 can be attained.

[Embodiment 12]

Figure 57:
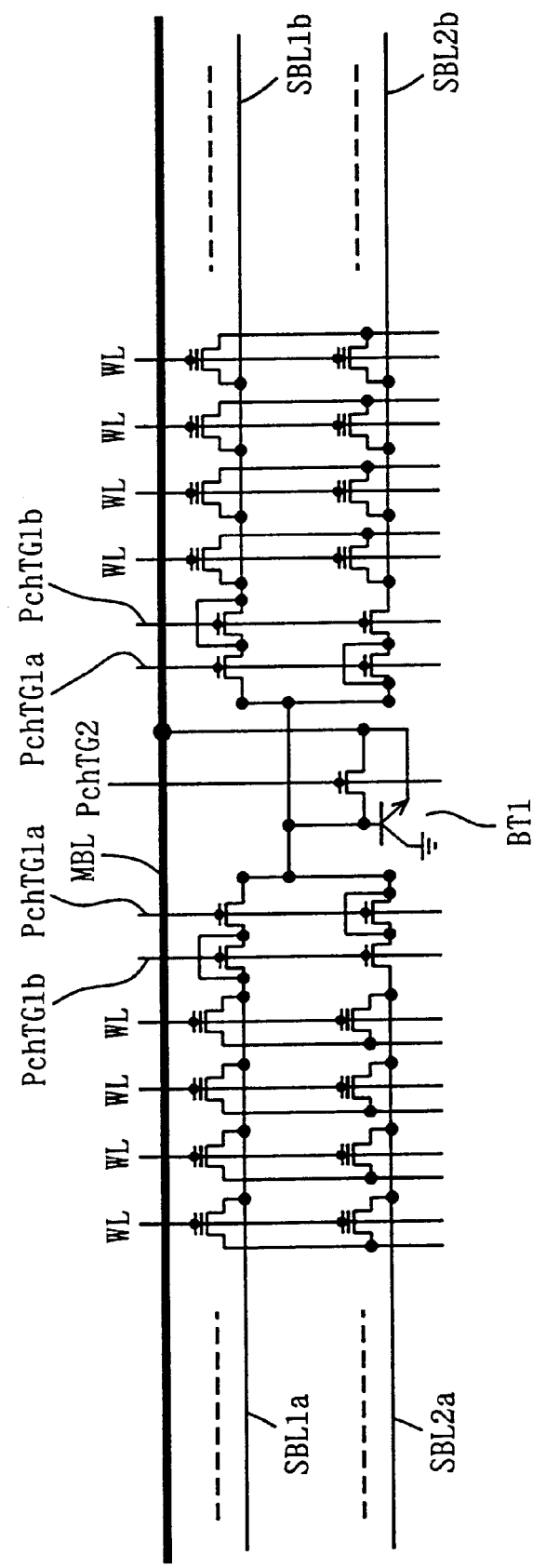
FIG. 57 is a circuit diagram showing the structure of memory cell blocks 1204 of a nonvolatile semiconductor memory device according to an embodiment 12 of the present invention.

FIG. 57 is a circuit diagram showing the structure of memory cell blocks 1204 of a nonvolatile semiconductor memory device according to an embodiment 12 of the present invention.

This structure is different from that of the memory cell block 604 according to the embodiment 6 shown in FIG. 40 in a point that a bipolar transistor BT1 is shared by an adjacent pair of memory cell blocks 1204.

Referring to FIG. 57, the emitter of the bipolar transistor BT1 is directly connected with a main bit line MBL, and the emitter and the base of the bipolar transistor BT1 are controlled by a second P-channel gate transistors TG, to be shorted.

Also in FIG. 57, the sources and drains of the gate transistors TG1*b* corresponding to subbit lines SBL1*a* and SBL1*b* respectively are shorted.

Due to the structure of the memory cell blocks 1204, a circuit structure further suitable for higher integration is implemented in addition to the effects of the memory cell block 604 according to the embodiment 6.

[Modification of Embodiment 12]

Figure 58:
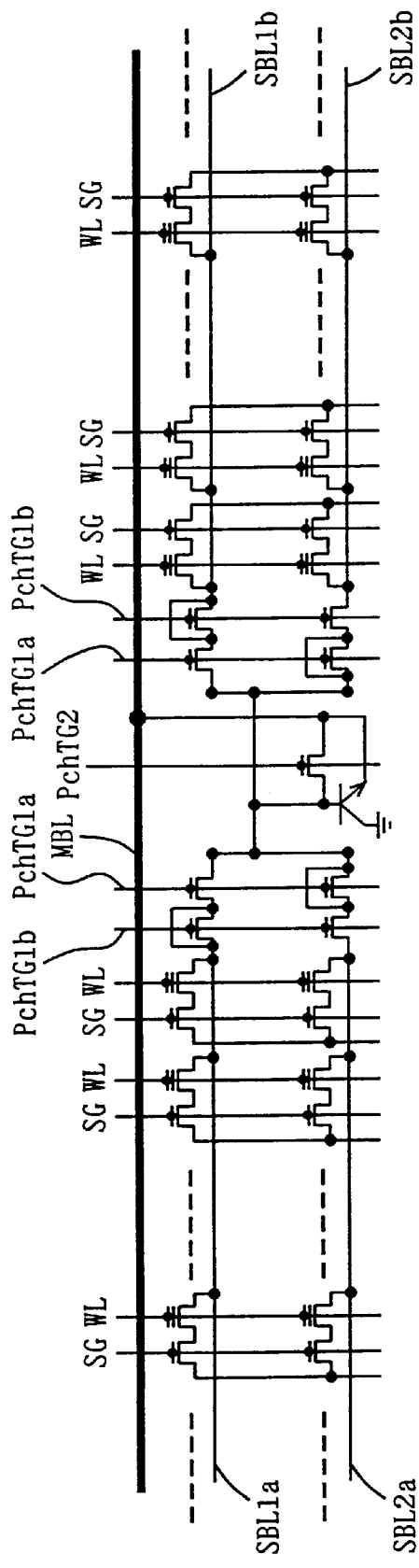
FIG. 58 is a circuit diagram showing a modification of the embodiment 12.
Figure 59:
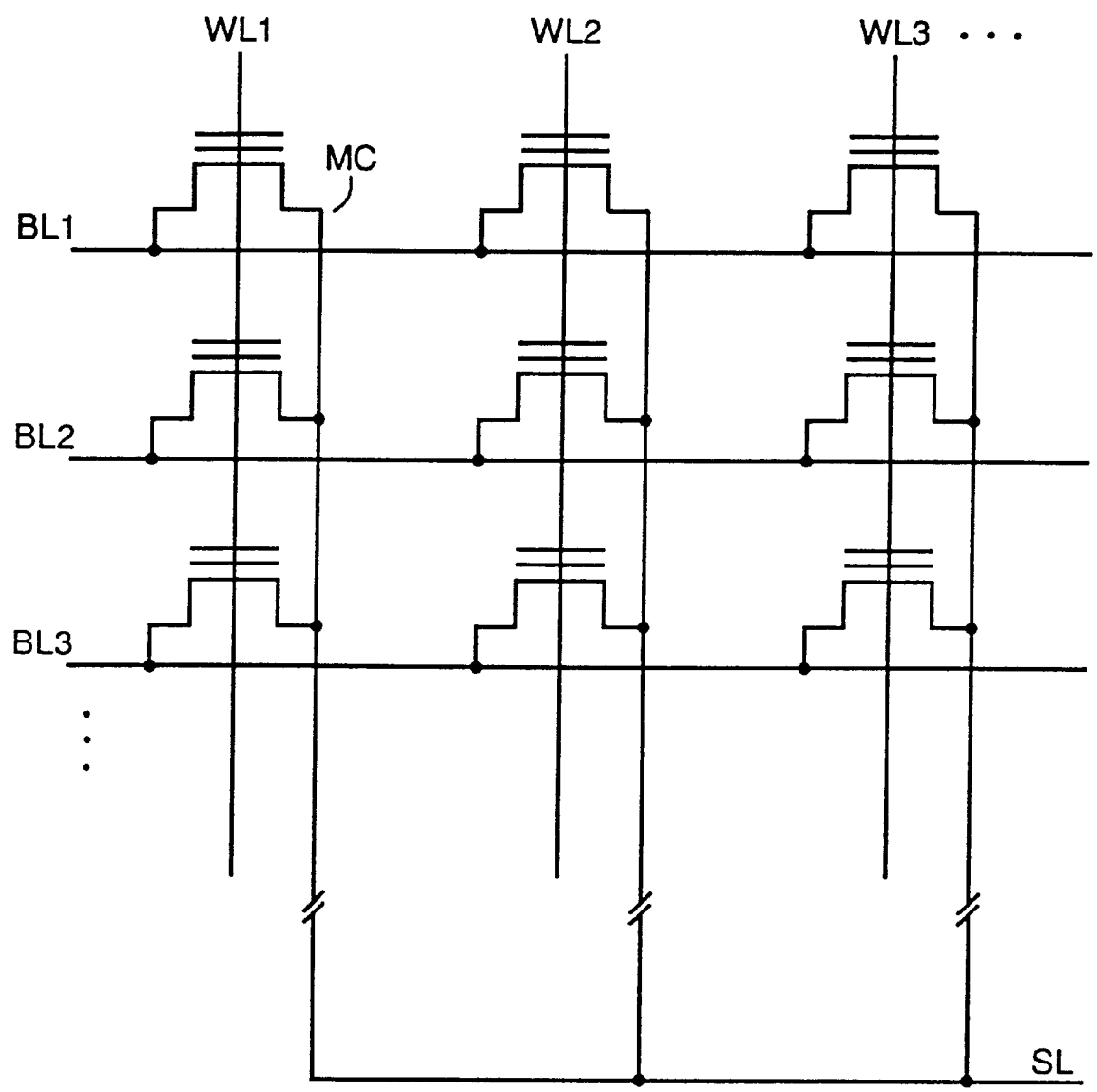
FIG. 59 is a circuit diagram showing the structure of a memory cell array of a conventional NOR flash memory.
Figure 60:
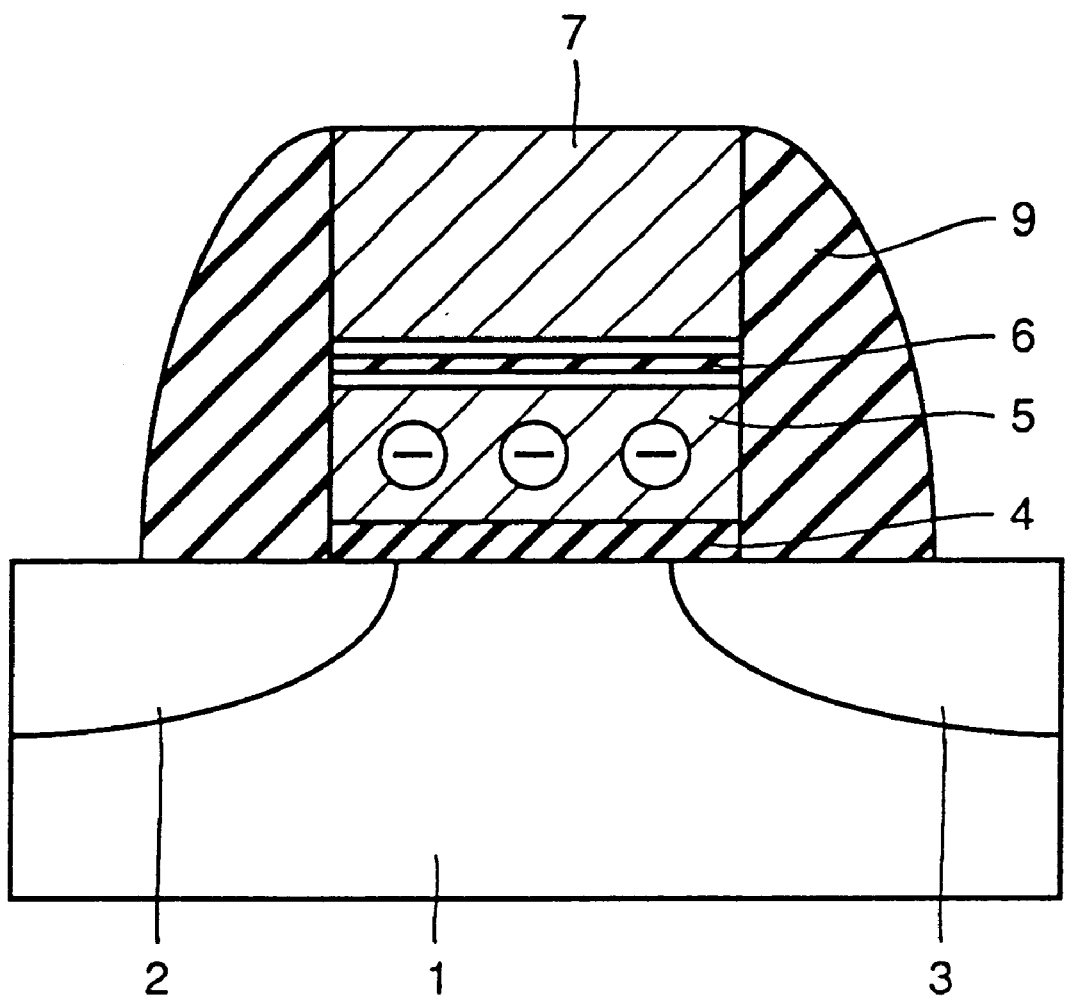
FIG. 60 is a model sectional view for illustrating the structure of a memory cell transistor of the conventional nonvolatile semiconductor memory device.
Figure 61:
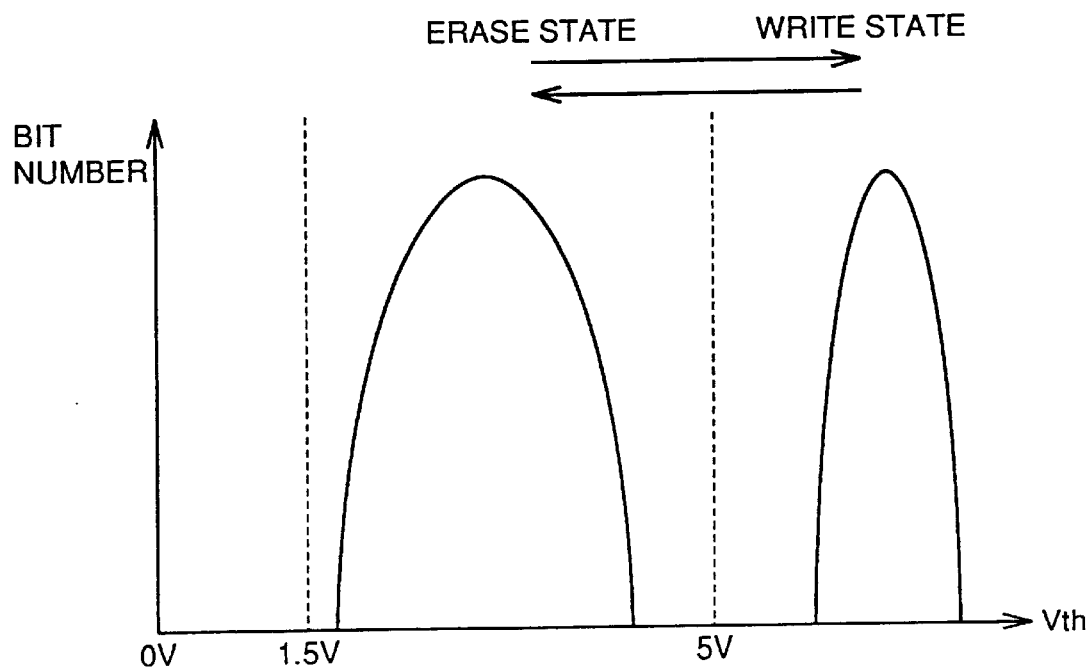
FIG. 61 illustrates threshold voltage distributions of memory cells in the conventional NOR flash memory.
Figure 62:
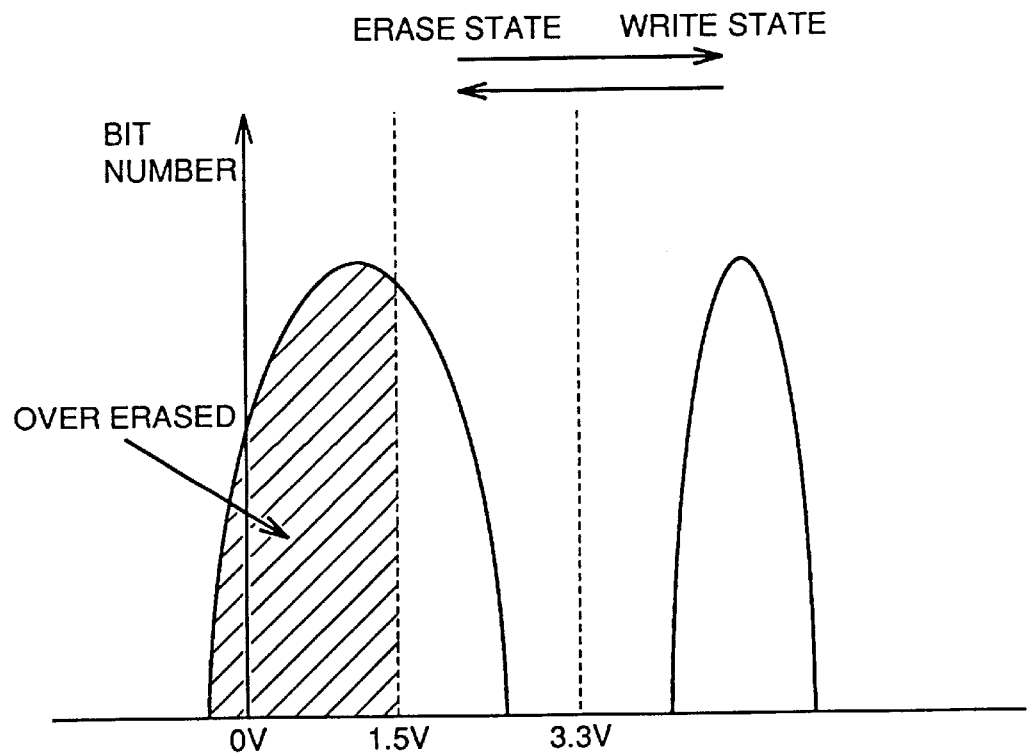
FIG. 62 illustrates threshold voltage distributions of the memory cells in the conventional NOR flash memory.
Figure 63:
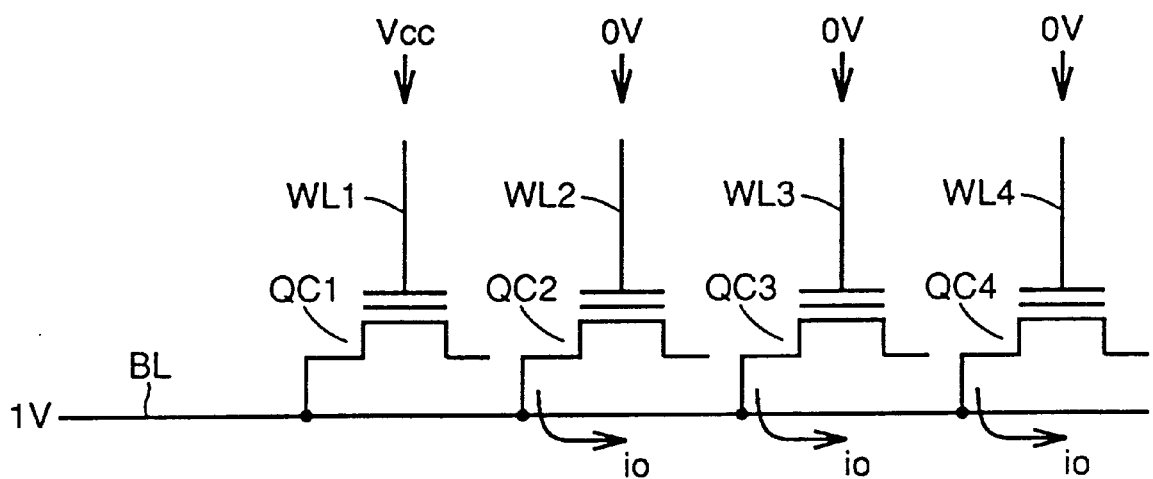
FIG. 63 is adapted to illustrate the problem of overerased cells in the conventional NOR flash memory.
Figure 64:
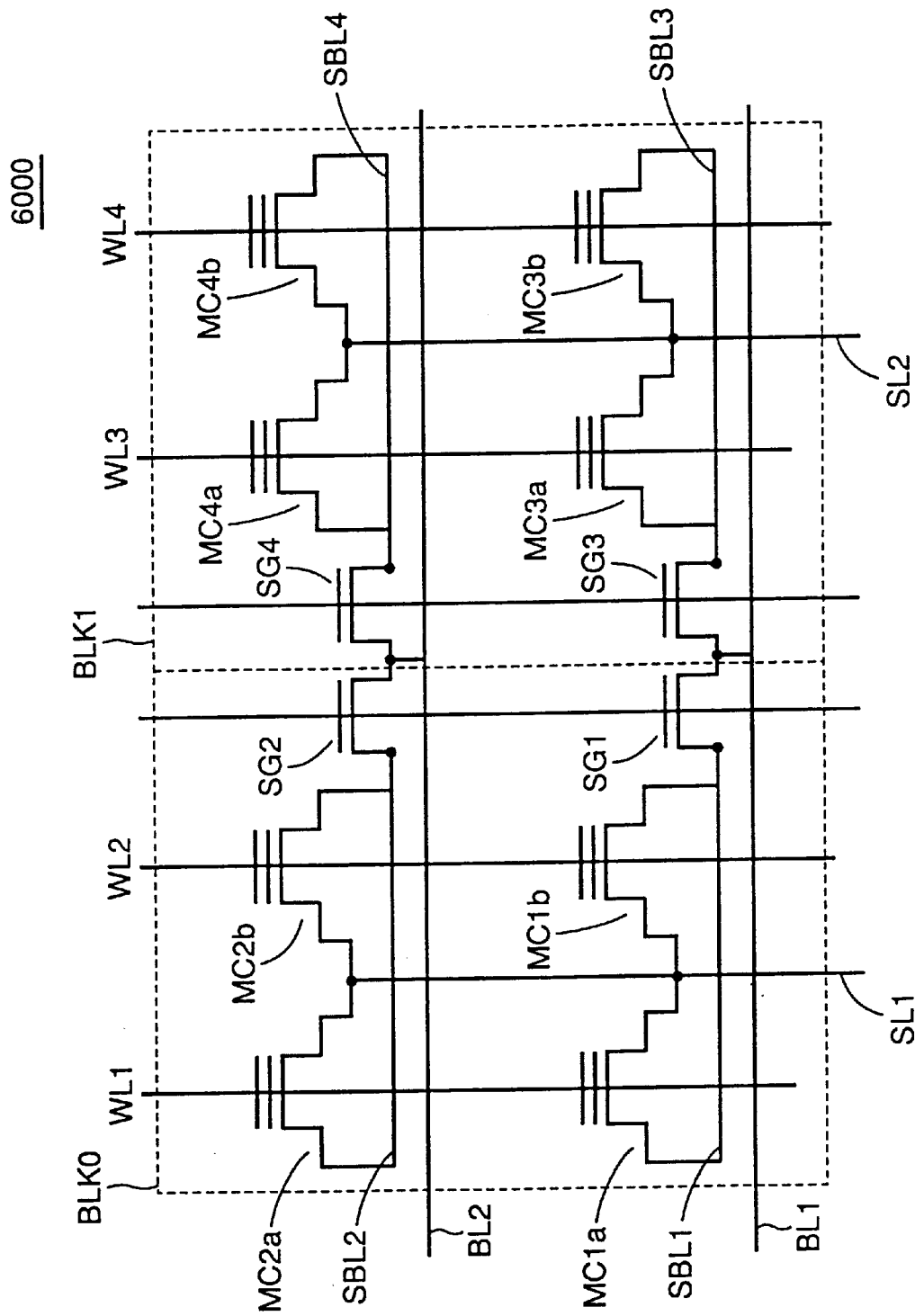
FIG. 64 is a circuit diagram showing the memory structure of a conventional DINOR flash memory.
Figure 65:
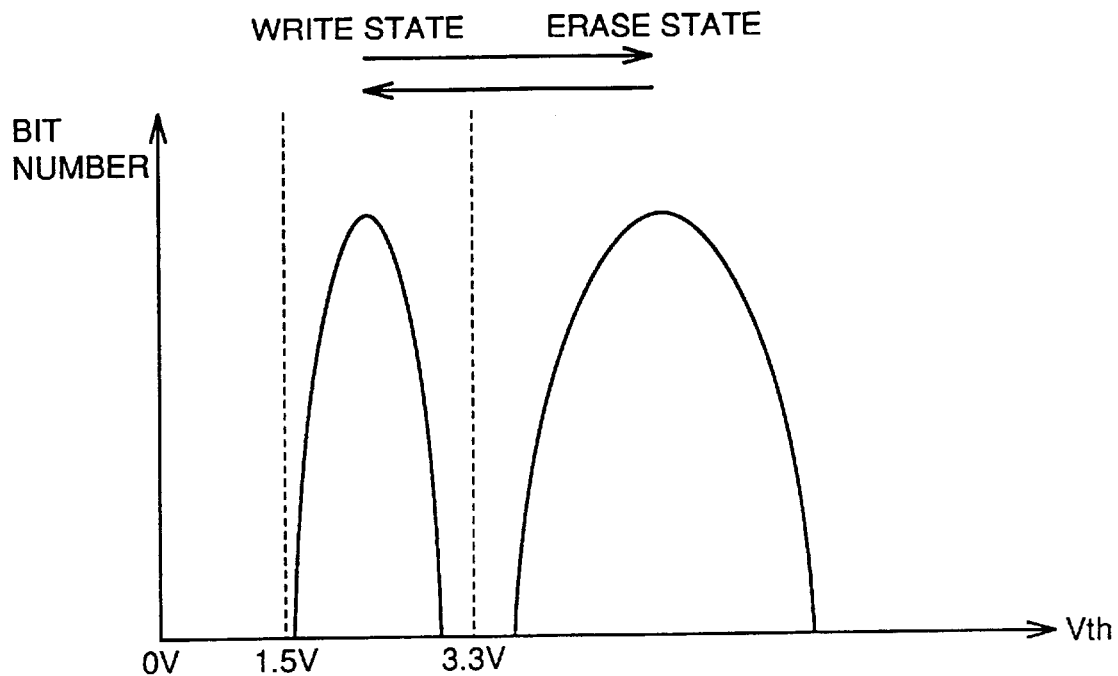
FIG. 65 illustrates threshold voltage distributions of memory cells in the conventional DINOR flash memory.
Figure 66:
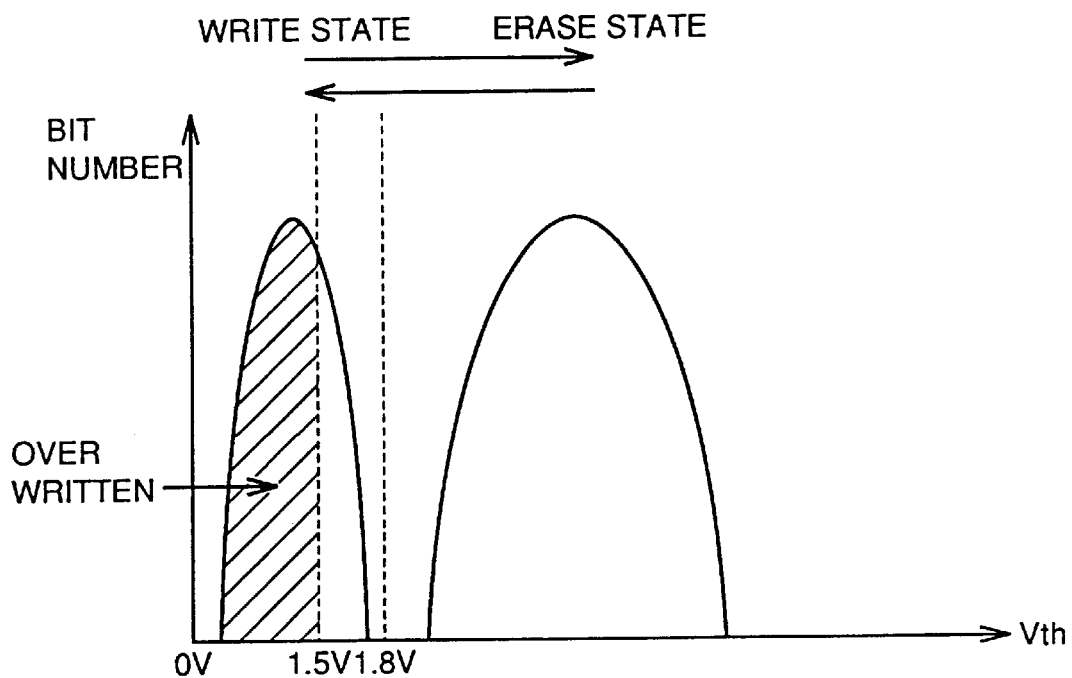
FIG. 66 illustrates threshold voltage distributions of the memory cells in the conventional DINOR flash memory.
Figure 67:
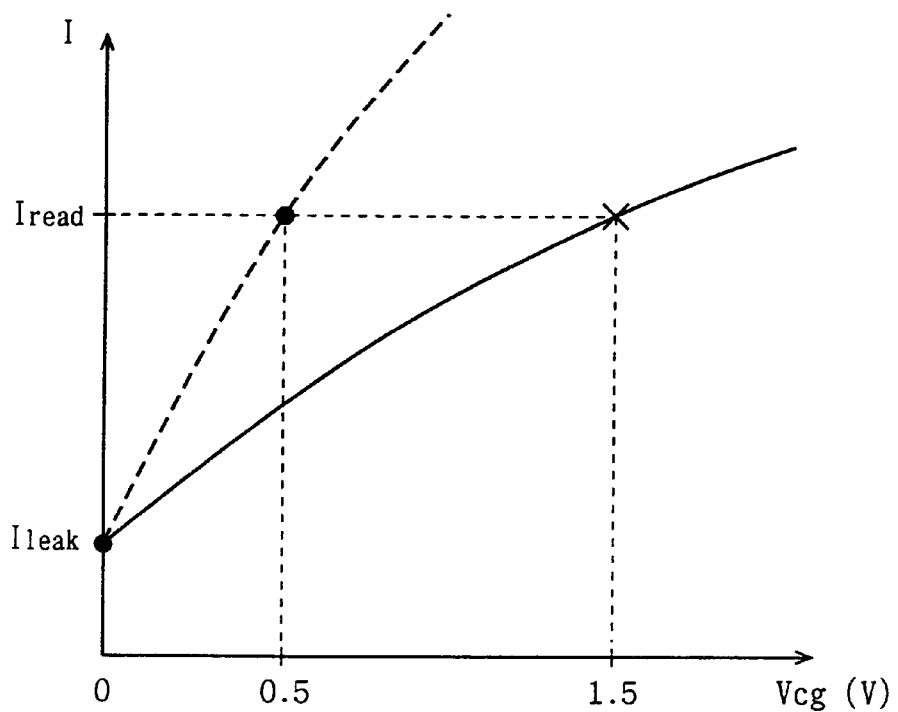
FIG. 67 illustrates the relation between a control gate voltage of a memory cell transistor and a read current.
Figure 68:
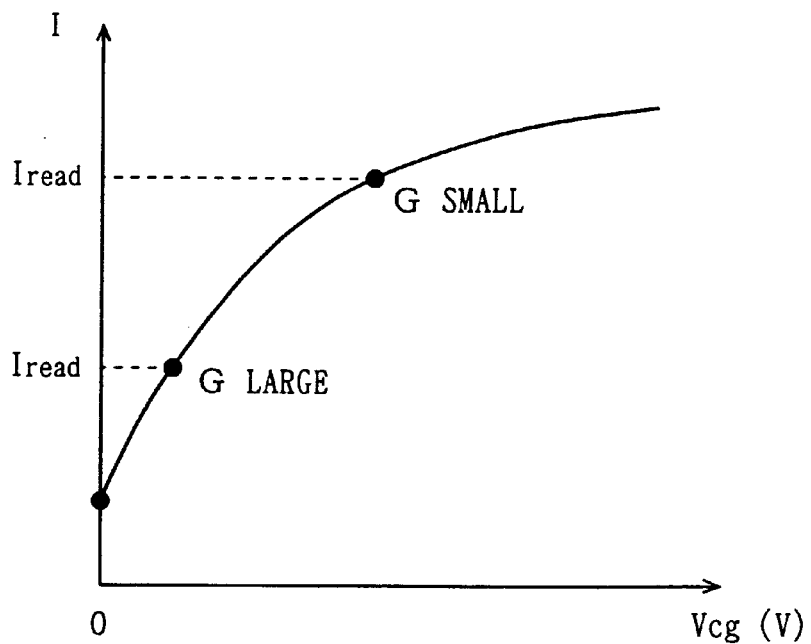
FIG. 68 illustrates the relation between the control gate voltage of the memory cell transistor and a characteristic value G.

FIG. 58 is a circuit diagram showing a modification of the memory cell blocks 1204 according to the embodiment 12 shown in FIG. 57.

This structure is different from that shown in FIG. 57 in a point that memory cells are source select type two-transistor memory cells.

Also in FIG. 58, the memory cells can be replaced with drain select type two-transistor memory cells.

Due to the aforementioned structure, effects similar to those of the modification of the embodiment 1 can be attained.

In the above description, it is assumed that all memory cell transistors are P-channel transistors. However, the present invention is not restricted to this, but is also applicable to N-channel memory cell transistors by changing polarity of potential arrangements or the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device being formed on a semiconductor substrate, comprising:

a memory cell array including a plurality of memory cells arranged in rows and columns, said memory cell array being split into a plurality of blocks each including a plurality of memory cells being arranged on a first plurality of rows and a second plurality of columns;

a plurality of first main bit lines being provided over said plurality of blocks in correspondence to said columns of said memory cells;

a plurality of second main bit lines being provided over said plurality of blocks in correspondence to said columns of said memory cells;

a group of subbit lines being provided in each of said plurality of blocks in correspondence to said second plurality of columns respectively; and a plurality of word lines being provided over said plurality of blocks in correspondence to said rows of said memory cells, each of said memory cells, provided in correspondence to intersections between said subbit lines and said word lines, including a memory cell transistor, said memory cell transistor having:

a second conductivity type source region and a drain region of said second conductivity type being formed on a first conductivity type major surface of said semiconductor substrate, a channel region being held between said source region and said drain region, a charge storage electrode being formed on said channel region with an oxide film therebetween, and a control electrode being formed above said charge storage electrode with an insulating film therebetween, said drain region of said memory cell transistor being coupled to corresponding said subbit line, the potential of said control electrode being controlled by corresponding said word line, said nonvolatile semiconductor memory device further comprising:

a plurality of bipolar transistors each being provided for corresponding said block for amplifying a current flowing between said source region and said drain region of selected said memory cell transistor as a base current through selected said subbit line, and controlling a current flowing to corresponding said first main bit line in a read operation;

connection means, provided for each of said blocks, for selectively coupling said subbit lines with corresponding said second main bit lines in a write operation while selectively coupling said subbit lines with a base of corresponding said bipolar transistor in said read operation;

memory cell selector means for selecting corresponding said subbit line, corresponding said first and second main bit lines and corresponding said word line in response to an external address signal;

data read means for reading data from said selected memory cell in response to the value of said current flowing through said selected first main bit line; and write means for injecting or extracting electrons into or from said charge storage electrode of selected said memory cell transistor through said second main bit lines in said write operation.

2. The nonvolatile semiconductor memory device in accordance with claim 1, wherein said memory cell selector means includes:

row selector means for selecting corresponding said word line in response to an external address signal, and column selector means for selecting corresponding said first and second main bit lines and corresponding said subbit line in response to an external address signal, and said connection means includes:

first internal connection means being controlled by said column selector means for selectively connecting said subbit line with the base of said corresponding bipolar transistor in said read operation, and second internal connection means being controlled by said column selector means for selectively connecting said subbit lines with said second main bit lines in said write operation.

3. The nonvolatile semiconductor memory device in accordance with claim 2, further comprising:

a plurality of cell selector lines being provided for said rows of said memory cells respectively, each said memory cell including:

a cell selector transistor for selectively opening/closing a conduction path of a current flowing between said subbit line and the base of said bipolar transistor through said memory cell transistor, said column selector means activating said cell selector line corresponding to said selected memory cell and bringing said cell selector transistor of said selected memory cell into a conducting state.

4. The nonvolatile semiconductor memory device in accordance with claim 3, wherein said connection means includes:

a MOS transistor for selectively coupling said subbit line with the base of said bipolar transistor, and said bipolar transistor has a base layer being doped with impurities at the same time in a step of doping source and drain regions of said MOS transistor with said impurities.

5. The nonvolatile semiconductor memory device in accordance with claim 1, wherein said memory cell selector means includes:

row selector means for selecting corresponding said word line in response to an external address signal, and column selector means for selecting corresponding said first and second main bit lines and corresponding said subbit line in response to an external address signal, and said connection means includes:

a block interconnection being provided in common for said group of subbit lines, first internal connection means being controlled by said column selector means for selectively connecting said subbit lines with said block interconnection, second internal connection means being controlled by said column selector means for selectively connecting said block interconnection with the base of said corresponding bipolar transistor in said read operation, and third internal connection means being controlled by said column selector means for selectively coupling said block interconnection with said second main bit lines.

6. The nonvolatile semiconductor memory device in accordance with claim 5, further comprising:

a plurality of cell selector lines being provided for said rows of said memory cells respectively, each said memory cell further including:

a cell selector transistor for selectively opening/closing a conduction path of a current flowing between said subbit line and the base of said bipolar transistor through said memory cell transistor, said column selector means activating said cell selector line corresponding to said selected memory cell and bringing said cell selector transistor of said selected memory cell into a conducting state.

7. The nonvolatile semiconductor memory device in accordance with claim 6, wherein said connection means includes:

a MOS transistor for selectively coupling said subbit line with the base of said bipolar transistor, and said bipolar transistor has a base layer being doped with impurities at the same time in a step of doping source and drain regions of said MOS transistor with said impurities.

8. A nonvolatile semiconductor memory device being formed on a semiconductor substrate, comprising:

a memory cell array including a plurality of memory cells arranged in rows and columns, said memory cell array being split into a plurality of blocks each including a plurality of memory cells arranged in first and second columns and a first plurality of rows;

a plurality of main bit lines being provided for respective said blocks;

first and second subbit lines being provided in correspondence to said columns included in said blocks; and a plurality of word lines being provided over said plurality of blocks in correspondence to said rows of said memory cells respectively, each of said memory cells, provided in correspondence to intersections between said first and second subbit lines and said word lines, including a memory cell transistor, said memory cell transistor having:

a second conductivity type source region and a drain region of said second conductivity type being formed on a first conductivity type major surface of said semiconductor substrate, a channel region being held between said source region and said drain region, a charge storage electrode being formed on said channel region with an oxide film therebetween, and a control electrode being formed above said charge storage electrode with an insulating film therebetween, said drain region of said memory cell transistor being coupled with corresponding said subbit line, the potential of said control electrode being controlled by corresponding said word line, said nonvolatile semiconductor memory device further comprising:

first and second bipolar transistors being provided for corresponding said first and second subbit lines for amplifying a current flowing between said source region and said drain region of said memory cell transistor being selected in a read operation as a base current through selected said first or second subbit line;

connection means for selectively coupling said current being amplified by said first and second bipolar transistors with corresponding said main bit line in said read operation, and shorting an emitter and a base of said first and second bipolar transistors corresponding to selected said first or second subbit line while coupling said selected main bit line with selected said first or second subbit line in a write operation;

memory cell selector means for selecting corresponding said first or second subbit line, corresponding said main bit line and corresponding said word line in response to an external address signal;

data read means for reading data from said selected memory cell in response to the value of said current flowing through said selected main bit line; and write means for injecting or extracting electrons into or from said charge storage electrode of selected said memory cell transistor through said main bit lines in said write operation.

9. The nonvolatile semiconductor memory device in accordance with claim 8, wherein said first and second bipolar transistors are arranged on opposite sides of said first and second subbit lines respectively, said connection means includes:

first and second switching means, provided for corresponding said first bipolar transistor and serially connected between corresponding said main bit line and said first subbit line, for switching between an open and a close states controlled by said memory cell selector means, and third and fourth switching means, provided for corresponding said second bipolar transistor and serially connected between corresponding said main bit line and said second subbit line, for switching between an open and a close states controlled by said memory cell selector means, each of said first and third switching means has an end being connected with said corresponding main bit line, said second switching means has:

an end being connected with an emitter of said first bipolar transistor and another end of said first switching means, and another end being connected with a base of said first bipolar transistor and said first subbit line, and said fourth switching means has:

an end being connected with an emitter of said second bipolar transistor and another end of said third switching means, and another end being connected with a base of said second bipolar transistor and said second subbit line.

10. The nonvolatile semiconductor memory device in accordance with claim 9, further comprising:

a plurality of cell selector lines being provided for said rows of said memory cells respectively, each said memory cell further including a cell selector transistor for selectively opening/closing a conduction path of a current flowing between said subbit line and a base of said bipolar transistor through said memory cell transistor, and said column selection means activating said cell selector line corresponding to selected said memory cell and bringing said cell selector transistor of said selected memory cell into a conducting state.

11. The nonvolatile semiconductor memory device in accordance with claim 9, wherein said memory cell transistors are formed in a first conductivity type well being provided on said major surface of said semiconductor substrate, and said first conductivity type well is split into a plurality of well blocks for respective said blocks, said nonvolatile semiconductor memory device further comprising:

well potential generation means for generating a well potential to be supplied to said well blocks, and a plurality of well potential supply interconnections being provided at least in a pair for each said well block for transmitting said well potential outputted from said well potential generation means.

12. The nonvolatile semiconductor memory device in accordance with claim 8, wherein said first and second bipolar transistors are arranged on single sides of said first and second subbit lines, said connection means includes:

first, second and third switching means, provided for corresponding said first bipolar transistor and serially connected between corresponding said main bit line and said first subbit line, for switching between an open and a close states controlled by said memory cell selector means, and fourth, fifth and sixth switching means, provided for corresponding said second bipolar transistor and serially connected between corresponding said main bit line and said second subbit line, for switching an open and a close states controlled by said memory cell selector means, each of said first and fourth switching means has an end being connected with said corresponding main bit line, said second switching means has:

an end being connected with another end of said first switching means, and another end being connected with an emitter of said first bipolar transistor and an end of said third switching means, said third switching means has another end being connected with a base of said first bipolar transistor and said first subbit line, said fifth switching means has:

an end being connected with another end of said fourth switching means, and another end being connected with an emitter of said second bipolar transistor and an end of said sixth switching means, and said sixth switching means has another end being connected with a base of said second bipolar transistor and said second subbit line.

13. The nonvolatile semiconductor memory device in accordance with claim 12, wherein each of said second, third, fourth and sixth switching means includes enhancement-mode MOS transistor, and each of said first and fifth switching means includes depression-mode transistor.

14. The nonvolatile semiconductor memory device in accordance with claim 13, further comprising:

a plurality of cell selector lines being provided for said rows of said memory cells respectively, each said memory cell further including:

a cell selector transistor for selectively opening/closing a conduction path of a current flowing between said subbit line and said base of said bipolar transistor through said memory cell transistor, said row selection means activating said cell selector line corresponding to selected said memory cell and bringing said cell selector transistor of said selected memory cell into a conducting state.

15. The nonvolatile semiconductor memory device in accordance with claim 12, wherein each of said first to sixth switching means includes enhancement-mode MOS transistors, and sources and drains of said first and fifth switching means are shorted, respectively.

16. The nonvolatile semiconductor memory device in accordance with claim 15, further comprising:

a plurality of cell selector lines being provided for said rows of said memory cells respectively, each said memory cell further including:
a cell selector transistor for selectively opening/closing a conduction path of a current flowing between said subbit line and said bipolar transistor through said memory cell transistor,
said column selection means activating said cell selector line corresponding to selected said memory cell and bringing said cell selector transistor of said selected memory cell into a conducting state.

17. A nonvolatile semiconductor memory device being formed on a semiconductor substrate, comprising:
a memory cell array including a plurality of memory cells being arranged in rows and columns, said memory cell array being split into a plurality of blocks each including a plurality of memory cells arranged at least in first and second columns and a first plurality of rows;
a plurality of main bit lines being provided over at least two said blocks;
at least two subbit lines being provided in correspondence to said columns included in each of said blocks; and
a plurality of word lines being provided over said plurality of blocks in correspondence to said rows of said memory cells respectively,
each of said memory cells, provided in correspondence to intersections between said subbit lines and said word lines, including a memory cell transistor,
said memory cell transistor having:
a second conductivity type source region and a drain region of said second conductivity type being formed on a first conductivity type major surface of said semiconductor substrate,
a channel region being held between said source region and said drain region,
a charge storage electrode being formed on said channel region with an oxide film therebetween, and
a control electrode being formed above said charge storage electrode with an insulating film therebetween,
said drain region of said memory cell transistor being coupled with corresponding said subbit line,
the potential of said control electrode being controlled by corresponding said word line,
said nonvolatile semiconductor memory device further comprising:
a plurality of bipolar transistors being provided in correspondence to each pair of first and second blocks among said plurality of blocks for amplifying a current flowing between said source region and said drain region of said memory cell transistor being selected in a read operation as a base current through selected said subbit line;
connection means, provided for each of said bipolar transistors, for selectively coupling bases of said bipolar transistors with said selected subbit line to feed said current being amplified by said bipolar transistors to corresponding said main bit line in said read operation while shorting an emitter and a base of said bipolar transistor corresponding to selected said subbit line and coupling said selected main bit line with said selected subbit line in a write operation;

memory cell selector means for selecting corresponding said subbit line, corresponding said main bit line and corresponding said word line in response to an external address signal;
data read means for reading data from said selected memory cell in response to the value of said current flowing through said selected main bit line; and
write means for injecting or extracting electrons into or from said charge storage electrode of selected said memory cell transistor through said main bit lines in said write operation.

18. The nonvolatile semiconductor memory device in accordance with claim 17, wherein each said bipolar transistor is provided in common for both of said subbit lines belonging to identical said column included in corresponding said first and second blocks, and
said connection means includes:
first and second switching means being controlled by said data read means for selectively coupling a base of said bipolar transistor with said subbit lines in said corresponding first and second blocks respectively, and
third switching means being controlled by said write means for shorting an emitter and said base of said bipolar transistor corresponding to selected said subbit line and coupling selected said main bit line with said selected subbit line.

19. The nonvolatile semiconductor memory device in accordance with claim 17, wherein
each said bipolar transistor is provided in common for both two said subbit lines included in corresponding said first block and two said subbit lines included in corresponding said second block, and
said connection means includes:
first and second switching means being controlled by said data read means for selectively coupling a base of said bipolar transistor with said subbit lines in said corresponding first and second blocks respectively, and
third switching means being controlled by said write means for shorting an emitter and said base of said bipolar transistor corresponding to selected said subbit line and coupling selected said main bit line with said selected subbit line.

20. The nonvolatile semiconductor memory device in accordance with claim 17, further comprising:
a plurality of cell selector lines being provided for said rows of said memory cells respectively,
each said memory cell further including a cell selector transistor for selectively opening/closing a conduction path of a current flowing between said subbit lines and bases of said bipolar transistors,
said memory cell selection means activating said cell selector line corresponding to selected said memory cell and bringing said cell selector transistor of said selected memory cell into a conducting state.

* * * * *